(12) United States Patent
Ohta et al.

(10) Patent No.: US 9,359,209 B2
(45) Date of Patent: Jun. 7, 2016

(54) GRAPHITE FILM AND METHOD FOR PRODUCING GRAPHITE FILM

(71) Applicant: KANEKA CORPORATION, Osaka-shi, Osaka (JP)

(72) Inventors: Yusuke Ohta, Settsu (JP); Makoto Kutsumizu, Settsu (JP); Takashi Inada, Settsu (JP); Satoshi Katayama, Settsu (JP); Yasushi Nishikawa, Settsu (JP)

(73) Assignee: KANEKA CORPORATION, Osaka-Shi (JP)

( * ) Notice: Subject to any disclaimer, the term of this patent is extended or adjusted under 35 U.S.C. 154(b) by 0 days.

(21) Appl. No.: 14/361,321

(22) PCT Filed: Oct. 23, 2012

(86) PCT No.: PCT/JP2012/077374
§ 371 (c)(1),
(2) Date: May 29, 2014

(87) PCT Pub. No.: WO2013/080705
PCT Pub. Date: Jun. 6, 2013

(65) Prior Publication Data
US 2014/0308484 A1    Oct. 16, 2014

(30) Foreign Application Priority Data

Nov. 30, 2011    (JP) .................................. 2011-262457

(51) Int. Cl.
*C01B 31/04* (2006.01)
*H01L 23/373* (2006.01)

(52) U.S. Cl.
CPC .............. *C01B 31/04* (2013.01); *H01L 23/373* (2013.01); *H01L 2924/0002* (2013.01); *Y10T 428/24628* (2015.01)

(58) Field of Classification Search
CPC ........................ C01B 31/04; Y10T 428/24628
See application file for complete search history.

(56) References Cited

U.S. PATENT DOCUMENTS

| | | | |
|---|---|---|---|
| 2012/0121880 A1* | 5/2012 | Ohta et al. | .................... 428/220 |
| 2013/0001350 A1 | 1/2013 | Ohta et al. | |
| 2013/0119571 A1* | 5/2013 | Ohta | .................... C01B 31/04 264/29.1 |

FOREIGN PATENT DOCUMENTS

| | | |
|---|---|---|
| JP | 2006-327907 A | 12/2006 |
| JP | 2010-89344 A | 4/2010 |

(Continued)

OTHER PUBLICATIONS

English translation of the International Preliminary Report on Patentability and Written Opinon of the International Searching Authority (Forms PCT/IB/338, PCT/IB/373 and PCT/ISA/237), dated Jun. 12, 2014, for International Application No. PCT/JP2012/077374.

(Continued)

*Primary Examiner* — Laura Auer
(74) *Attorney, Agent, or Firm* — Birch, Stewart, Kolasch & Birch, LLP

(57) ABSTRACT

A re-forming process is carried out in which a material graphite film is heat-treated to not less than 2000° C. while the material graphite film is being pressured. Through the re-forming process, sag of a graphite film is controlled. By using, during the re-forming process, a plurality of inner cores having respective different surface states, it is possible to produce a graphite film having two or more sag forms which have respective effects.

13 Claims, 32 Drawing Sheets

(56) References Cited

FOREIGN PATENT DOCUMENTS

| JP | WO 2011/102107 | A1 |   | 8/2011  |              |
|----|----------------|----|---|---------|--------------|
| WO | WO 2010150300  | A1 | * | 12/2010 |              |
| WO | WO 2011148581  | A1 | * | 12/2011 | ... C01B 31/04 |

OTHER PUBLICATIONS

International Search Report (Form PCT/ISA/210), dated Dec. 11, 2012, for International Application No. PCT/JP2012/077374.

* cited by examiner

272

271

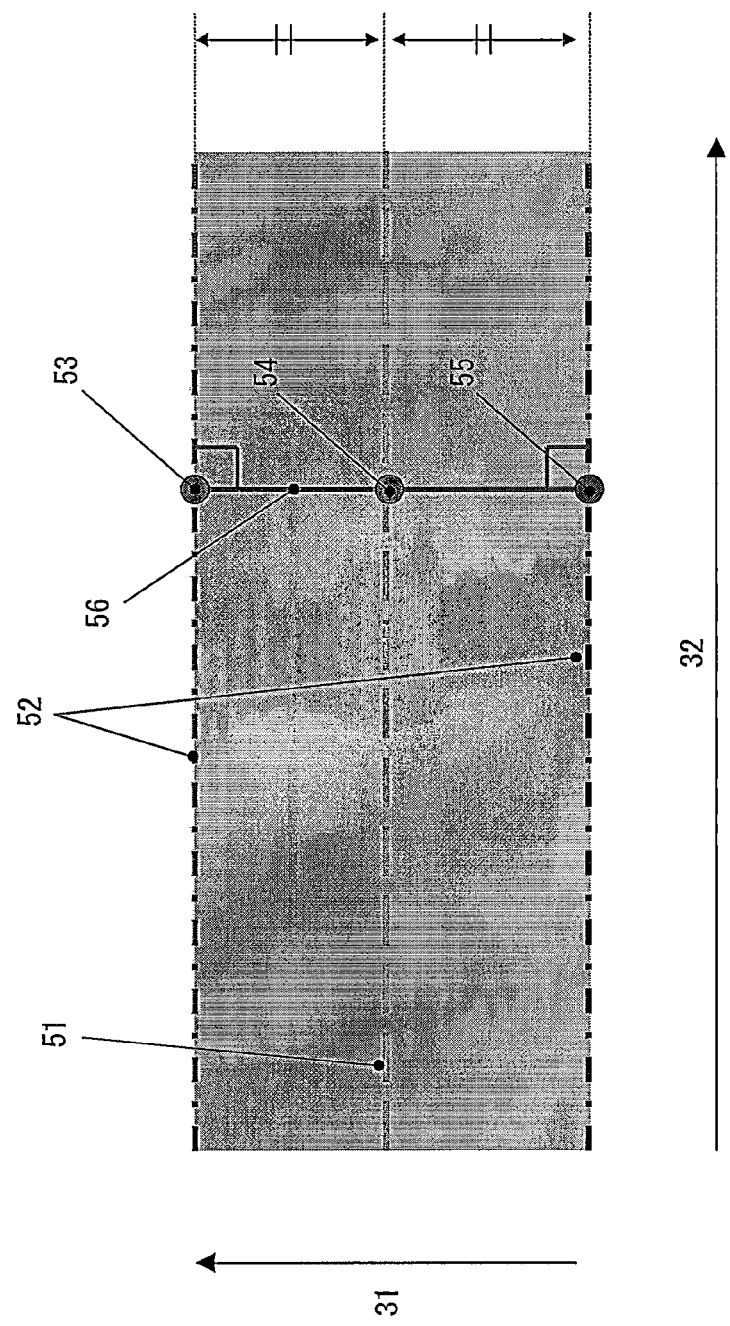

GRAPHITE FILM AND METHOD FOR PRODUCING GRAPHITE FILM

TECHNICAL FIELD

The present invention relates to a graphite film whose sag is controlled and to a method for producing a graphite film whose sag is controlled.

BACKGROUND ART

Heat radiating parts are used for semiconductor elements or other heat generating parts provided in various types of electronic devices or electric devices such as computers. Among the heat radiating parts, a long and large-area graphite film made of a polymeric film is preferably used for large-sized devices. In view of this, studies for producing a long and large-area graphite film have been conducted. For example, it has been suggested to (i) wind up a polymeric film having a width of 250 mm and a length of 30 m around a carbonaceous cylindrical internal core having an external diameter of 150 mm and then (ii) heat the polymeric film (Patent Literature 1).

CITATION LIST

Patent Literature 1

Japanese Patent Application Publication, Tokukai, No. 2006-327907 A (Publication Date: Dec. 7, 2006)

SUMMARY OF INVENTION

Technical Problem

According to the method disclosed by Patent Literature 1, it is not possible to control sag of a graphite film. Therefore, large sag Zgs is caused as illustrated in FIG. 1.

Solution to Problem

That is, the present invention relates to a graphite film (claim 1) having a length of not less than 4 m in a longitudinal direction of the graphite film and having two or more different sag forms.

The present invention relates to the graphite film (claim 2), wherein regions of the two or more different sag forms are not less than 2.0 m in length in the longitudinal direction.

The present invention relates to the graphite film (claim 3), wherein the two different sag forms are any one of combinations of (i) flat sag and middle sag, (ii) the flat sag and both-edge sag, (iii) the flat sag and one-edge sag, (iv) the middle sag and the both-edge sag, (v) the middle sag and the one-edge sag, and (vi) the both-edge sag and the one-edge sag.

The present invention relates to the graphite film (claim 4), wherein: each of the two or more different sag forms is any one of flat sag, middle sag, both-edge sag, and one-edge sag; and adjacent two of the two or more different sag forms are different from each other.

The present invention relates to the graphite film (claim 5), wherein the flat sag is a sag form in which a degree of sag is not more than 4.9 mm by the film windability evaluation described in JIS C2151.

The present invention relates to the graphite film (claim 6), wherein the middle sag is a sag form in which a sag value "b" of sag in a middle of the graphite film is not less than 5 mm and not more than 80 mm.

The present invention relates to the graphite film (claim 7), wherein the both-edge sag is a sag form in which a sag value "a" of sag at both edges of the graphite film is not less than 5 mm and not more than 80 mm.

The present invention relates to the graphite film (claim 8), wherein the one-edge sag is a sag form in which a degree of a bend of the graphite film is not less than 11 mm and not more than 80 mm.

Further, the present invention relates to a method (claim 9) for producing a graphite film, including the step of: (I) re-forming a material graphite film by heat-treating the material graphite film to not less than 2000° C. while applying pressure to the material graphite film, the graphite film having two or more different sag forms and having a length of not less than 4 m in a longitudinal direction of the graphite film.

The present invention relates to a method (claim 10) for producing a graphite film, further including the step of: (II) obtaining the material graphite film by at least once cooling down a graphite film, obtained from a polymeric film by heat-treatment at not less than 2000° C., to less than 2000° C., after the step (II), the step (I) being carried out.

The present invention relates to the method (claim 11) for producing a graphite film, wherein, during the step (I), the material graphite film is heat-treated in a state where the material graphite film is wound around an inner core.

Further, the present invention relates to a method (claim 12) for producing a graphite film, including the step of: (a) re-forming a material graphite film by heat-treating the material graphite film to not less than 2000° C. while applying pressure on the material graphite film, during the step (a), the material graphite film being heat-treated in a state where the material graphite film is wound around at least two inner cores, the graphite film having two or more different sag forms and having a length of not less than 4 m in a longitudinal direction of the graphite film.

Further, the present invention relates to a method (claim 13) for producing a graphite film, including carrying out at least two of the steps (A) through (D) with respect to a polymeric film and then heat-treating the polymeric film at not less than 2000° C., the steps (A) through (D) being: (A) controlling sag by heat-treating the polymeric film so that, in a temperature range from a thermal decomposition initiation temperature of the polymeric film to a sag control temperature of the polymeric film, temperatures at both edges in a width direction of the polymeric film are higher than a temperature in a middle in the width direction of the polymeric film and that a temperature gradient from the both edges to the middle in the width direction of the polymeric film is not less than 3.5° C./m and not more than 75.0° C./m; (B) controlling sag by heat-treating the polymeric film so that, in the temperature range from the thermal decomposition initiation temperature of the polymeric film to the sag control temperature of the polymeric film, the temperatures at the both edges in the width direction of the polymeric film are lower than the temperature in the middle in the width direction of the polymeric film and that the temperature gradient from the both edges to the middle in the width direction of the polymeric film is not less than −75° C./m and not more than −3.5° C./m; (C) controlling sag by heat-treating the polymeric film so that, in the temperature range from the thermal decomposition initiation temperature of the polymeric film to the sag control temperature of the polymeric film, the temperature gradient from the both edges to the middle in the width direction of the polymeric film is not less than −3.4° C./m and not more than 3.4° C./m; and (D) controlling sag by heat-treating the polymeric film so that, in the temperature range from the thermal decomposition initiation temperature of the polymeric film to the sag control temperature of the polymeric film, a temperature A≥a temperature B≥a temperature C and the temperature A≠the temperature C and that a temperature gradient from the temperature A to the temperature C is not less than 2.5° C./m and not more than 200° C./m, where the temperature A is a temperature at one of the edges in the width direction of the polymeric film, the temperature B is a temperature in the middle in the width direction of the polymeric film, and the temperature C is a temperature at the other of the edges in the width direction of the polymeric film.

Note that, according to the (A), a lower limit of the temperature gradient is preferably not less than 10.0° C./m, and an upper limit of the temperature gradient is preferably not more than 50.0° C./m.

According to the (B), the lower limit of the temperature gradient is preferably not less than −50.0° C./m, and the upper limit of the temperature gradient is preferably not more than −10.0° C./m.

According to the (C), the temperature gradient is preferably not less than −3.0° C./m and not more than 3.0° C./m, more preferably not less than −2.5° C./m and not more than 2.5° C./m, even more preferably not less than −2.0° C./m and not more than 2.0° C./m.

According to the (D), the lower limit of the temperature gradient is preferably not less than 5.0° C./m, and the upper limit of the temperature gradient is preferably not more than 150.0° C./m.

Advantageous Effects of Invention

A graphite film of the present invention is a graphite film whose sag form is controlled. Particularly, the graphite film of the present invention is a continuous graphite film having two or more different sag forms.

Further, according to a method for producing a graphite film of the present invention, it is possible to control sag of a graphite film so that a graphite film having two or more sag forms which have respective effects can be produced.

BRIEF DESCRIPTION OF DRAWINGS

FIG. 32 is a view for explanation of definitions of edges and a middle of a film.

DESCRIPTION OF EMBODIMENTS

The present invention relates to a graphite film having a length of not less than 4 m in a longitudinal direction of the graphite film and having two or more different sag forms.

"Sag" of the graphite film is "distortion" that appears on the film and that can be measured by the film windability evaluation described in JIS C2151. Sag is measured as follows. That is, a film having a given length is wound off and then placed on two parallel rods in a direction at right angles to the rods under a predetermined condition, and a deviation from a uniform suspended line is measured (see FIG. 2). It can be confirmed that the film has "sag", in a case where part of the film sags when the film is pulled.

The graphite film is capable of bringing about various effects, depending on its sag form.

As used in the present invention, a "sag form" means any one of the following: flat sag; sag appearing at both edges; sag appearing in middle; and sag appearing at one edge. The sag form has the following features. That is, a flat graphite film is easily laminated with other sheet. A graphite film having sag at its both edges does not easily tear because, in a case where the graphite film is pulled in a longitudinal direction of the graphite film, stress does not concentrate at the edges. A graphite film having sag in the middle does not easily suffer a folded wrinkle, in a case where the graphite film is rolled. Further, a graphite film having sag at its one edge is excellent in fitting to a curved surface.

However, according to a conventional graphite film, it has not been possible to control sag. Therefore, the conventional graphite film has not had such features. The graphite film of the present invention is a continuous graphite film having two or more different sag forms. Since the sag forms in the graphite film of the present invention are thus controlled, it is possible to bring about such various features. Moreover, the graphite film of the present invention has, in its continuous film, the two or more different sag forms. It is thus possible to effectively obtain a plurality of sag forms.

<Types of Controlled Sag Forms>

Figure 3:
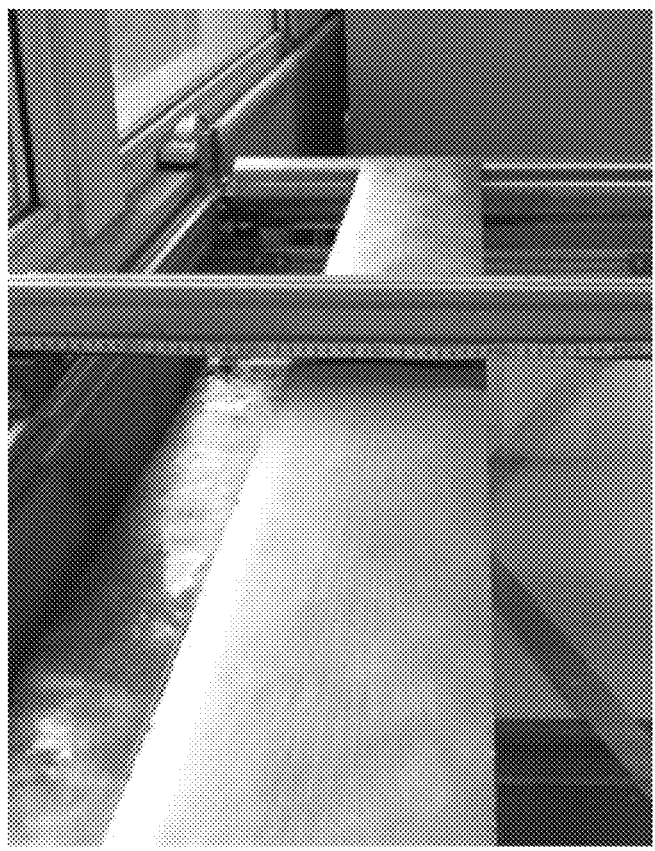
FIG. 3 is a view illustrating a graphite film having flat sag.
Figure 5:
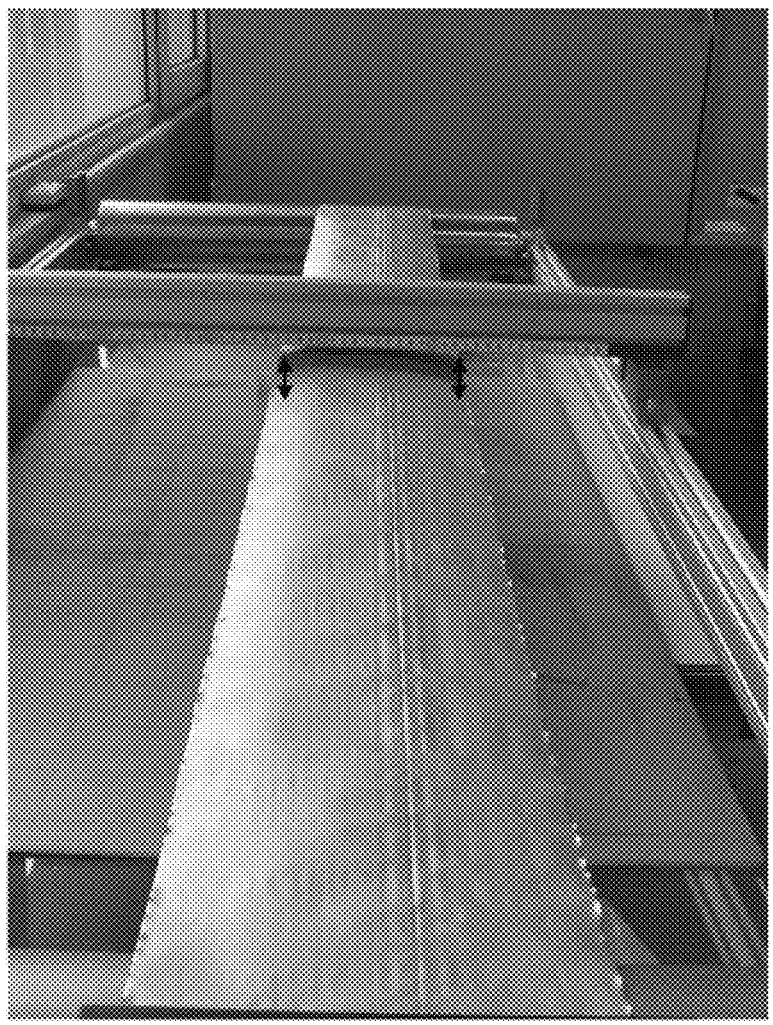
FIG. 5 is a view illustrating a graphite film having sag at its edges.
Figure 6:
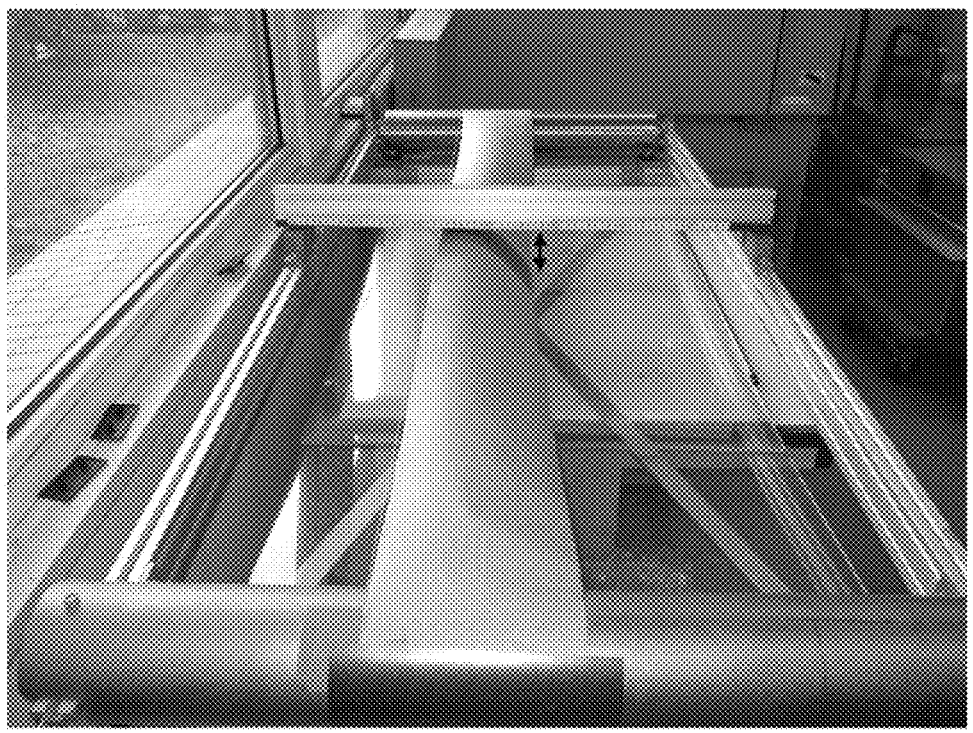
FIG. 6 is a view illustrating a graphite film having sag at its one edge.

Types of a graphite film having a controlled sag form include: 1) a flat graphite film (see FIG. 3); 2) a graphite film having sag in the middle (see FIG. 4); 3) a graphite film having sag at both edges (see FIG. 5); and a graphite film having sag at its one edge (see FIG. 6). By a combination of these graphite films, the graphite film having at least two or more different sag forms of the present invention is constituted.

1) The flat graphite film is a graphite film having considerably small sag. A degree of the sag of the flat graphite film is not more than 4.9 mm, preferably not more than 4 mm, more preferably not more than 3 mm. A lower limit of the degree is not limited in particular. A graphite film having sag of not more than 4.9 mm is preferably used because the graphite film can be laminated with, for example, a copper foil tape or a sticky tape without any wrinkle. A method of measuring sag and laminating property evaluation with a copper foil tape will be specifically described in Examples.

Figure 4:
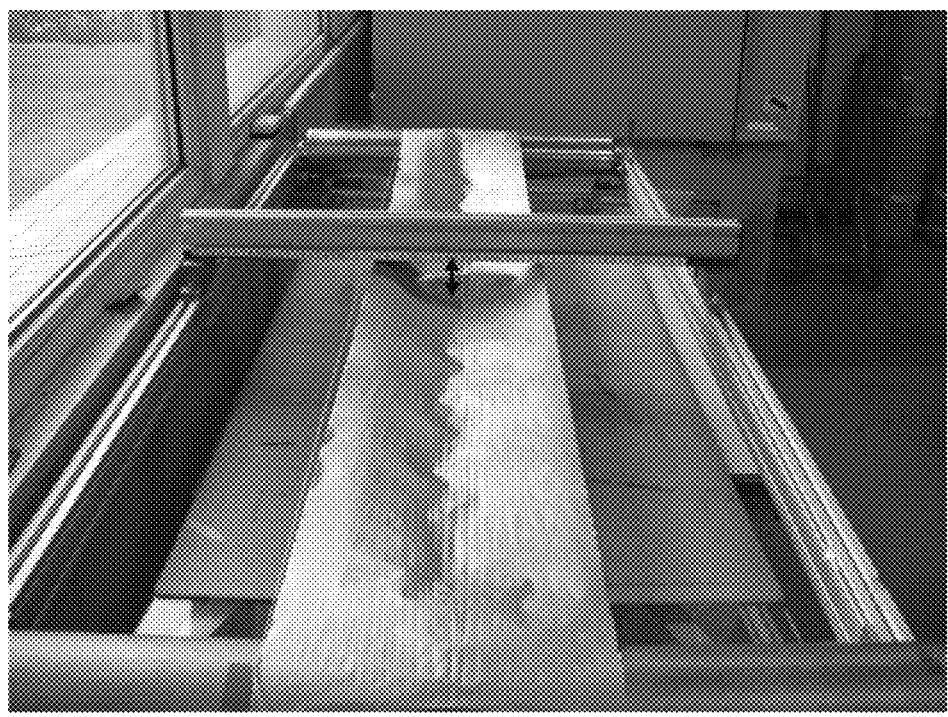
FIG. 4 is a view illustrating a graphite film having sag in the middle.

2) The graphite film having sag in the middle is a graphite film having sag in the middle in a width direction of the graphite film (see FIG. 4). The sag of the graphite film having sag in the middle can be evaluated by measuring a sag value "b". The sag value "b" indicates sag appearing in the middle in the width direction of the graphite film in a case where the graphite film is set in a state identical to that in which the sag measurement described in JIS C2151 is carried out.

The sag value "b" of the graphite film having sag in the middle is not less than 5 mm, preferably not less than 20 mm, more preferably not less than 40 mm. An upper limit of the sag value "b" is preferably not more than 80 mm, more preferably not more than 70 mm, most preferably not more than 60 mm. A graphite film having the sag value "b" of not less than 5 mm is preferably used because the graphite film does not easily suffer a folded wrinkle at its edges during a rolling process. Meanwhile, a graphite film having the sag value "b" of not more than 80 mm is preferably used because, in a case where the graphite film is pulled in a longitudinal direction of the graphite film, the graphite film does not easily tear. How to measure the sag value "b" will be specifically described in Examples.

3) The graphite film having sag at its both edges is a graphite film having sag at its both edges in a width direction of the graphite film (see FIG. 5). The sag of the graphite film having sag at its both edges can be evaluated by measuring a sag value "a". The sag value "a" indicates sag appearing at the both edges in the width direction of the graphite film in a case where the graphite film is set in a state identical to that in which the sag measurement described in JIS C2151 is carried out.

The sag value "a" of the graphite film having sag at its both edges is not less than 5 mm, preferably not less than 20 mm, more preferably not less than 40 mm. An upper limit of the sag value "a" is preferably not more than 80 mm, more preferably not more than 70 mm, most preferably not more than 60 mm. A graphite film having the sag value "a" of not less than 5 mm is preferably used because, in a case where the graphite film is rewound, stress does not concentrate at the edges and, accordingly, the graphite film does not easily tear. Meanwhile, a graphite film having the sag value "a" of not more than 80 mm is preferably used because, in a case where the graphite is rewound, the edges of the graphite film are neatly aligned. How to measure the sag value "a" will be specifically described in Examples.

4) The graphite film having sag at its one edge is a graphite film having sag at its one edge in a width direction of the graphite film (see FIG. 6). A degree of the distortion of the graphite film having sag at its one edge can be evaluated by measuring a degree of a bend of the graphite film as described in JIS C2151.

The degree of the bend of the graphite film having sag at its one edge is not less than 11 mm, preferably not less than 15 mm, more preferably not less than 20 mm. An upper limit of the degree of the bend is not limited in particular, but is preferably not more than 80 mm, more preferably not more than 70 mm, most preferably not more than 60 mm. In a case where the graphite film has a bend of not less than 11 mm, the graphite film is easily laminated with a plate having a curved surface. Meanwhile, in a case where the graphite film has a bend of not more than 80 mm, the graphite film is preferably used because, in a case where the graphite film is pulled in a longitudinal direction of the graphite film, the graphite film does not easily tear. How to measure the degree of the bend will be specifically described in Examples.

<Application of Sag Form>

Figure 27:
FIG. 27 is a view schematically illustrating an M-shaped graphite film and a W-shaped graphite film.
Figure 27:

Based on the concept of the present invention, it is also possible to obtain a graphite film having various sag forms, such as an M-shaped graphite film and a W-shaped graphite film, by a combination of those sag forms. Note that the M-shaped graphite film indicates a graphite film having an M-shape when viewed from a side of the graphite film, whereas the W-shaped graphite film indicates a graphite film having a W-shape when viewed from a side of the graphite film (see FIG. 27).

<One Example of Method for Producing Graphite Film Whose Sag is Controlled>

Figure 13:
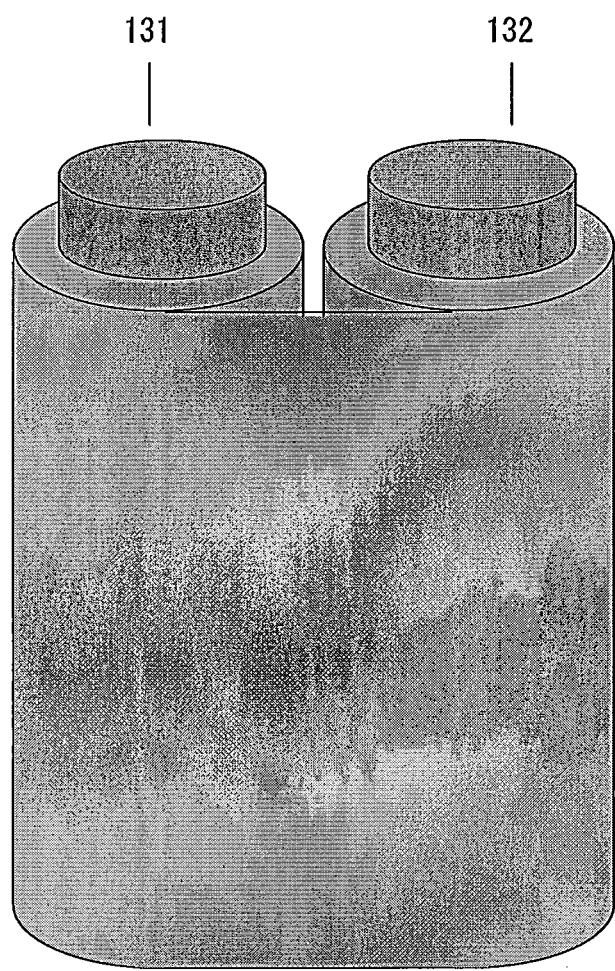
FIG. 13 is a view illustrating how to produce a graphite film having two difference sag forms with the use of two inner cores.
Figure 28:
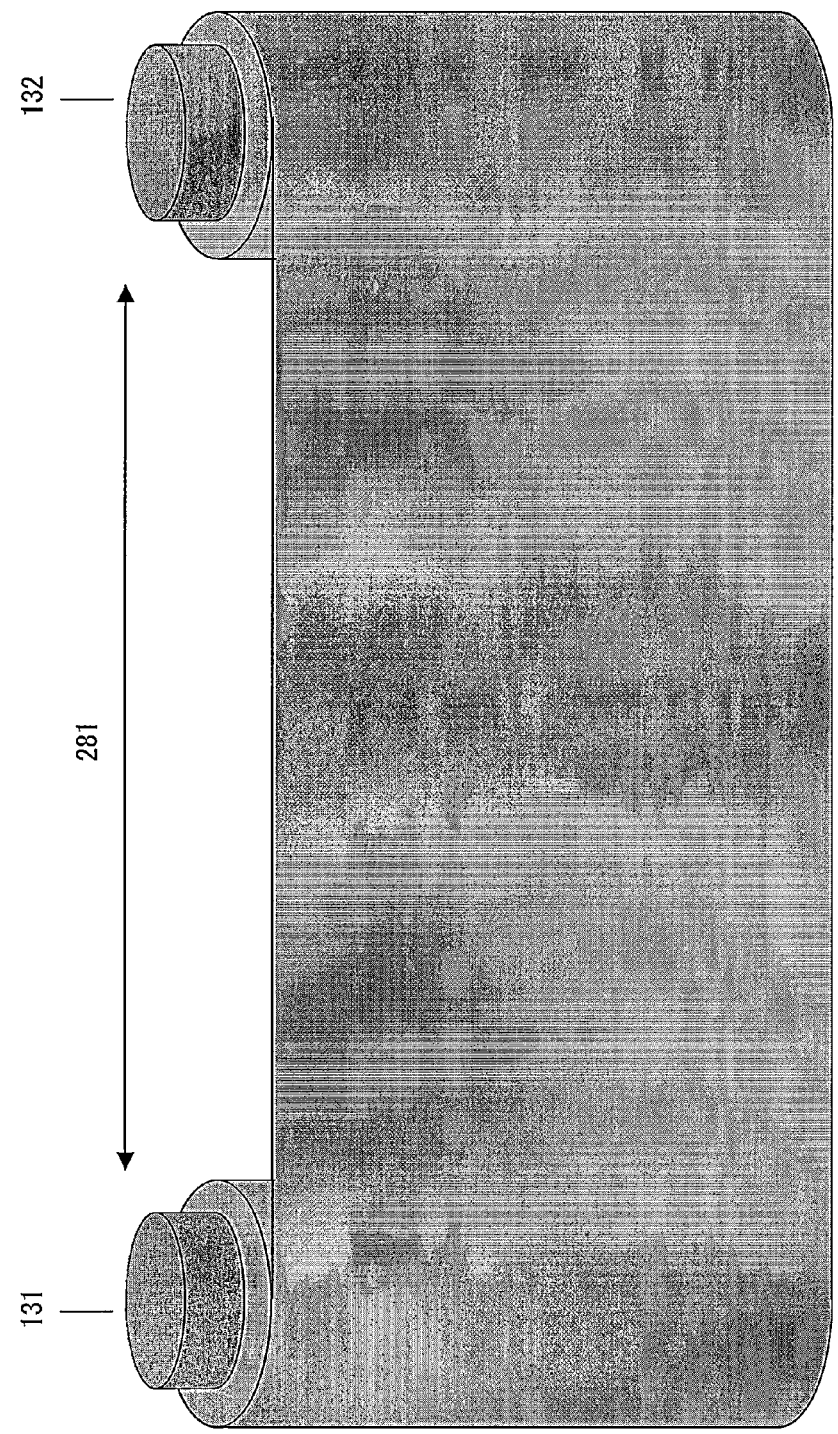
FIG. 28 is a view illustrating how to produce a graphite film having three different sag forms with the use of two inner cores.

The following is an example of a method for producing such a graphite film. That is, it is possible to control sag in a material graphite film by using a sag form re-forming process. The re-forming process is a process by which a sag form is changed and in which a material graphite film is heat-treated to not less than 2000° C. while being pressured. Further, changing a sag form means changing flat sag, sag appearing in middle, sag appearing at both edges, or sag appearing at one edge to another different sag form. By heating a material graphite film at a temperature of not less than 2000° C. while applying pressure to the material graphite film, it is possible to re-form a sag form to a desired sag form. Particularly, it is possible to simply form a desired sag form by a method of controlling sag of a graphite film in which method a material graphite film is wound around an inner core and then sag is controlled with the use of difference in coefficient of thermal expansion between the inner core and the material graphite film. Furthermore, as illustrated in FIGS. 13 and 28, it is possible to obtain a graphite film having two or more sag forms by use of two or more inner cores.

Note that the terms "sag form re-forming process", "re-forming process", and "re-forming" are used synonymously.

<Another Example of Method for Producing Graphite Film Whose Sag is Controlled>

The following will discuss another aspect of producing a graphite film having two or more sag forms.

The inventors of the present invention have found that it is important in controlling sag of a graphite film to heat-treat a polymeric film in such a way that (i) temperatures at both edges in a width direction of the polymeric film and (ii) a temperature in the middle in the width direction of the polymeric film are controlled in a temperature range from a thermal decomposition initiation temperature of the polymeric film to a sag control temperature of the polymeric film (hereinafter, this heat treatment process is referred to as a "sag control process"). That is, the graphite film of the present invention is obtained in such a way that a polymeric film is subjected to the sag control process and then heat-treated at not less than 2000° C. According to the present invention, a graphite film whose sag is controlled is obtained by applying, in a specific temperature range during early decomposition of the polymeric film, particular heat treatment to a polymeric film.

The sag control process is a process of controlling sag by applying, to a polymeric film, particular heat treatment in which a temperature gradient in a width direction of the polymeric film is controlled, in a specific temperature range during early decomposition of the polymeric film. It is possible to obtain a graphite film having two or more sag forms by changing a temperature condition in a longitudinal direction of a long polymeric film.

(Mechanism of production of effect in sag control process)

The following description will discuss how an effect is achieved through the sag control process, by taking, as an example, a graphite film having sag in the middle.

First, during early thermal decomposition of a polymeric film, the polymeric film is heat-treated in a state where temperatures at both edges in a width direction of the polymeric film are low relative to a temperature in the middle in the width direction of the polymeric film. The polymeric film which have different thermal histories along the width direction becomes a graphite film whose length in the middle in a longitudinal direction of the graphite film is longer than its lengths at both edges in the longitudinal direction of the graphite film because progress of graphitization during a graphitization process, which is carried out after a carbonization process, is different in the width direction (degrees of orientations of graphite crystallites are different). This graphite film is observed in a width direction to find that sag appears in the middle in which the length in the longitudinal direction of the graphite film is longer than those of neighboring parts.

(Relationship between sag control process and conventional method for producing GS) A general method of producing a graphite film from a polymeric film involves, for example, (i) a carbonization process in which heat treatment is usually carried out at a temperature up to approximately 1000° C. and (ii) a graphitization process in which a carbonized film obtained in the carbonization process is heat-treated at a temperature of not less than 2600° C. In contrast, according to the sag control process of the present invention, temperature distribution in a width direction of a polymeric film is controlled in a temperature range of not more than 700° C. during relatively early stage in the carbonization process.

<Definitions of Edge and Middle of Polymeric Film or Graphite Film>

An edge of a polymeric film or a graphite film is defined as an edge parallel to a long side of the polymeric film or the graphite film when they are spread out (see an edge 52 illustrated in FIG. 32). Further, the middle of the polymeric film or the graphite film is defined as the middle equidistant from both edges of the polymeric film or the graphite film (see middle 51 illustrated in FIG. 32).

<Temperature Distribution in Width Direction During Sag Control Process>

A graphite film which is obtained by (i) heat-treating a polymeric film while temperatures at both edges in a width direction of the polymeric film and a temperature in the middle in the width direction of the polymeric film are being controlled in a temperature range during early decomposition of the polymeric film and (ii) subjecting a resulting carbonized film to the graphitization process becomes a graphite film whose sag is controlled. In this case, it is possible to obtain a graphite film whose sag is controlled even in a case where, in a temperature range after the sag control process, a temperature gradient or temperature distribution in the width direction of the polymeric film is arbitrarily set.

The temperature gradient from edges to the middle means a temperature gradient from an edge 1 to the middle and a temperature gradient from an edge 2 (the other edge different from the edge 1) to the middle. The temperature gradient is calculated from temperatures at edges and in the middle on any straight line perpendicular to a long side of the film (see FIG. 32), and is represented by the following expression:

$$\text{Temperature gradient from edge to the middle} = (\text{temperature at edge} - \text{temperature in the middle})/(\text{width of film}/2) \times 100$$

Not here that the temperatures at both edges and in the middle on a given straight line in a width direction are temperatures simultaneously measured. Temperatures A, B, and C of the present invention indicates respective temperatures at points 53, 54, and 55 illustrated in FIG. 32 or respective temperatures at points 55, 54, and 53 illustrated in FIG. 32. Further, the temperature gradient from the temperature A to temperature C is represented by the following expression:

$$\text{Temperature gradient from temperature } A \text{ to temperature } C = (\text{temperature } A - \text{temperature } C)/(\text{width of film}) \times 100$$

Note here that the temperatures A and C on a given straight line in a width direction are temperatures simultaneously measured.

The inventors of the present invention have found that it is important in controlling sag of a graphite film to heat-treat a polymeric film in such a way that (i) temperatures at both edges in a width direction of the polymeric film and (ii) a temperature in the middle in the width direction of the polymeric film are controlled in a temperature range from a thermal decomposition initiation temperature of the polymeric film to a sag control temperature of the polymeric film (hereinafter, this heat treatment process is referred to as a "sag control process"). That is, the graphite film of the present invention is obtained in such a way that a polymeric film is subjected to the sag control process and then heat-treated at not less than 2000° C. According to the present invention, a graphite film whose sag is controlled is obtained by applying, to a polymeric film, particular heat treatment in a specific temperature range during early decomposition of the polymeric film.

<Decomposition Reaction and Weight Decrease Ratio During Sag Control Process>

In a case where a polymeric film is heat-treated, carbon, oxygen, hydrogen, nitrogen, and the like, each of which does not constitute a skeleton of graphite, are sequentially released out of the polymeric film, according to an increase in temperature during the heat-treatment, as components of carbon dioxide, water, hydrogen gas, nitrogen gas, tar, and the like. The polymeric film is blacked and vitrified according to proceeding of decomposition. A weight decrease ratio of the polymeric film during the sag control process (hereinafter, simply referred to as "weight decrease ratio") can be calculated with the use of (i) an initial weight of the polymeric film (weight of the polymeric film which is not heat-treated, at a temperature of 23° C. and humidity of 50%), which is a starting material, and (ii) weight of the polymeric film right after being subjected to the sag control process. The weight decrease ratio is represented by the following expression:

Weight decrease ratio (%)=(initial weight of polymeric film−weight of polymeric film after being subjected to sag control process)/initial weight of polymeric film×100

<Method for Measuring Temperature of Film>

According to the present invention, it is possible to control sag by heat-treating a polymeric film in such a way that temperatures in a width direction of the polymeric film are controlled in a temperature range from a thermal decomposition initiation temperature of the polymeric film to a sag control temperature of the polymeric film.

The thermal decomposition initiation temperature and the sag control temperature of the polymeric film are each an actual temperature in the middle in the width direction of the polymeric film under heat-treatment. The actual temperature on the polymeric film can be measured by causing the polymeric film to be in contact with a sheath K thermocouple of φ0.5 mm.

Note that there is particularly no limitation on a temperature range during processes other than the sag control process. Specifically, there is no limitation on (i) heat treatment which is carried out at a temperature lower than the thermal decomposition initiation temperature of the polymeric film or (ii) heat treatment which is carried out, after the sag control process is once carried out, at a temperature higher than the sag control temperature.

Further, after the sag control process is carried out, the film can be once cooled down to a room temperature and then next heat treatment (carbonization process or graphitization process) can be carried out. Alternatively, after the sag control process is carried out, the next heat treatment can be successively carried out without lowering a temperature of the film. Further, the carbonization process can be omitted by carrying out the sag control process to preferably not less than 700° C., more preferably not less than 800° C., even more preferably not less than 900° C.

<Thermal Decomposition Initiation Temperature and Sag Control Temperature of Polymeric Film>

As used in the present invention, the thermal decomposition initiation temperature of a polymeric film is defined as a temperature at which, in a case where the polymeric film is heat-treated, the polymeric film decreases in weight by 1.0% with respect to the weight of the polymeric film at a room temperature (23° C., humidity of 50%) before the polymeric film is heat-treated. Specifically, measurement of the thermal decomposition initiation temperature of the present invention can be carried out as follows with the use of a thermal analysis system EXSTAR6000 and a thermogravimetry measuring device TG/DTA 220U manufactured by SII Nano Technology Inc. That is, the polymeric film of 10 mg is heat-treated at a temperature increase rate of 10° C./min from a room temperature (23° C.) to 1000° C. under nitrogen atmosphere (200 mL/min). Then, a temperature at which the polymeric film decreases in weight by 1.0% is defined as the thermal decomposition initiation temperature of the polymeric film.

As used in the present invention, the sag control temperature of the polymeric film is a temperature at which, in a case where the polymeric film is heat-treated, the polymeric film decreases in weight by not less than 1.1%, preferably not less than 1.2%, more preferably not less than 2.8%, still more preferably not less than 10.0%, even more preferably not less than 15.0%, most preferably 20.0% with respect to the weight of the polymeric film at a room temperature (23° C., humidity of 50%) before the heat-polymeric film is heat-treated. In a case where the sag control temperature is a temperature at which a decreasing rate of the weight is not less than 1.1%, it is possible to achieve an effect of the sag control. Further, by setting the sag control temperature to a high temperature, it is possible to increase the effect of the sag control. In a case where the sag control temperature is a temperature at which the decreasing rate of the weight of the polymeric film is not more than 20.0% (an upper limit of sag control), it is possible to increase the effect of the sag control even in a case where the sag control process is carried out by one step or by a plurality of steps or even in a case where the sag control process is carried out a plurality of times. In this case, a temperature in a width direction of the film is controlled to a desired temperature, that is, a temperature at which the decreasing rate of the weight of the film is more than 20%. In a temperature range in which the decreasing rate of the weight is more than 20.0%, there is no difference in sag of a graphite film eventually prepared, in both cases where the temperature in the width direction of the film is controlled to a desired temperature and where the temperature in the width direction of the film is not controlled to such.

Specifically, measurement of the most preferable temperature as the sag control temperature of the present invention, that is, a temperature at which the decreasing rate of the weight of the polymeric film is 20% is carried out as follows with the use of a thermal decomposition system EXSTAR6000 and a thermogravimetry measuring device TG/DTA 220U manufactured by SII Nano Technology Inc. That is, decrease in weight of the polymeric film is observed while the polymeric film of 10 mg is being heat-treated at a temperature increase rate of 10° C./min from a room temperature (23° C.) to 1000° C. under nitrogen atmosphere (200 mL/min). Then, a temperature at which the polymeric film decreases in weight by 20% is defined as the most preferable sag control temperature. Similarly, measurement of a temperature at which the decreasing rate of the weight of the polymeric film is 1.1%, that is, an lower limit of the sag control temperature is carried out as follows with use of a thermal decomposition system EXSTAR6000 and a thermogravimetry measuring device TG/DTA 220U manufactured by SII Nano Technology Inc. That is, decrease in weight of the polymeric film is observed while the polymeric film of 10 mg is being heat-treated at a temperature increase rate of 10° C./min from a room temperature (23° C.) to 1000° C. under nitrogen atmosphere (200 mL/min). Then, a temperature at which the polymeric film decreases in weight by 1.1% is defined as the lower limit of the sag control temperature.

In a case where another process is carried out after the sag control process is carried out and then a temperature of a film is lowered, handling ability of the film after the sag control process becomes important. In view of this, in a case where the sag control temperature is controlled so that the decreasing rate of the weight of the polymeric film is preferably not more than 20.0%, more preferably not more than 15.0%, still more preferably not more than 10.0%, even preferably not more than 2.8%, the polymeric film does not easily split and, therefore, is good in handling ability. This is because carbonization of the polymeric film does not progress completely and accordingly a property of a polymer remains. Furthermore, because a degree of shrinkage of the polymeric film is small, a wrinkle does not easily occur.

<Thermal Decomposition Initiation Temperature and Sag Control Temperature of Polymeric Film Used in Examples of the Present Invention>

In a case of a polyimide film (polyimide film manufactured by Kaneka Corporation, APICAL AH having a thickness of 75 gm, APICAL NPI having a thickness of 75 µm) used in Examples of the present invention, its thermal decomposition initiation temperature and sag control temperature are as follows: the thermal decomposition initiation temperature is 500° C. (decreasing rate of weight is 1.0%), and the sag control temperature is not less than 520° C. (decreasing rate of weight is 1.1%), preferably not less than 550° C. (decreasing rate of weight is 1.2%), more preferably not less than 580° C. (decreasing rate is 2.8%), still more preferably 600° C. (decreasing rate is 10.0%), even more preferably 630° C. (decreasing rate is 15.0%), most preferably 655° C. (decreasing rate is 20.0%). In a case where the sag control temperature is not less than 520° C., it is possible to achieve the effect of the sag control process. By setting the sag control temperature to a high temperature, the effect of the sag control process increases. In a case where the sag control temperature is not more than 655° C. (upper limit of sag control), it is possible to increase the effect of the sag control even in a case where the sag control process is carried out by one step or by a plurality of steps or even in a case where the sag control process is carried out a plurality of times. In this case, a temperature in a width direction of the film is controlled to a desired temperature, that is, a temperature of more than 655° C. In a temperature range more than 655° C., there is no difference in sag of a graphite film eventually prepared, in both cases where the temperature in the width direction of the film is controlled to a desired temperature and where the temperature in the width direction of the film is not controlled to such.

<Material Graphite Film>

The material graphite film of the present invention preferably has thermal diffusivity of not less than 0.15 cm$^2$/s, more preferably not less than 2.0 cm$^2$/s, further more preferably 4.0 cm$^2$/s, even more preferably 7.0 cm$^2$/s.

In a case where the thermal diffusivity is not less than 0.15 cm$^2$/s, the re-forming process is easily carried out because, since the material graphite film is sufficiently graphitized, a change in dimension during the heat-treatment is small. Particularly, in a case where the re-forming process is carried out with the use of difference in coefficient of thermal expansion between the inner core and the material graphite film while the material graphite film is being wound around an inner core, an effect of the re-forming process is easily achieved when the change in dimension of the material graphite film is small, because the material graphite film is easily expanded by the inner core. Further, because the material graphite film is a flexible and tear-resistant film having high strength, a rewinding process (described later) is easily carried out. Furthermore, in a case where the thermal diffusivity is not less than 0.15 cm$^2$/s, it is possible to easily and uniformly carry out the re-forming process because heat is smoothly transferred through the material graphite film. How to measure the thermal diffusivity of the material graphite film and the graphite film will be described in Examples.

Further, the number of times of folding the material graphite film of the present invention in an MIT folding endurance test is preferably not less than 100, more preferably not less than 500, still more preferably not less than 5000, even more preferably not less than 10000. In a case where the material graphite film endures after being folded not less than 100 times, the rewinding process (described later) is easily carried out because such a film is strong and flexible and, accordingly, does not easily tear. How to evaluate a material graphite film and a graphite film by the MIT folding endurance test will be described in Examples.

The re-forming process can be carried out with respect to a material graphite film of which form is to be changed. Alternatively, the re-forming process can be added to a production process of a graphite film. Further, the re-forming process can be carried out again with respect to a graphite film, serving as a material graphite film, which has been subjected to the re-forming process once.

According to the present invention, a graphite film whose flatness is re-formed can be obtained by (i) at least once cooling down a material graphite film, obtained from a polymeric film by heat treatment at not less than 2000° C., to less than 2000° C. and then (ii) carrying out the re-forming process. Cooling down a material graphite film to less than 2000° C. means once cooling down a material graphite film which is synthesized by heat treatment. By cooling down a material graphite film, preparation of the re-forming process, such as the rewinding process, is facilitated.

<Length and Width of Material Graphite Film>

A width of a material graphite film indicates a length of a short side of a continuous sheet of the material graphite film. The width of the material graphite film of the present invention is not limited in particular. However, as the graphite film becomes wider, it becomes more difficult to control sag. Therefore, in this case, it is possible to achieve a remarkable effect of the sag control through the re-forming process. The width of the material graphite film of the preset invention is preferably not less than 100 mm, more preferably not less than 200 mm, even more preferably 400 mm. In a case where the material graphite film has a width of not less than 100 mm, it is possible to achieve a remarkable effect of the sag control of the present invention.

A length of the material graphite film indicates a length of a long side of the continuous sheet of the material graphite film. The length of the material graphite film of the present invention is not limited in particular. However, the material graphite film preferably has a continuous length of not less than 4.0 m, more preferably not less than 10.0 m, even more preferably not less than 20.0 m. In a case where the material graphite film has a continuous length of not less than 4.0 m, it is possible to obtain a long graphite film whose sag is controlled.

Generally, in a case where, as in the present invention, a process which requires heat-treatment at not less than 2000° C. is carried out with the use of a press (sheet-fed press), the press needs to occupy a large area. It is therefore difficult to produce a large-area or long graphite film with the use of a press. According to the present invention, it is possible to produce a graphite film having an area of not less than 0.4 m$^2$, further not less than 2.0 m$^2$, particularly not less than 8.0 m$^2$ or a graphite film having a length of not less than 4.0 m, further not less than 10.0 m, particularly not less than 20.0 m.

<Method for Applying Pressure During Sag Form Re-Forming Process>

How to apply pressure to a material graphite film is not limited in particular. Examples of a method of applying pressure includes 1) a method of applying pressure to a surface of the material graphite film in a sheet shape, 2) a method of expanding the material graphite film wound to a roll from its inside, and 3) a method of pulling the material graphite film.

Figure 7:
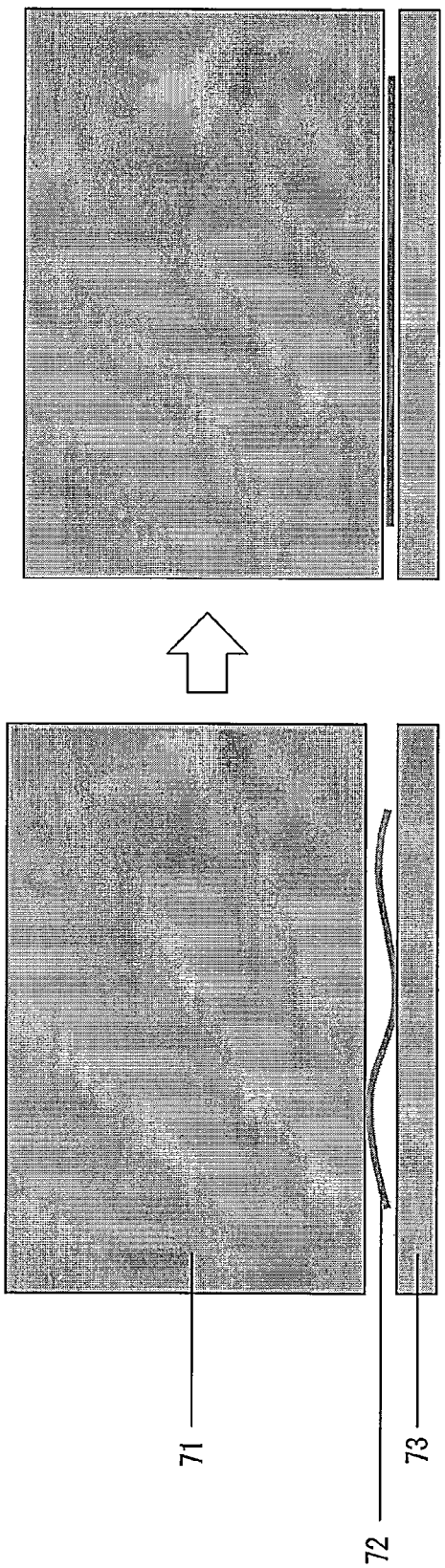
FIG. 7 is a view illustrating how to apply a load on a surface of a material graphite film in a sheet shape.

1) According to the method of applying pressure to the surface of the material graphite film in the sheet shape, it is possible to apply pressure to the material graphite film by placing a weight on the surface of the film or pressing the film during heat-treatment as illustrated in FIG. 7. According to the method, pressure necessary to re-form flatness is not less than 5 g/cm$^2$, preferably not less than 50 g/cm$^2$, more preferably not less than 100 g/cm$^2$. In a case where the pressure is not less than 5 g/cm$^2$, it is possible to achieve the effect of the re-forming. An upper limit of the pressure is only necessary to be one with which the film is not damaged.

Figure 9:
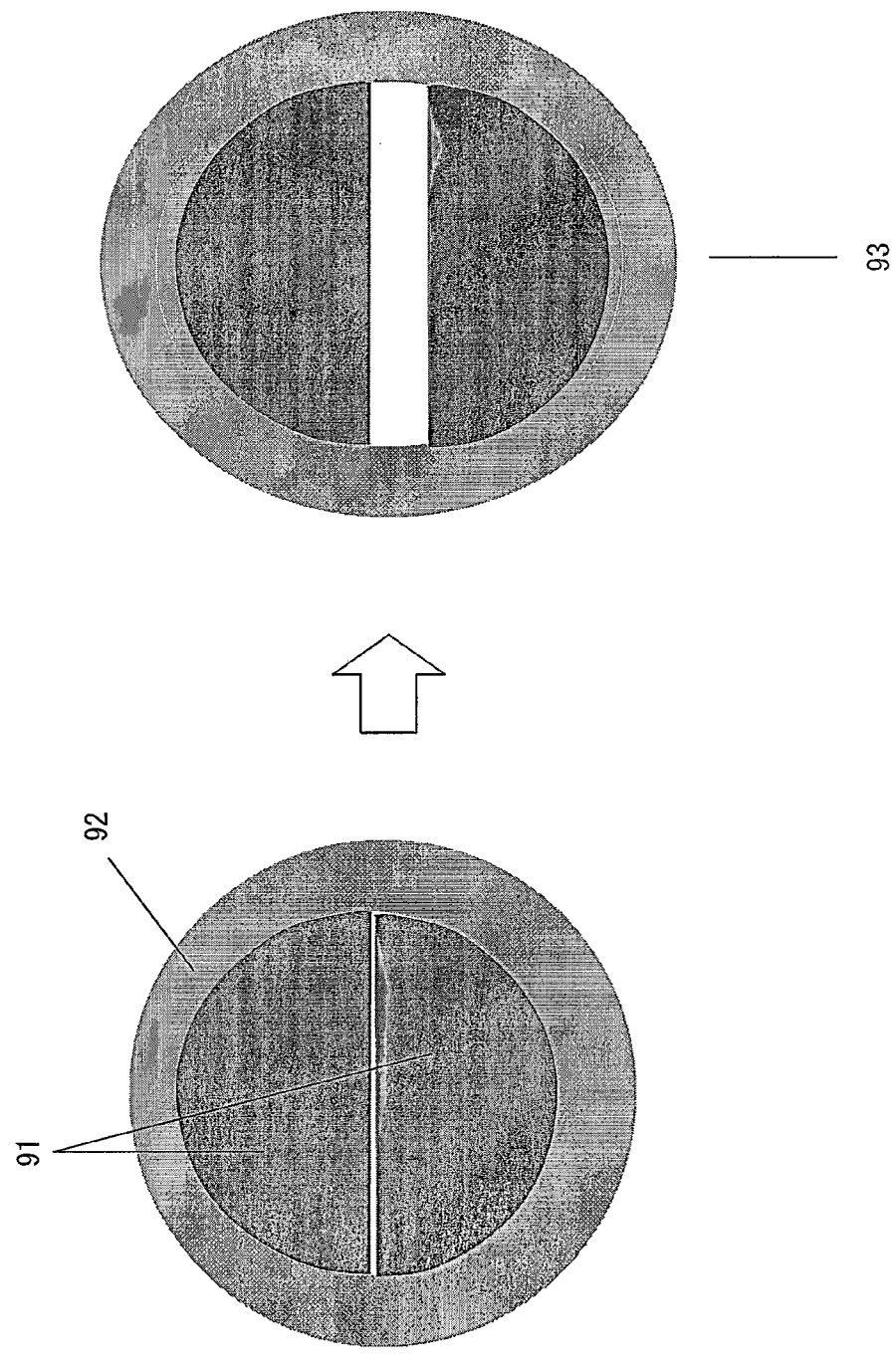
FIG. 9 is a view illustrating how to carry out a re-forming process with the use of an expansible inner core.

2) An example of the method of expanding the material graphite film wound to a roll from the inside is such that the material graphite film is wound around an expansible inner core and then pressure is applied to the material graphite film by the inner core. As an example, FIG. 9 illustrates a method of expanding a divided inner core outward.

According to the method, as pressure necessary to re-form flatness, it is preferable to apply, by use of the inner core, pressure of not less than 5 g/cm$^2$, preferably not less than 50 g/cm$^2$, more preferably not less than 100 g/cm$^2$ to an inner surface of an innermost circumference of the material graphite film wound around the inner core. In a case where the pressure is not less than 5 g/cm$^2$, it is possible to achieve the effect of the re-forming. An upper limit of the pressure is only necessary to be one with which the film is not damaged.

Figure 8:
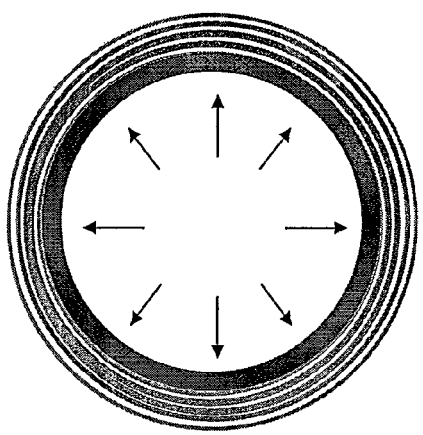
FIG. 8 is a view illustrating how to expand a material graphite film with the use of thermal expansion of an inner core.
Figure 8:
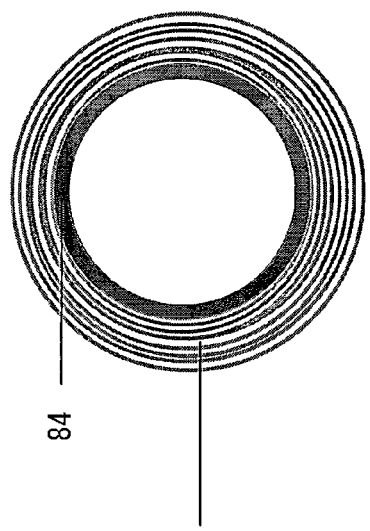

Further, another example of the method is such that the material graphite film is expanded with the use of thermal expansion of an inner core, as illustrated in FIG. 8. This method is preferably used because the re-forming process is simply carried out without providing a particular kind of mechanism in a furnace. Since a material graphite film which is sufficiently graphitized is arranged such that graphite crystallites are highly oriented in a planner direction, thermal expansion of the material graphite film in the planer direction is small. Accordingly, in a case where the material graphite film wound around a graphite inner core is heat-treated, expansion of the material graphite film tends to be due to thermal expansion of the graphite inner core. Thus, the re-forming process brings about a great effect. It is preferable to carry out the re-forming process to a roll wound around the inner core.

According to the method, it is not possible to measure pressure necessary to re-form flatness. Instead, it is possible to specify the pressure by winding strength during the rewinding process. The winding strength during the rewinding process of the present invention is not less than 1 N·m/m, preferably not less than 5 N·m/m, more preferably not less than 10 N·m/m, still more preferably not less than 100 N·m/m, even more preferably not less than 200 N·m/m. In a case where the winding strength is not less than 1 N·m/m, sufficient pressure is applied, by the inner core, to the inner surface of the innermost circumference of the material graphite film wound around the inner core during the re-forming process. It is therefore possible to achieve the effect of the re-forming. An upper limit of the winding strength is only necessary to be one with which the film is not damaged.

3) It is also possible to re-form flatness by heat-treating the material graphite film while pulling the material graphite film.

According to this method, pressure necessary to re-form the flatness can be specified as tension applied to the film. The tension necessary to re-form the flatness is not less than 5 g/cm, preferably not less than 20 g/cm, more preferably not less than 50 g/cm. In a case where the tension is not less than 5 g/cm, it is possible to achieve the effect of the re-forming. An upper limit of the tension is only necessary to be one with which the film is not damaged. A maximum temperature necessary to re-form the flatness is not less than 2000° C., preferably not less than 2200° C., more preferably not less than 2400° C., still more preferably not less than 2600° C., even more preferably not less than 2750° C., most preferably not less than 2800° C. In a case where the maximum temperature is not less than 2000° C., reorientation of the graphite crystallites starts and, accordingly, the material graphite film is easily re-formed. Further, in a case where the re-forming process is carried out with the use of difference in thermal expansion between the inner core and the material graphite film while the material graphite film is being wound around the inner core, the inner core and the material graphite film become different in expansion amount when the maximum temperature is not less than 2000° C. and, accordingly, the material graphite film is easily re-formed. The material graphite film of the present invention can be a graphite film obtained by burning a polymer or a graphite film obtained from natural graphite. The graphite film obtained by burning a polymer is better in orientation of graphite crystallites than the graphite film obtained from natural graphite and, accordingly, is smaller in coefficient of thermal expansion in a planner direction. Therefore, in view of the effect of re-forming the material graphite film while the material graphite film is being wound around the inner core, the graphite film obtained by burning a polymer is preferably used.

<Example of Production Process of Graphite Film which Process Includes Carbonization Process and Re-Forming Process>

The following description will discuss an example of the production process of a graphite film which process includes the carbonization process and the re-forming process. The production process preferably includes 1) the carbonization process, 2) graphitization process, and 3) the re-forming process.

1) The carbonization process is a process in which a polymeric film is pre-heated to at least around 800° C. Through the process, the polymeric film is thermally decomposed, so that a carbonized film is prepared. How to hold the polymeric film is, for example, such that (i) the polymeric film is cut into a sheet and then held in a square jig by being sandwiched between plates or sheets and that (ii) the long polymeric film is held by being wound around an inner core jig. Each of the jigs used in this case is preferably heat-resistant as with a graphite material. Further, the inner core around which the polymeric film is wound is preferably has a cylindrical shape. Alternatively, heating can be carried out while the film wound to a roll is being rewound to the other roll. A resulting carbonized film weighs around 60% of the polymeric film and is a glass film.

2) The graphitization process is a process in which a polymeric film or a carbonized film prepared in the carbonization process is heated at a temperature of not less than 1800° C. so that a material graphite film is prepared. A maximum temperature during the graphitization is not less than 1800° C., preferably not less than 2000° C., more preferably not less than 2200° C., still more preferably not less than 2400° C., even more preferably not less than 2600° C., most preferably 2800° C. In a case where the maximum temperature is not less than 1800° C., the film is sufficiently graphitized. It is therefore possible to obtain a material graphite film whose change in size during the next re-forming process is to be small and whose flatness is to be easily improved. Particularly, in a case where the re-forming process is carried out with the use of difference in thermal expansion between the inner core and the material graphite film while the material graphite film is being wound around the inner core, the effect of the re-forming process is easily achieved when the change in size of the material graphite film is small, because the material graphite film is easily expanded by the inner core. Furthermore, in a case where the maximum temperature is not less than 1800° C., the carbonized film or the polymeric film is converted, by the graphitization, into a strong and flexible film which does not easily tear. This facilitates the rewinding process. The carbonization process and the graphitization process can be successively carried out. Alternatively, after the carbonization process is terminated, the graphitization process can be solely carried out. Note that a graphite film which has been subjected to the graphitization process but has not yet subjected to the re-forming process is referred to as "a material graphite film".

3) In a case where the re-forming process is added to the production process, the re-forming process only needs to be carried out with respect to a material graphite film obtained by carrying out the graphitization process. The re-forming process and the graphitization process can be successively carried out. Alternatively, after the graphitization process is terminated, the re-forming process can be solely carried out.

<Method of Carrying Out Re-Forming with Use of Thermal Expansion of Inner Core by Carrying Out Heat-Treatment in a State where Material Graphite Film is being Wound Around Inner Core>

According to the re-forming process of the present invention, it is preferable to carry out heat-treatment in a state where a material graphite film is wound around the inner core. According to this method, the inner core is thermally expanded during the heat-treatment as illustrated in FIG. 8. As a result, the material graphite film which is expansible at a low temperature is expanded, so that the material graphite film is re-formed.

(Inner Core)

According to the present invention, the inner core, around which the material graphite film is wound, is not limited in particular in terms of its shape. A cylindrical inner core, a polygonal inner core, or the like can be used. Particularly, the cylindrical inner core is preferably used because the cylindrical inner core is capable of uniformly applying a force to the material graphite film during the re-forming and, accordingly, allows a high-quality graphite film to be obtained.

An outer circumference of the inner core used in the present invention is not limited in particular. However, the outer circumference is preferably not less than 62.80 mm, more preferably not less than 157.00 mm, even more preferably not less than 251.20 mm. In a case where the outer circumference of the inner core is not less than 62.80 mm, an expansion amount of the inner core is sufficient for the material graphite film to be expanded so that the material graphite film is re-formed. Furthermore, a resulting graphite film has less curl. This allows the graphite film to be easily extended.

The coefficient of thermal expansion of the inner core used in the present invention is not limited in particular. However, the coefficient is preferably not less than $0.3 \times 10^{-6}$/K and not more than $7.5 \times 10^{-6}$/K, more preferably not less than $0.7 \times 10^{-6}$/K and not more than $6.5 \times 10^{-6}$/K, even more preferably not less than $2.0 \times 10^{-6}$/K and not more than $5.0 \times 10^{-6}$/K. In a case where the coefficient of thermal expansion of the inner core is not less than $0.3 \times 10^{-6}$/K, an expansion amount of the inner core is sufficient for the material graphite film to be expanded so that the material graphite film is re-formed. In a case where the coefficient of thermal expansion of the inner core is not less than $7.5 \times 10^{-6}$/K, the material graphite film is not expanded too vastly to tear. Particularly, in a case where the coefficient of thermal expansion is not less than $2.0 \times 10^{6}$/K and not more than $5.0 \times 10^{-6}$/K, it is possible to sufficiently re-form sag without causing tears on the film.

The inner core is preferably made of graphite in view of heat-resistance. Particularly, an inner core made by molding, extrusion molding or CIP molding is suitably used.

(Shape of Inner Core)

Figure 10:
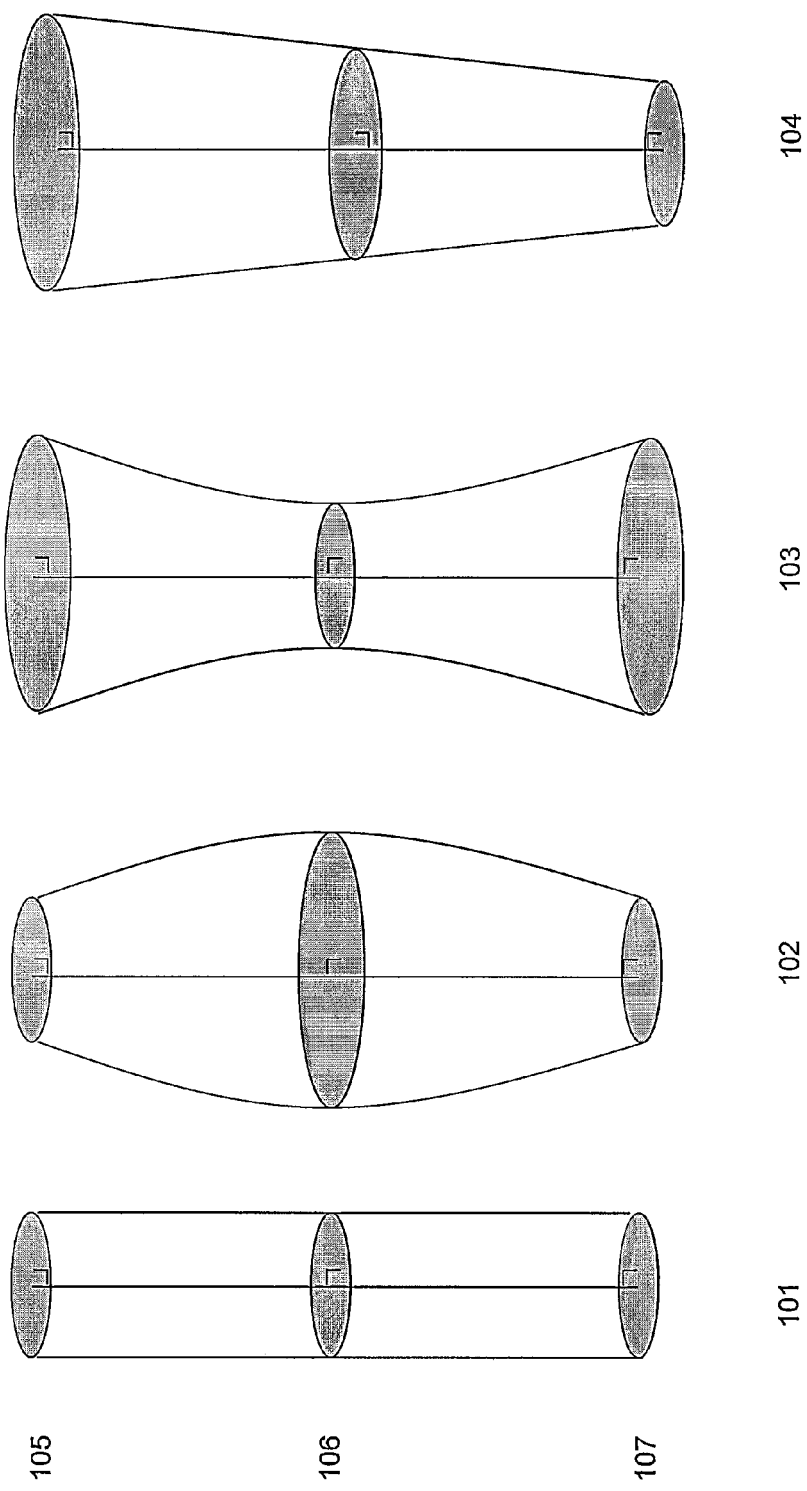
FIG. 10 is a conceptual diagram illustrating inner cores used to form various sag.

FIG. 10 illustrates (i) an inner core 101 used to produce a flat graphite film, (ii) an inner core 102 used to produce a graphite film having sag in the middle, (iii) an inner core 103 used to produce a graphite film having sag at its both edges, and (iv) an inner core 104 used to produce a graphite film having sag at its one edge, each of which is used in the method of re-forming sag with the use of difference in thermal expansion between the inner core and a material graphite film.

Figure 11:
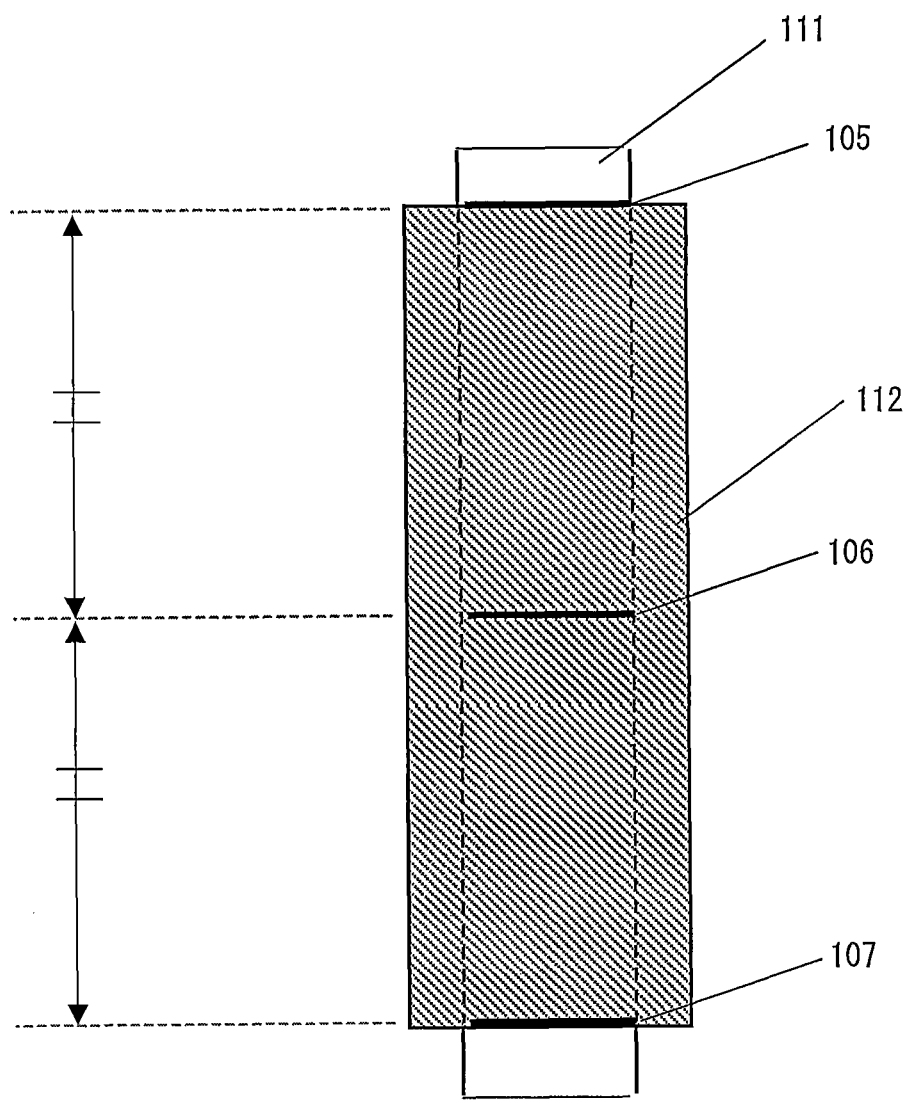
FIG. 11 is a view for explanation of a middle-outer circumference, an edge 1-outer circumference, and an edge 2-outer circumference.

It is assumed, as illustrated in FIG. 11, that (i) an outer circumference of an inner core which circumference corresponds to the middle in a width direction of a material graphite film wound around the inner core (see FIG. 11) is referred to as a middle-outer circumference 106 and (ii) outer circumferences of the inner core which circumferences correspond to edges of the material graphite film are respectively referred to as an edge 1-outer circumference 105 and an edge 2-outer circumference 107. Difference in outer circumference can be represented by the following expression:

Difference in outer circumference (%)=(maximum value of outer circumference minimum value of outer circumference)/minimum value of outer circumference×100

An outer circumference of the inner core is measured by a method by which measurement can be carried out with an accuracy of not more than 1 μm in resolution. For example, a 3-dimensional coordinate measuring machine available from Tokyo Seimitsu Co., Ltd. (model: UPMC 850 CARAT Ultra) can carry out measurement with a considerably high accuracy. In a case of the inner core 101 (that is, in a case where the flat graphite film is produced), difference between the middle-outer circumference, the edge 1-outer circumference, and the edge 2-outer circumference is preferably less than 0.0027%, more preferably not more than 0.0010%, even more preferably 0.0006%. In a case of the inner core 102 (that is, in a case where the graphite film having sag in the middle is produced), the middle-outer circumference is preferably longer than the edge 1-outer circumference and the edge 2-outer circumference, and difference between the outer circumferences, the edge t-outer circumference, and the edge 2-outer circumference is preferably not less than 0.0027% and not more than 0.7000%, more preferably not less than 0.0426% and not more than 0.5158%, even more preferably not less than 0.1500% and not more than 0.3800%. In a case of the inner core 103 (that is, in a case where the graphite film having sag in its both edges is produced), the middle-outer circumference is preferably shorter than the edge 1-outer circumference and the edge 2-outer circumference, and difference between the middle-outer circumference, the edge 1-outer circumference, and the edge 2-outer circumference is preferably not less than 0.0027% and not more than 0.7000%, more preferably not less than 0.0426% and not more than 0.5158%, even more preferably not less than 0.1500% and not more than 0.3800%. In a case of the inner core 104 (that is, in a case where the graphite film having sag at its one edge is produced), the edge 1-outer circumference, the middle-outer circumference, and the edge 2-outer circumference become longer in this order, and difference between the middle-outer circumference, the edge 1-outer circumference, and the edge 2-outer circumference is preferably not less than 0.0027% and not more than 0.7000%, more preferably not less than 0.0426% and not more than 0.5158%, even more preferably not less than 0.1500% and not more than 0.3800%.

(Rewinding Process)

Figure 12:
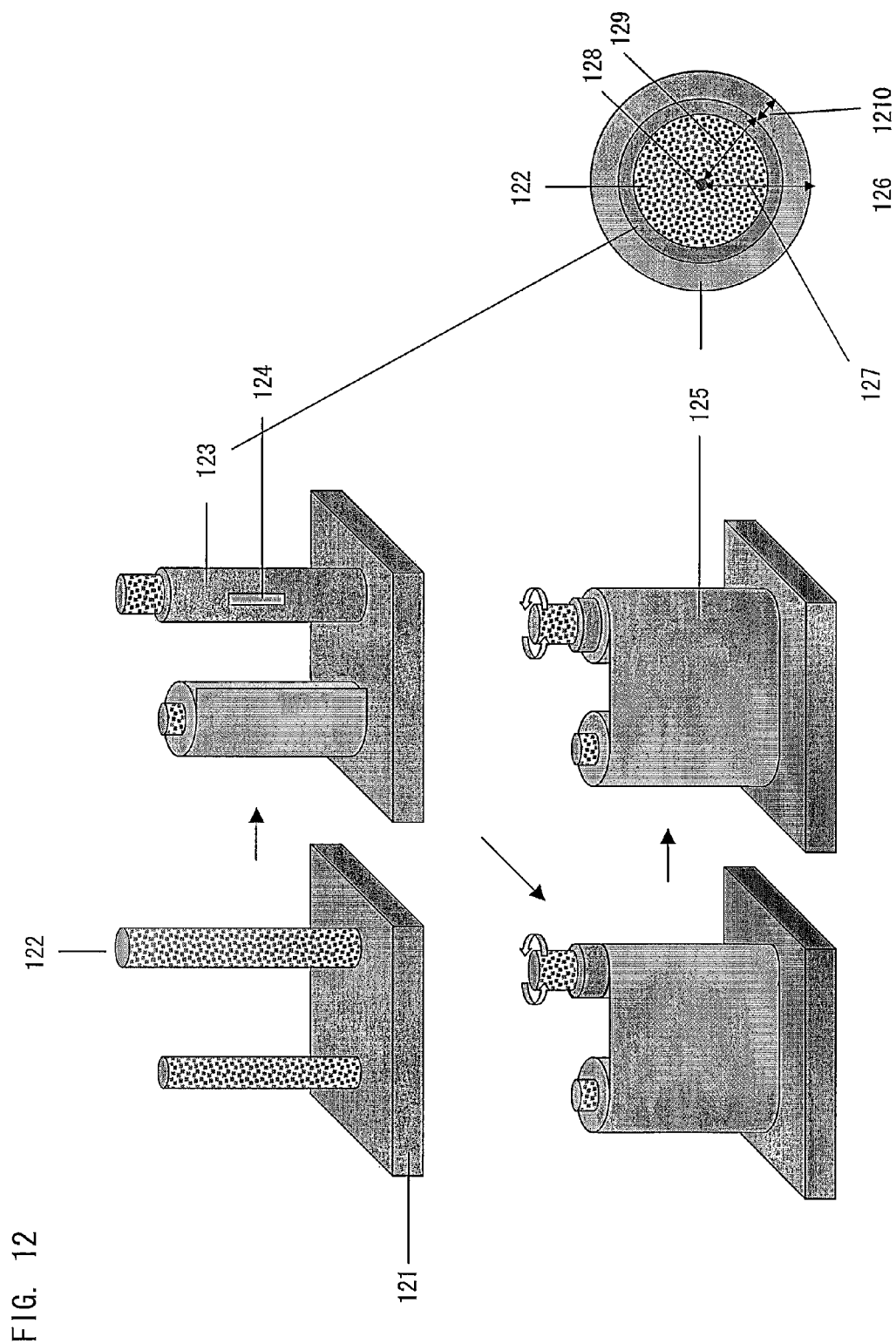
FIG. 12 is a view illustrating an example of a rewinding process.

In a case where the re-forming process is carried out while a material graphite film is being wound around an inner core, it is preferable to tightly wind the material graphite film around an inner core. Therefore, according to the present invention, the rewinding process in which the material graphite film is wound around the inner core is preferably carried out before the re-forming process is carried out. In the rewinding process, a rewinding device can be used. In this case, it is preferable to wind the material graphite film so that edges of the material graphite film are neatly aligned. This allows the inner core to uniformly apply a force to the material graphite film during the re-forming process. This causes, on the film, no place to which pressure is not transferred. Therefore, the re-forming brings about a great effect. The edges can be aligned with the use of an edge position control (a control device which automatically and neatly aligns film edges, i.e., so-called "edges") or the like. However, a vertical rewinding device as illustrated in FIG. 12 can be used to rewind the material graphite film in a state where the edges are neatly aligned. The rewinding process is easily carried out in a case where the rewinding is started after the inner core and the material graphite film are fixed to each other with the use of a double-sided tape or the like.

The winding strength of the present invention indicates a product of (i) torque of a rotating shaft of a core and (ii) a radius of an outermost circumference of a roll of the material graphite film (see FIG. 12). The rewinding is carried out in such a way that the rotating shaft is rotated with a predetermined torque until rotation of the rotating shaft stops while the outermost circumference of the material graphite film is being fixed unmovably. For example, according to FIG. 12, in a case where a radius 129 of an inner core around which a material graphite film is wound is 50 mm, a thickness 1210 of a roll of the material graphite film is 5 mm, and torque of a rotating shaft is 4N·m, winding strength is 220 N·m/m.

The winding strength during the rewinding process of the present invention is not less than 1 N·m/m, preferably not less than 5 N·m/m, more preferably 10 N·m/m, even more preferably not less than 100 N·m/m, most preferably 200 N·m/m. In a case where the winding strength is not less than 1 N·m/m, an expansion force of the inner core is transferred to the outer circumference of the roll of the material graphite film. It is therefore possible to obtain a graphite film whose flatness is improved. Particularly, in a case where the winding strength is not less than 200 N·m/m, it is possible to sufficiently improve the flatness.

(How to Fix Edges)

In a case where the re-forming process is carried out in a state where a material graphite film is being wound around an inner core, it is difficult to achieve the effect of the re-forming when the material graphite film comes loose from the inner core during the heat-treatment. Therefore, it is necessary to fix the roll of the material graphite film so as not to come loose from the inner core. For one thing, it is possible to fix the material graphite film by placing a weight on the outermost circumference of the material graphite film wound around the inner core. Alternatively, it is possible to fix the material graphite film under its own weight only by transversely placing the material graphite film wound around the inner core on a hearth. Further, it is possible to fix the material graphite film by pulling edges of the outermost circumference of the roll of the material graphite film. Moreover, a method of avoiding looseness of the material graphite film by controlling pressure for fixing the material graphite film is also efficient. How to fix the material graphite film is not limited in particular, provided that the roll of the graphite film does not come loose.

(Method for Producing Graphite Film Having Two Different Sag Forms with Use of Two Types of Inner Cores)

It is possible to produce a graphite film having two different sag forms by rewinding a material graphite film with the use of two types of inner cores having respective different shapes (see FIG. 13)

As another example, it is also possible to carry out the sag form re-forming process in a state where a given part, between two inner cores, of a material graphite film is not wound around the inner cores (see FIG. 28). In this case, by adding a specific sag form to the material graphite film in advance, it is possible to produce a graphite film having three controlled sag forms at its inner core 1 side, part which is not wound around any inner core, and inner core 2 side, respectively. By combining those methods, it is possible to add four or more different sag forms to one graphite film.

Figure 29:
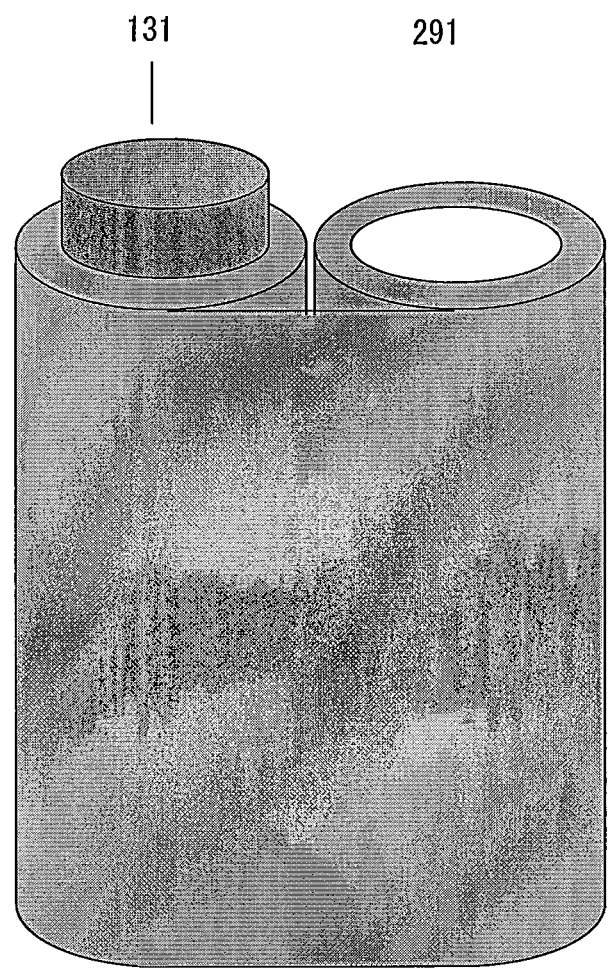
FIG. 29 is a view illustrating how to produce a graphite film having two different sag forms with the use of a single inner core.

As further another example, it is also possible to carry out the sag form re-forming process in a state where a part of a material graphite film is wound around a single inner core and the other part of the material graphite film is not wound around the inner core (see FIG. 29). In this case, by adding a specific sag form to the material graphite film in advance, it is possible to produce a graphite film having two controlled sag forms at its inner core 1 side and the part which is not wound around the inner core, respectively. Note that, according to FIG. 29, part of the graphite film which part is not wound around the inner core 1 (inner core 131) is illustrated as being rolled-up. However, provided that an object is attained, it is not limited in particular how to keep part of the graphite film to which part a new sag form is not to be added while the new sag form is being added to the other part of the graphite film by the inner core 1 (inner core 131).

<Length and Width of Graphite Film>

A width of a graphite film indicates a length of a short side of a continuous sheet of the graphite film. The width of the graphite film of the present invention is not limited in particular. However, as the graphite film becomes wider, it becomes more difficult to control sag. Therefore, in this case, it is possible to achieve a remarkable effect of the sag control through the re-forming process. The width of the graphite film of the present invention is preferably not less than 100 mm, more preferably not less than 200 mm, even more preferably 400 mm. In a case where the graphite film has a width of not less than 100 mm, it is possible to achieve a remarkable effect of the sag control of the present invention.

A length of the graphite film indicates a length of a long side of the continuous sheet of the graphite film. The length of the graphite film of the present invention is not limited in particular. However, the graphite film preferably has a continuous length of not less than 4.0 m, more preferably not less than 10.0 m, even more preferably not less than 20.0 m. In a case where the graphite film has a continuous length of not less than 4.0 m, lamination, rewind, and the like are easily carried out.

Further, regions of the two different sag forms in the graphite film preferably have respective continuous lengths of not less than 2.0 m, more preferably not less than 5.0 m, even more preferably 10.0 m. In a case where the regions of the two different sag forms have respective continuous lengths of not less than 2.0 m, lamination, rewind, and the like are easily carried out.

<Polymeric Film>

The polymeric film used in the present invention is not limited in particular. For, example, the polymeric film is a film of a polymer selected from the group consisting of polyimide (PI), polyamide (PA), polyoxadiazole (POD), polybenzoxazole (PBO), polybenzobisoxazole (PBBO), polythiazole (PT), polybenzothiazole (PBT), polybenzobisthiazole (PBBT), polyparaphenylene vinylene (PPV), polybenzimidazole (PBI), and polybenzobisimidazole (PBBI). By use of at least one of those polymers, a material graphite film and a graphite film are easily obtained each of which is excellent in crystallinity, thermal diffusivity, and thermal conductivity. Particularly, a polymeric film made of polyimide is preferably used.

EXAMPLES

The following description will discuss various examples of the present invention together with several comparative examples.

<Various Physical Properties Measurement Condition>

<Measurement of Sag of Material Graphite Film and Graphite Film According to JIS C2151>

Evaluation of sag of a material graphite film and a graphite film was carried out according to the film windability evaluation described in JIS C2151. Specifically, (i) the material graphite film and the graphite film were rested in a normal state under an atmosphere of a temperature of 23° C. and a humidity of 50% for 24 hours and then (ii) a degree of the sag was measured under an atmosphere of a temperature of 23° C. and a humidity of 50%.

(Test Piece)

Test pieces are collected by cutting out samples from an end of the graphite film so that each piece is 2 m in length. For example, the graphite film has a roll of 11 m, five test pieces can be obtained.

(Device)

Figure 1:
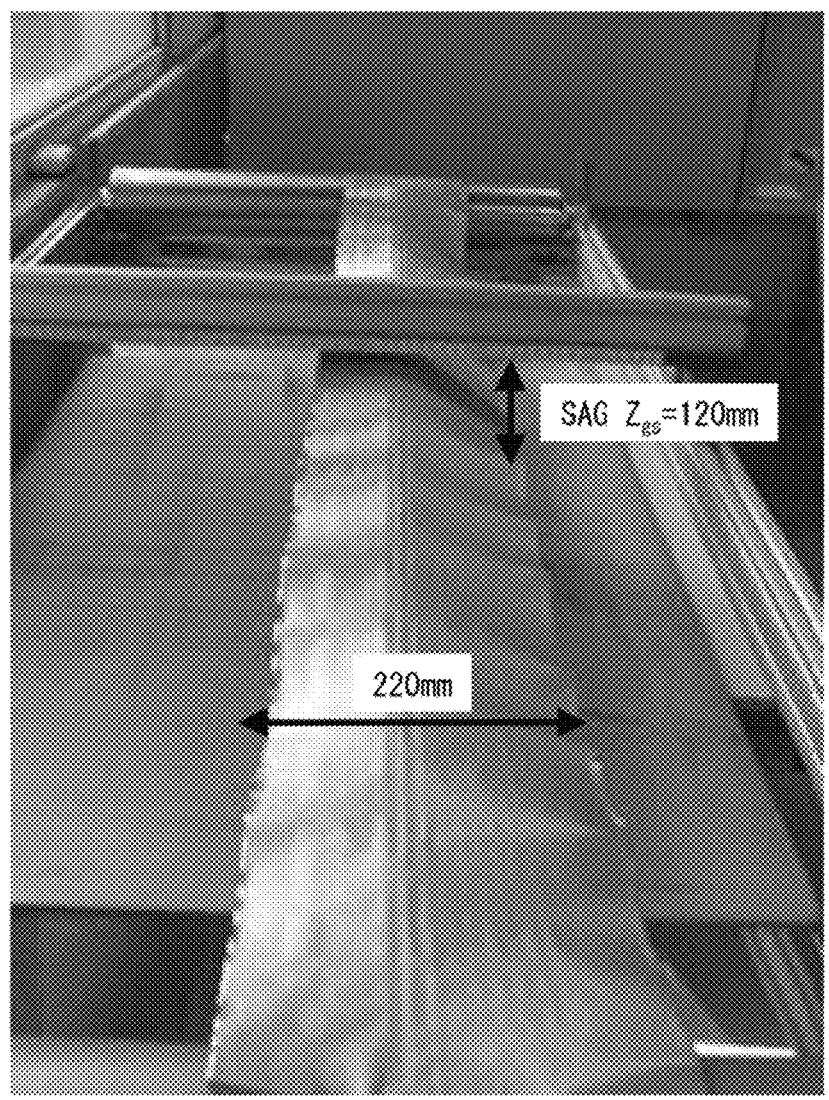
FIG. 1 is a view illustrating a graphite film having a continuous sag form.
Figure 2:
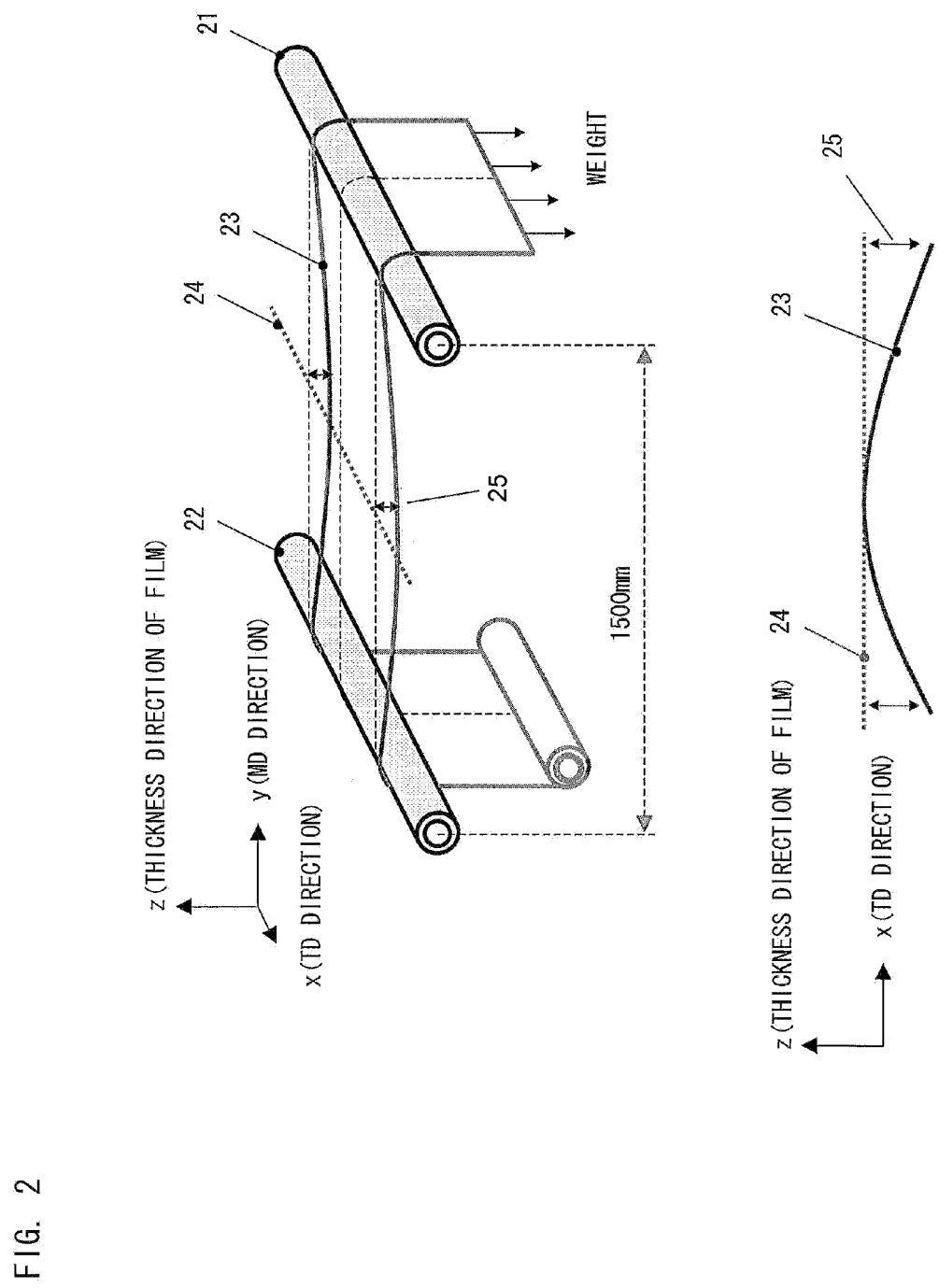
FIG. 2 is a view schematically illustrating how to carry out sag measurement described in JIS C2151.

The following description will discuss a device (see FIG. 2).

a) Mount Equipped with Rolls

This device has freely-rotated two metallic rolls and a rigid mount which supports the two metallic rolls in parallel. Each of the rolls has a diameter of 100 mm±10 mm, and has a sufficient length so that a region of the film to be tested which region has a maximum width can be placed. Axes of the two rolls are on the same level with each other and are fixed in parallel at a spacing of 1500 mm±15 mm within 0.1 degree (i.e. within 1.8 mm per meter of the length of the roll). Each of the rolls has a cylindrical shape having a cylindricity of not more than 0.1 mm, and has a surface subjected to appropriate satin finish (not subjected to polished finish).

b) Device for Applying Tensile Force to Film

A weight or a spring-joint clamp can be attached to the film freely hanging from the second roll (roll 2) at an end, far from a first roll, of the mount. As a load of the weight or the spring, 50 g per cm of the width of the film can be applied to the film, and the weight or the spring can be adjusted so that a tensile force can be applied as uniform as possible to the film in the width direction thereof. Alternatively, the film may be wound around a tension roll, and a uniform tensile force of 50 g per cm of the width may be applied thereto.

c) Dimension Measuring Tool

There is prepared a tool for measuring a distance from a plane defined by the two rolls to the film sagging downward along a line which is parallel to the rolls and located in the middle between the two rolls. The tool for use in the measurement is a steel straightedge having a length of not less than 1525 mm and a steel ruler having a length of 150 mm and being marked with 1 mm increments. Alternatively, a complex device that indicates the position of the film automatically or semiautomatically may be used.

(Measurement Procedure)

As shown in FIG. 2, a test piece is placed in a length direction on the two rolls of the device. A tensile force (50 g per cm as described above) is applied to a free end of the film. A final location of the film when the film passes over the roll 2 is adjusted so that the film is substantially horizontal in the middle of the two rolls. With use of the steel straightedge and the steel ruler, the film is confirmed along the width direction in the middle of the two rolls.

(Results)

The film was observed visually, and, when a part having the largest sag was found, the sag was measured. Average sag of all pieces was referred to as Zgs, and is shown in Table 1 to Table 3.

<Method of Measuring Sag Value "a" at Edge>

Figure 14:
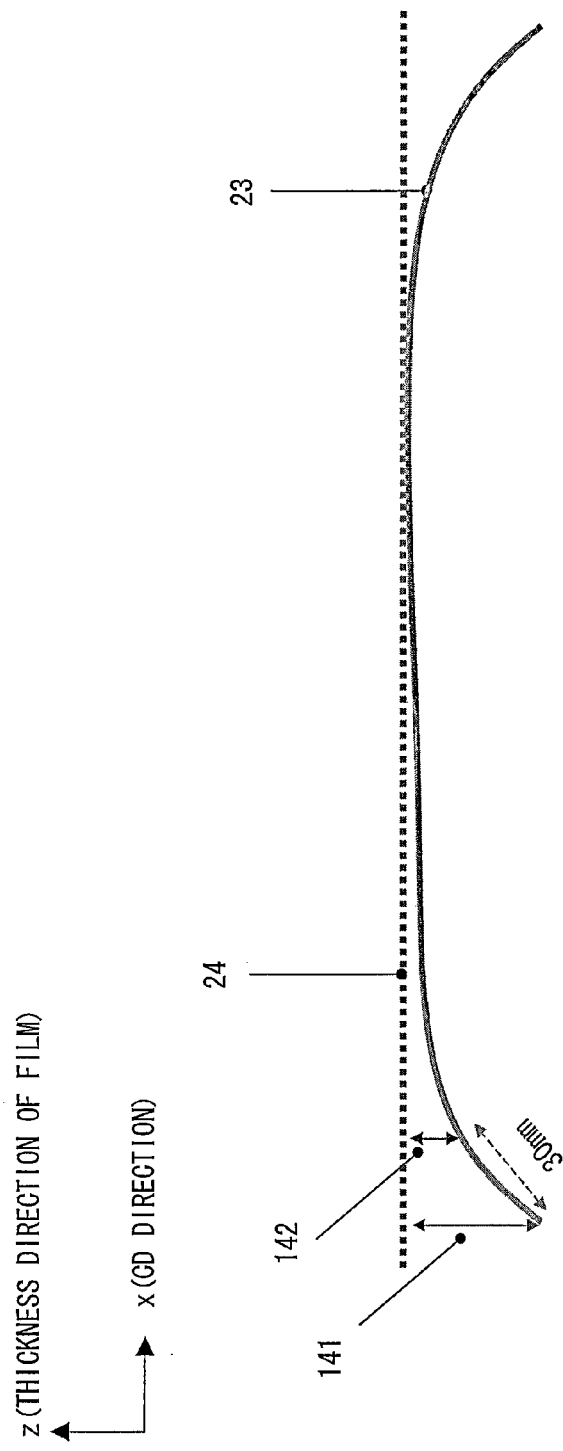
FIG. 14 is a schematic view regarding a value "a".

A sag value "a" at an edge of the material graphite film and the graphite film was measured after the film was set in the same state as the above-described sag measurement according to JIS C2151. As shown in FIG. 14, a depth of sag from a suspended line at an outer edge was measured, and a depth of sag from the suspended line at a point 30 mm away from the outer edge was then measured. Thereafter, (a depth of sag at the point 30 mm away from the outer edge) was subtracted from (a depth of sag at the outer edge). For the right and left edges of the film, the same measurement was carried out, and average measurement values are shown in Table 1 to Table 3.

<Measurement Method of Sag Value "b" in Middle>

Figure 15:
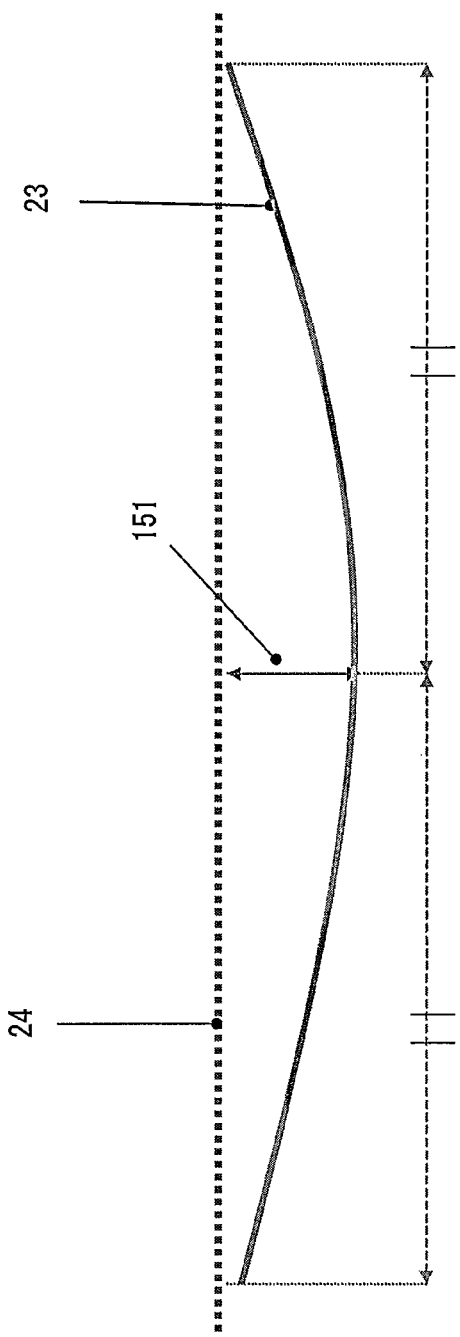
FIG. 15 is a schematic view regarding a value "b".

A sag value "b" in the middle of the graphite film was also measured after the film was set in the same state as the above-described sag measurement according to JIS C2151. Sag in the middle of the graphite film in the width direction was measured as shown in FIG. 15, and averages of all test pieces are shown in Table 1 to Table 3.

<Measurement of Bend of Material Graphite Film and Graphite Film According to JIS C2151>

Evaluation of bends of a material graphite film and a graphite film was carried out according to the film windability evaluation described in JIS C2151. Specifically, (i) the material graphite film and the graphite film were rested in a normal state under an atmosphere of a temperature of 23° C. for 24 hours and a humidity of 50% and then (ii) a degree of bends was measured under an atmosphere of the temperature of 23° C. and the humidity of 50%. A certain length of each of the films was rewound and was placed on a plane, and deviations from a straight line were measured at both edges of the film.

(Device)

Figure 16:
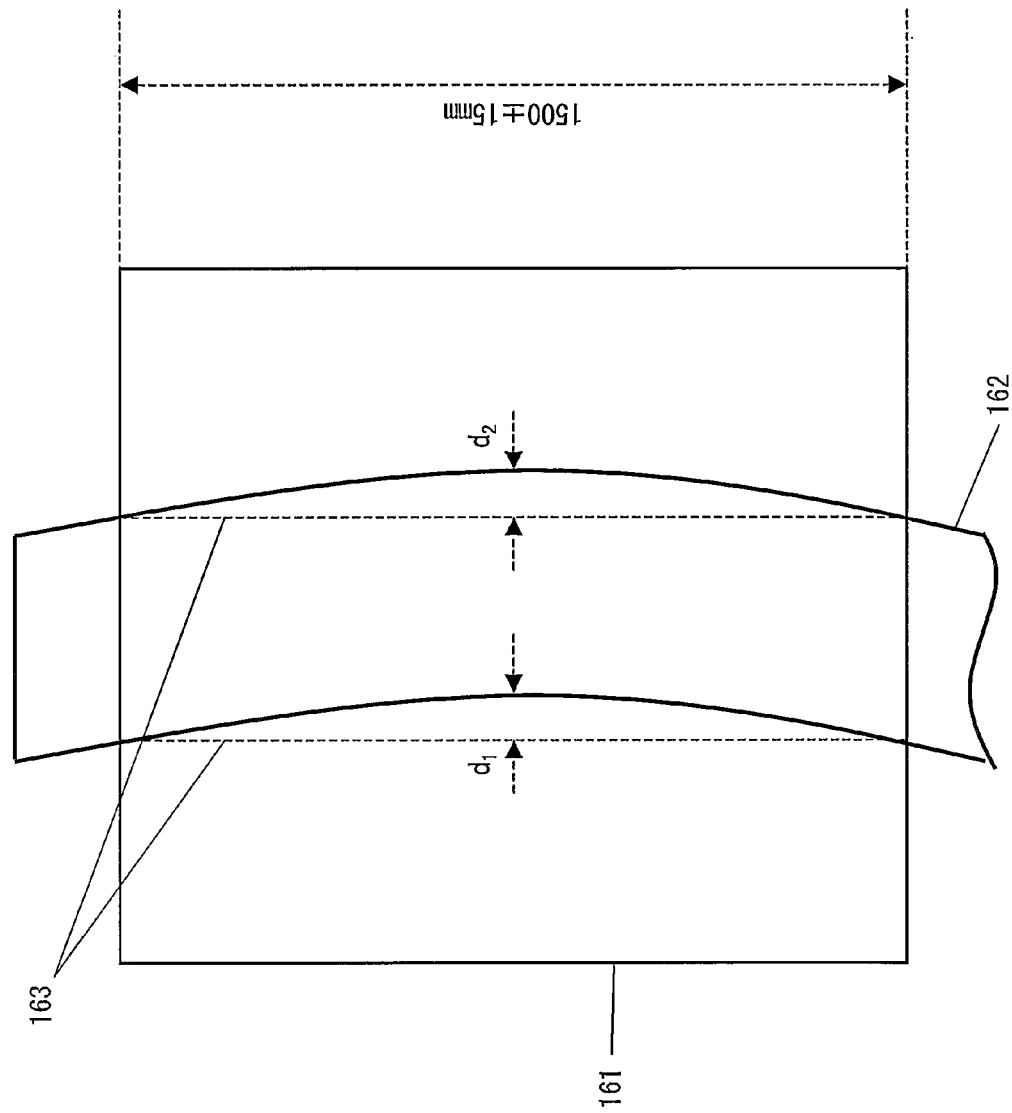
FIG. 16 is a view schematically illustrating how to carry out bend measurement described in JIS C2151.

The following description will discuss a device (see FIG. 16).

a) Table

A table employed has a width sufficiently greater than the maximum width of the film to be tested, a length of 1500 mm±15 mm, and a degree of parallelization at two ends being not greater than 0.1 degree (or not greater than 1.8 mm per meter of the width of the table). The surface should be flat and horizontal which has been subjected to satin finish (not subjected to polished finish) with an appropriate material. In a case where the table has a greater length than the above length, two parallel reference lines with an interval of 1500 mm±15 mm should be clearly marked on the surface of the table. The degree of parallelization of the reference lines is to be not greater than 0.1 degree (i.e., not greater than 1.8 mm per meter of the length of the reference lines).

b) Brush

A soft brush for flattening the film placed on the surface of the table.

c) Straightedge

A steel straightedge having a length of not less than 1525 mm.

d) Ruler

A steel ruler having a length of 150 mm and being marked with 1 mm increments.

(Test Pieces)

Test pieces are collected from the graphite film so that a length of each piece is 2 m in length by cutting out samples from an end of the graphite film until the graphite film becomes not long enough to collect the sample therefrom. For example, the graphite film has a roll of 11 m, 5 test pieces can be obtained.

(Measurement Procedures)

A test piece is placed on the table in a longitudinal direction as shown in FIG. 16. The film is gently brushed with a weak force from one end to allow the test piece to be in close contact with the table such that trapped air does not remain to the extent possible. An edge of the straightedge is placed along one edge of the film such that a deviation of the edge of the film from the straight line can be observed well. Edges of the steel straightedge are adjusted so as to match with the edges of the film at two ends of the table (or on the reference line). In the substantially middle of reference positions, a deviation d1 of the film edge from the steel straightedge is measured at a minimum scale of 1 mm with use of the steel ruler. In the same way, a deviation d2 of the other edge of the film from the straightedge is also measured. A bend value of the test piece is determined as sum (d1+d2) of deviations of the film edges from the edges of the straightedge at both sides of the film in the middle of the interval between the reference lines. Note that the unit is millimeter.

(Results)

While the sum of the deviations (d1+d2) was defined as a characteristic value of the bend, and averages of all test pieces are shown in Table 1 to Table 3.

<Measurement of Thermal Diffusivity in Planar Direction of Material Graphite Film and Graphite Film>

Figure 17:
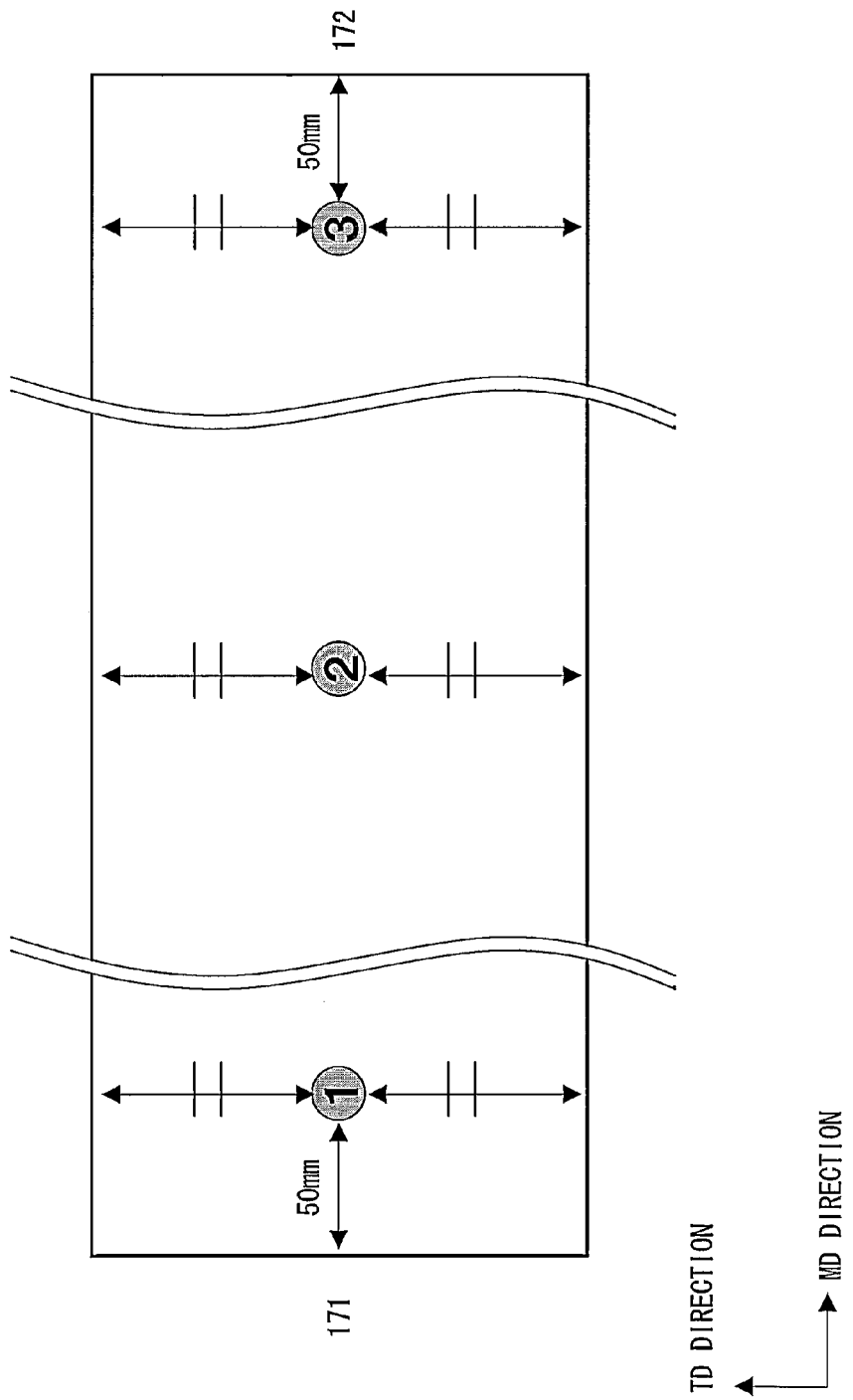
FIG. 17 is a view illustrating points of a material graphite film and a graphite film from which points samples for measurement of thermal diffusivity and samples for MIT measurement are collected.

Samples each having 4×40 mm cut away from the graphite film were measured under an atmosphere of temperature of 23° C. at 10 Hz in terms of thermal diffusivity in a planar direction of the material graphite film and the graphite film with use of a thermal diffusivity measurement device ("Laser-Pit" manufactured by ULVAC-RIKO, Inc.) which employs a light AC method. Three test pieces were cut out from three points (Nos. 1, 2, 3) of FIG. 17. No. 1 in FIG. 17 is located in a vicinity of the middle which is 50 mm away from an inner side of a roll of the material graphite film and the graphite film, No. 3 in FIG. 17 is located in a vicinity of the middle which is 50 mm away from an outer side of the roll thereof, and No. 2 in FIG. 17 is located in the middle of No. 1 and No. 3. The vicinity of the middle means a vicinity of a width of 100 mm if a roll having a TD width of 200 mm is used. Average values of the thermal diffusivity measured with use of the three test pieces are shown in Table 1 to Table 3.

<MIT Folding Endurance Test of Material Graphite Film and Graphite Film>

A MIT folding endurance test of the material graphite film and the graphite film was carried out. Three test pieces having 1.5×10 cm were cut out from three points (Nos. 1, 2, 3) of FIG. 17. The MIT folding endurance test was carried out with use of a MIT RUBBING-RESISTANCE FATIGUE TESTER D-type manufactured by TOYO SEIKI SEISAKU-SHO, LTD. under conditions that a test load was 100 gf (0.98 N), a speed was 90 times/min., and a curvature radius R of a folding clamp was 2 mm. The number of times of folding the test pieces was measured at a folding angle of 135° to the right and left under an atmosphere of a temperature of 23° C. until each of the test pieces was cut. The measurement was carried out with use of the three test pieces, and an average value is shown in Table 1 to Table 3.

<Various Evaluations>

<Evaluation of Laminating Property with Copper Foil Tape>

Figure 18:
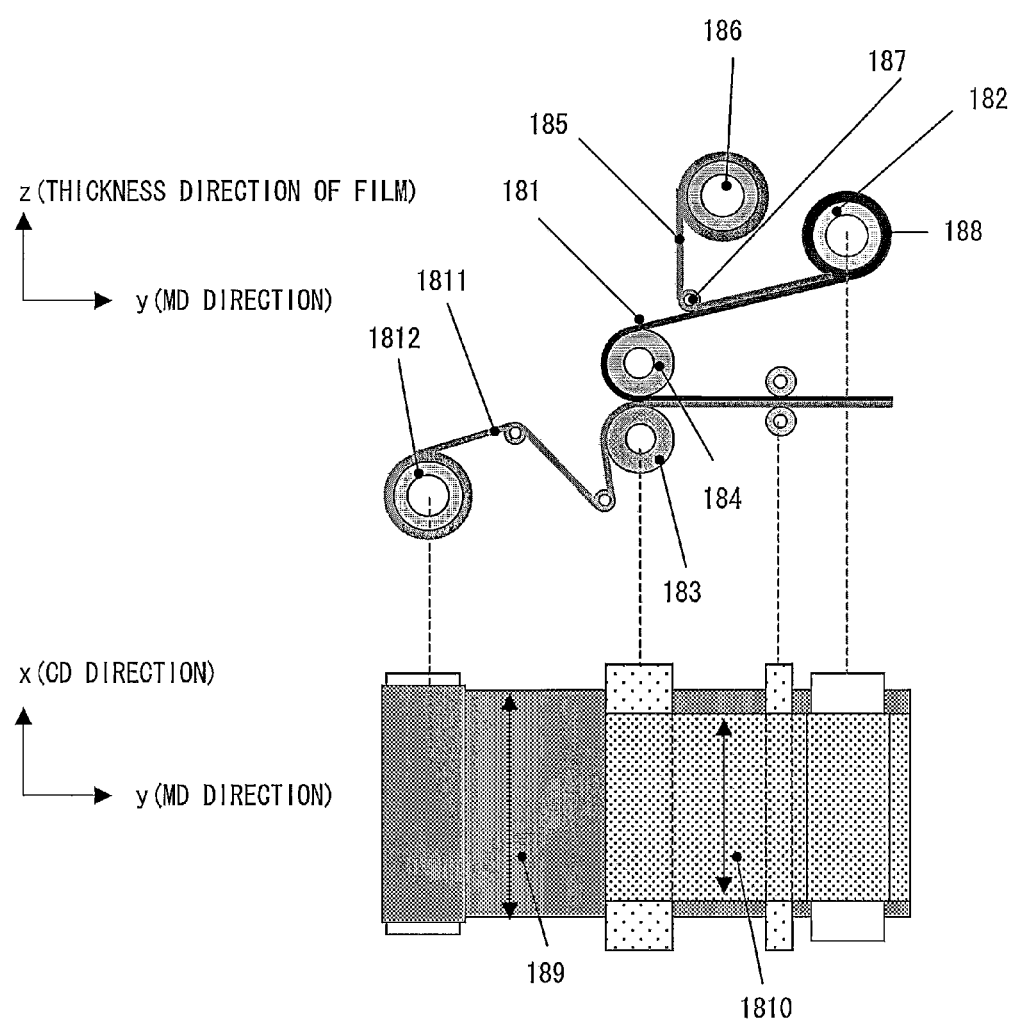
FIG. 18 is a view schematically illustrating how to carry out a laminating test.
Figure 19:
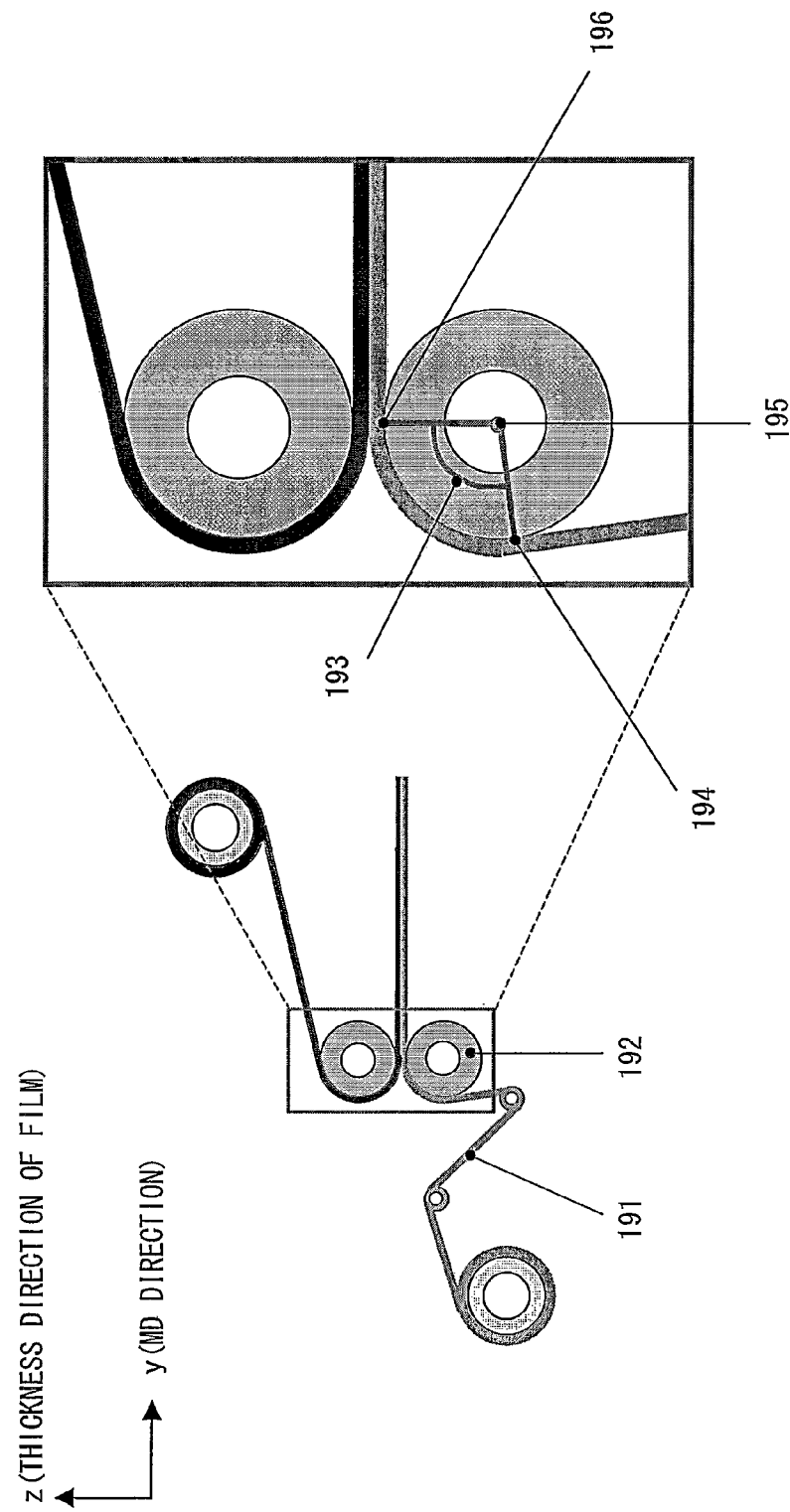
FIG. 19 is a view for explanation of an angle formed by (i) a line from (a start point of contact between a first roll and a graphite film) to (a central point of the first roll) and (ii) a line from (the central point of the first roll) to (a point of contact between the first roll and a second roll).

A laminating test was carried out as shown in FIG. 18. More specifically, a graphite film wound around a paper core having a diameter of 3 inches and being made from paper was continuously supplied to between the first roll having an outer diameter of 50 mm and a length of 635 mm and a second roll having the same size as the first roll, which rolls were arranged in parallel, so that an angle formed by (i) a point at which the graphite film started to contact with the first roll, (ii) a central point of the first roll, and (iii) a point of contact between the first roll and the second roll was 120° (FIG. 19). Then the graphite film was adhered to a copper foil tape having thickness of 10 μm and width of 150 mm. As the copper foil tape, E-1100LC manufactured by DIC was used. The copper foil tape was supplied to the second roll so that an angle formed by (i) a point at which the copper foil tape started to contact with the second roll, (ii) a central point of the second roll, and (iii) a point of contact of the first roll/the second roll was 120°. A tensile force applied to the graphite film in the MD direction was 30 g/cm and the rewinding speed was 1 m/min.

Figure 20:
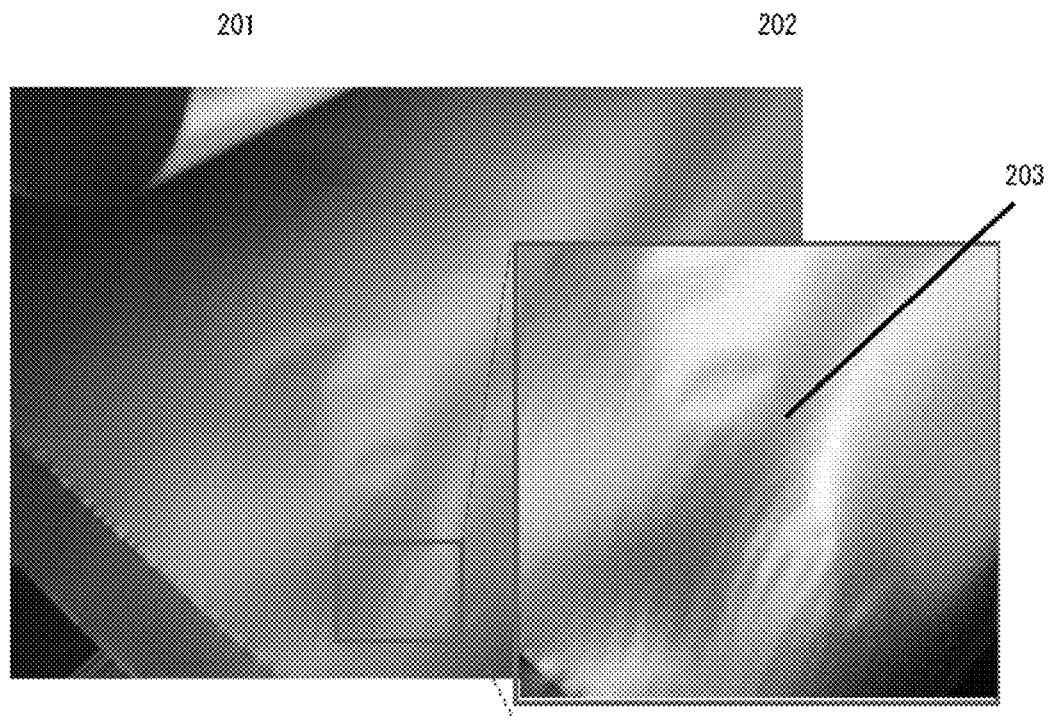
FIG. 20 is an overview image of lamination wrinkles on a graphite laminate film.

Wrinkles after the laminating test as shown in FIG. 20 were evaluated as follows. The number of wrinkles having a length of not less than 5 mm was counted over a whole region of the roll, and the number of wrinkles which could be found in a width direction was counted per unit length (1 m) in a longitudinal direction. The number of wrinkles found per meter in the whole width direction (widths of the graphite films in Examples, Comparative Examples, Reference Examples of the present invention were 450 mm) was 0 wrinkle/m, which was graded as A, more than 0 wrinkle/m but less than 0.05 wrinkle/m, which was graded as B, not less than 0.05 wrinkle/m but less than 0.2 wrinkle/m, which was graded as C, not less than 0.2 wrinkle/m but less than 1 wrinkle/m, which was graded as D, and not less than 1 wrinkle/m, which was graded as E.

<Rolling Property Evaluation>

Figure 21:
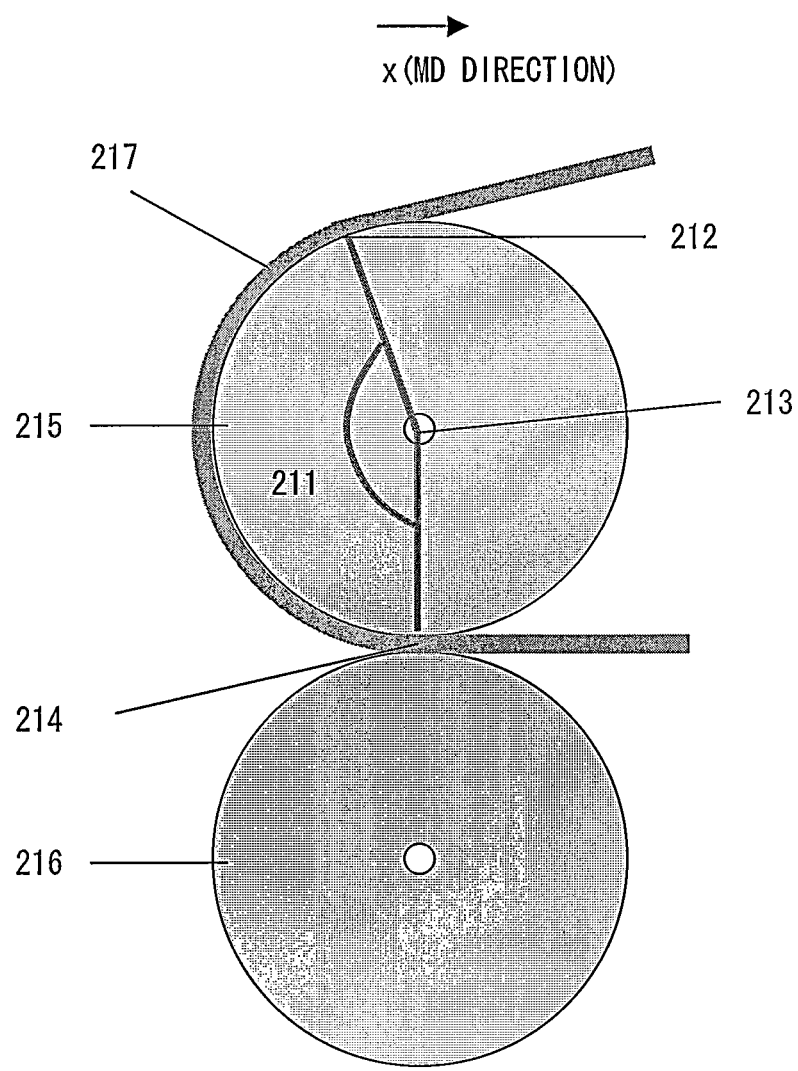
FIG. 21 is a view schematically illustrating how to carry out a rolling process.

A rolling property of the graphite film as shown in FIG. 21 was evaluated. More specifically, GS3 having 200 mm width×5 m was rolled with use of a 2-ton precision roll press (clearance type) manufactured by THANK-METAL CO., LTD. The 2-ton precision roll press includes a lower rolling roll which was a metal roll having diameter 200 mm×width 250 mm manufactured by SKD11 (greater than hardness of D95), and an upper rolling roll which was a urethane roll having diameter 200 mm×width 250 mm and hardness of D77. A clearance between the rolls was adjusted to have −200 μm and a tensile force of 30 g/cm was applied to the graphite film in the MD direction. The film was continuously supplied to between the upper rolling roll and the lower rolling roll so that an angle formed by (i) a point at which the graphite film started to contact with the upper rolling roll, (ii) a central point of the upper rolling roll, and (iii) a point of contact between the upper rolling roll and the lower rolling roll was 120° (FIG. 21). This supply of the film was carried out at a line speed of 2 m/min.

Figure 22:
FIG. 22 is an overview image of folded wrinkles which occurs on a graphite film during the rolling process.

Wrinkles after the rolling test as shown in FIG. 22 were evaluated as follows. The number of wrinkles having a length of not less than 5 mm was counted over a whole region of the roll, and the number of wrinkles which could be found in the width direction was counted per unit length (1 m) in the longitudinal direction. The number of wrinkles found per meter in the whole width direction (widths of the graphite films in Examples, Comparative Examples, Reference Examples of the present invention were 450 mm) was 0 wrinkle/m, which was graded as A, more than 0 wrinkle/m but less than 0.05 wrinkle/m, which was graded as B, not less than 0.05 wrinkle/m but less than 0.2 wrinkle/m, which was graded as C, not less than 0.2 wrinkle/m but less than 1 wrinkle/m, which was graded as D, and not less than 1 wrinkle/m, which was graded as E.

<Tear Evaluation>

Figure 23:
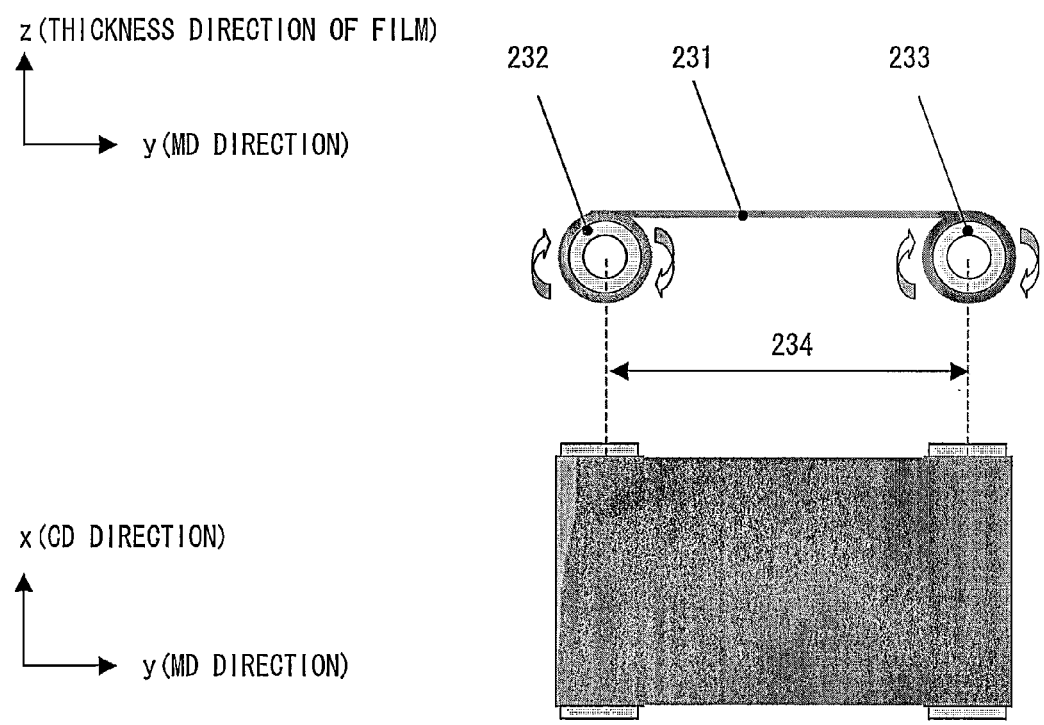
FIG. 23 is a view schematically illustrating how to carry out tear evaluation.

A rewinding test was carried out, and tears occurring in the rewinding test were evaluated. In the rewinding test, as shown in FIG. 23, a graphite film wound around a paper core having a diameter of 3 inches and being made from paper was rewound around another paper core having a diameter of 3 inches and being placed to be in parallel to the former paper core. The rewinding test was carried out while a distance between the paper cores was 300 mm. The rewinding test was carried out under the conditions that a tensile force applied to the graphite film in the MD direction was 30 g/cm and the rewinding speed was 1 m/min.

Figure 24:
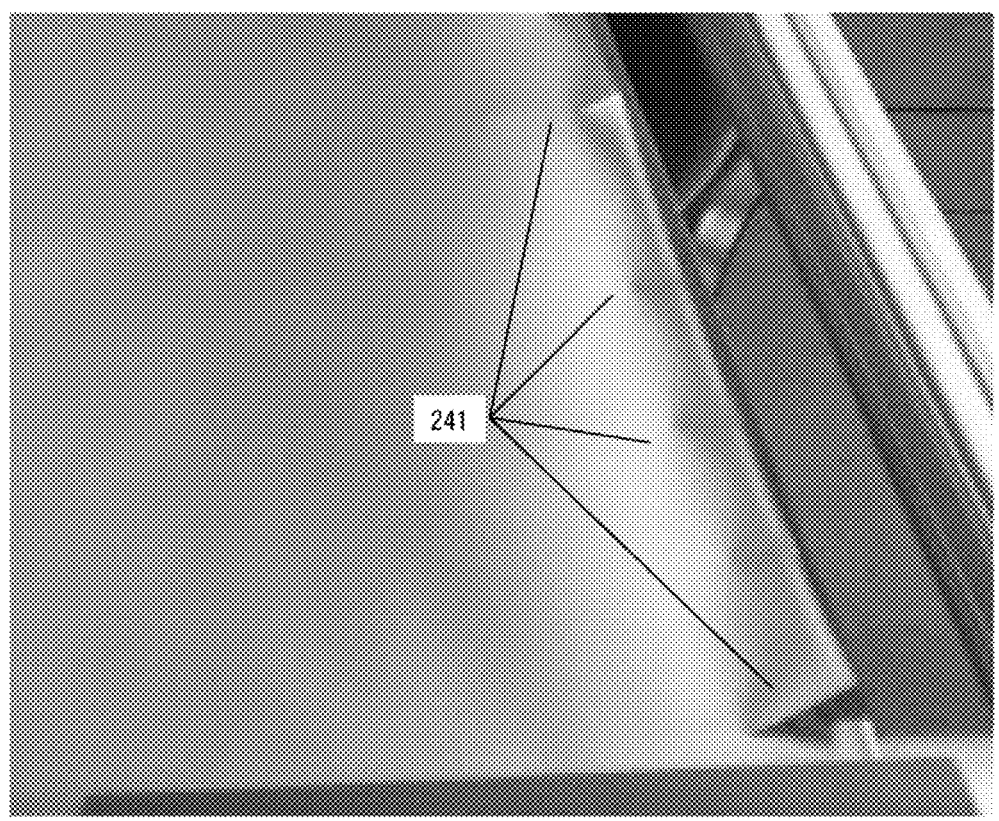
FIG. 24 is a view illustrating tears in a graphite film.

The following description will discuss a method of evaluating tears of the graphite film in the rewinding test. After completion of the rewinding test, the number of tears having a length of not less than 5 mm as shown in FIG. 24, which tears were found in a whole region of the film in the width direction, was counted per unit length (1 m) in the longitudinal direction. The number of tears found per meter in the whole width direction (widths of the graphite films in Examples, Comparative Examples, Reference Examples of the present invention were 450 mm) was 0 tear/m, which was graded as A, more than 0 tear/m but less than 0.05 tear/m, which was graded as B, not less than 0.05 tear/m but less than 0.2 tear/m, which was graded as C, not less than 0.2 tear/m but less than 1 tear/m, which was graded as D, and not less than 1 tear/m, which was graded as E.

<Evaluation of Bend Property>

A bend property was evaluated according to the measurement of bends as described in JIS C2151. Bends having not less than 30 mm were graded as A, bends having not less than 20 mm but less than 30 mm were graded as B, bends having not less than 15 mm but less than 20 mm were graded as C, bends having not less than 11 mm but less than 15 mm were graded as D, and bends having less than 11 mm were graded as E.

<Method of Producing Polyimide Film A>

To a DMF (dimethylformamide) solution in which 1 equivalent of 4,4'-oxydianiline was dissolved, 1 equivalent of pyromellitic dianhydride was dissolved to obtain a polyamic acid solution (18.5% by weight). While this solution was being cooled down, 1 equivalent of acetic anhydride and 1 equivalent of isoquinoline with respect to carboxylic acid groups contained in the polyamic acid, and an imidization catalyst containing DMF were added to the solution, and then the mixture was degassed.

A polyamide acid DMF solution prepared in a polymerization process was mixed with a curing agent (acetic anhydride and isoquinoline) in a given ratio with use of a blender, and the resulting mixture was continuously flown from a T-die to be applied onto the endless belt. Then, the mixture was dried up by hot air while the belt was being rotated. By heating this mixed varnish, dehydration occurs in its molecules, and an imidization reaction proceeded. The self-supporting film (gel film) whose remaining solvent ratio was approximately 46% at an outlet of a belt chamber due to evaporation of this solvent was stripped from the belt, and fixed in a pin frame. The film was subjected to heat treatment for 4 minutes in total at temperatures within the range from 300° C. to 580° C. In evaluation below, a polyimide film (product name: APICAL 200AV) manufactured by Kaneka Corporation, which was produced in the same way, was used as the polyimide film A having a thickness of 50 μm.

Example 1

Figure 25:
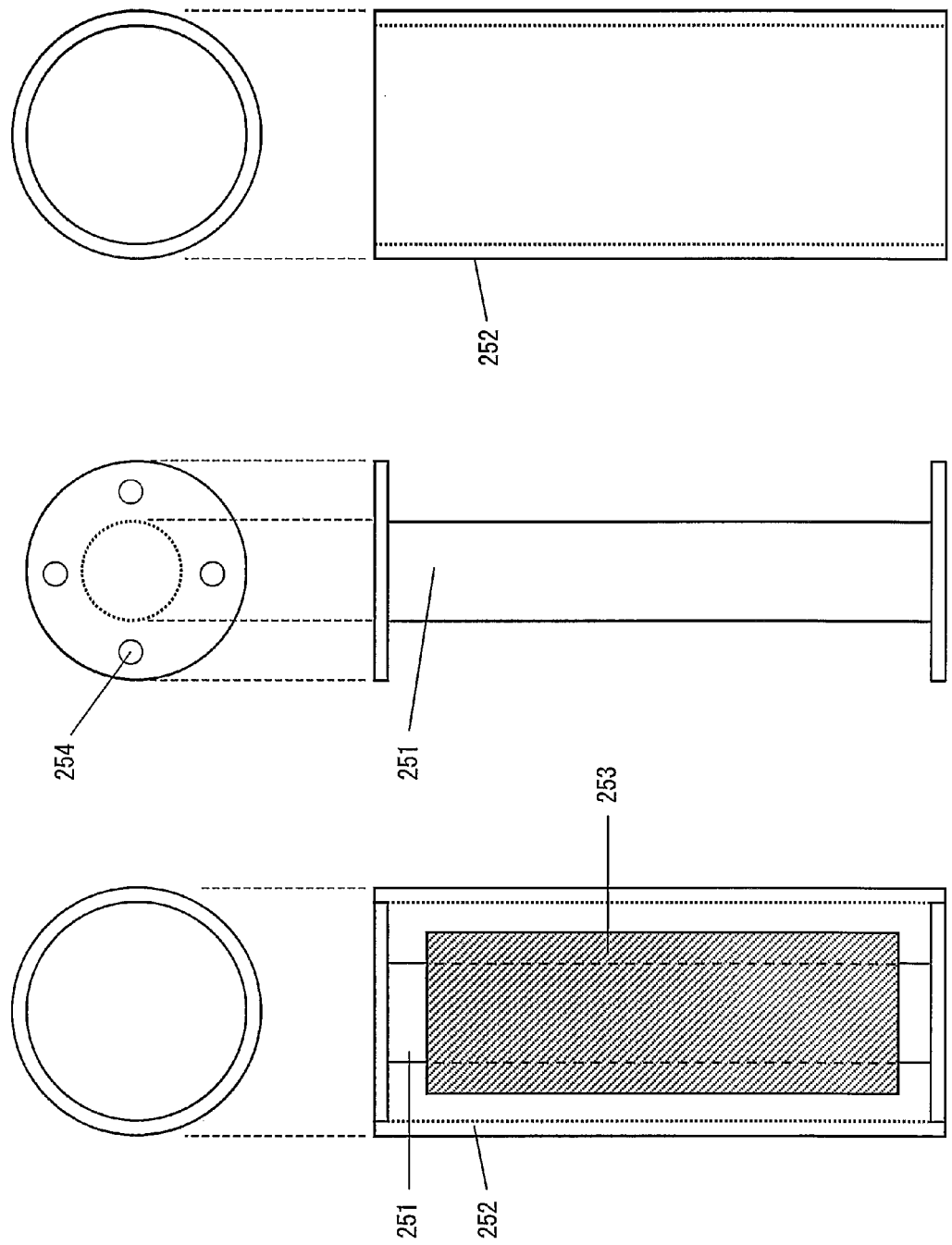
FIG. 25 is a view illustrating, as an example, a jig used in a carbonization process of the present invention.

A polyimide film A having a thickness of 50 μm, a width of 500 mm, and a length of 50 m was wounded around a cylindrical inner core having an outer diameter of 100 mm and a length of 550 mm and being made of graphite, as shown in FIG. 25, and was then covered with an outer cylinder having an inner diameter of 130 mm. This vessel was transversely set in an electric furnace. Carbonization was carried out under the conditions that a temperature was increased by 2° C./min until it reached 1400° C.

Figure 26:
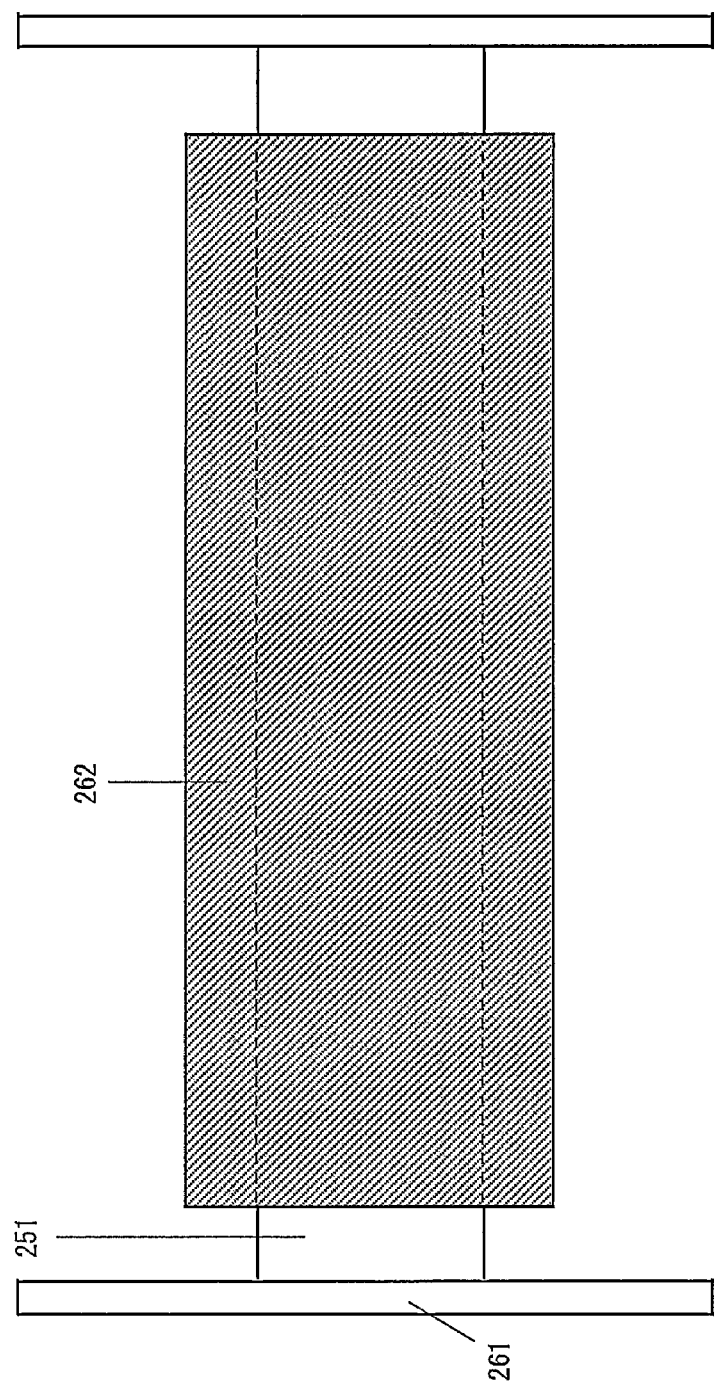
FIG. 26 is a view illustrating, as an example, a vessel which is transversely used during a graphitization process.

Next, as shown in FIG. 26, a resulting carbonized film in a roll-shape was transversely set to the inner core having an outer diameter of 100 mm in a graphitization furnace (at this time, the inner core was in a floating state by a support). A graphitization process was carried out until a temperature reached 2900° C. under condition of a temperature increase of 5° C./min, and, after that, a resulting film was cooled down to a room temperature. Various physical properties of the material graphite film obtained by the graphitization process were measured, and the results are shown in Table 1 to Table 3. Note that a graphite film, which has been subjected to the graphitization process but has not yet been subjected to a re-forming process, is referred to as "material graphite film". The material graphite film had the sag Zgs of 120 mm, the value "a" of 120 mm, the value "b" of 0 mm, the bend of less than 2 mm, the length of 45 m, and the width of 450 mm.

Next, the material graphite film thus obtained was adhered, with use of a double-sided tape to be fixed, to an inner core 1 which is made from a graphitized material (model number: MSG, coefficient of linear expansion: $4.0 \times 10^{-6}$/K) available from SEC CARBON, LIMITED and whose circumference in the middle was 314.00 mm, circumference at an edge 1 was 314.00 mm, and circumference at an edge 2 was 314.00 mm (the circumference in the middle, the circumference at the edge 1, and the circumference at the edge 2 were identical with one another). The material graphite film was then wounded while standing up so that edges of the material graphite film were neatly aligned as shown in FIG. 12. Thereafter, a torque of 4N·m was applied to a drive shaft so that the material graphite film was wound around the inner core tightly, while an outermost circumference of the material graphite film was being fixed unmovably. In this way, a rewinding process was carried out.

Furthermore, the material graphite film thus obtained was adhered, with use of a double-sided tape to be fixed, to an inner core 2 which was made from the same material as the inner core 1 and whose circumference in the middle was 314.83 mm, whose circumference at an edge 1 was 314.00 mm, and circumference at an edge 2 was 314.00 mm (the circumference in the middle had a maximum value and the circumference was gradually reduced toward the circumference at the edge 1 and toward the circumference at the edge 2). The material graphite film was then wound tightly around the inner core 2 in the same method until the length of the wound material graphite film reached 22.5 m.

Next, the material graphite film wound around the inner cores was transversely set in a graphitization furnace, and was subjected to a sag form re-forming process until a temperature reached 2900° C. under condition of temperature increase of 5° C./min. Thus, there was obtained a graphite film having two different sag forms, i.e., having (i) a part wound around the inner core 1, whose form had the sag Zgs of 3.5 mm, the value "a" of 3.5 mm, the value "b" of 0 mm, the bend of less than 2 mm, the length of 22.5 m, and the width of 450 mm and (ii) a part wound around the inner core 2, whose form had the sag Zgs of 50 mm, the value "a" of 0 mm, the value "b" of 50 mm, the bend of less than 2 mm, the length of 22.5 m, and the width of 450 mm. The various physical properties were measured. Results of the measurement are shown in Table 1 to Table 3.

Example 2

A graphite film was made in the same way as Example 1 except that an inner core 1 whose circumference in the middle was 314.00 mm, circumference at an edge 1 was 314.00 mm, and circumference at an edge 2 was 314.00 mm (the same outer circumference from the circumference at the edge 1 to the circumference at the edge 2) and an inner core whose circumference in the middle was 314.00 mm, circumference at an edge 1 was 314.83 mm, and circumference at an edge 2 was 314.83 mm (circumference in the middle had a minimum value, and the circumference was gradually increased toward the circumference at the edge 1 and toward the circumference at the edge 2) were used. Thus, there was obtained a graphite film having two different sag forms, i.e., having (i) a part wound around the inner core 1, whose form had the sag Zgs of 3.5 mm, the value "a" of 3.5 mm, the value "b" of 0 mm, the bend of less than 2 mm, the length of 22.5 m, and the width of 450 mm and (ii) a part wound around an inner core 2, whose form had the sag Zgs of 50 mm, the value "a" of 50 mm, the value "b" of 0 mm, the bend of less than 2 mm, the length of 22.5 m, and the width of 450 mm. Various physical properties were measured. Results of the measurement are shown in Table 1 to Table 3.

Example 3

A graphite film was made in the same way as Example 1 except that an inner core 1 whose circumference in the middle was 314.00 mm, circumference at an edge 1 was 314.00 mm, and circumference at an edge 2 was 314.00 mm (the same outer circumference from the circumference at the edge 1 to the circumference at the edge 2) and an inner core whose circumference in the middle was 314.42 mm, circumference at an edge 1 was 314.83 mm, and circumference at an edge 2 was 314.00 mm (the circumference at the edge 1 had a maximum value, and the circumference was gradually reduced toward the circumference in the middle and toward the circumference at the edge 2) were used. Thus, there was obtained a graphite film having two different sag forms, i.e., having (i) a part wound around the inner core 1, whose form had the sag Zgs of 3.5 mm, the value "a" of 3.5 mm, the value "b" of 0 mm, the bend of less than 2 mm, the length of 22.5 m, the width of 450 mm and (ii) a part wound around the inner core 2, whose form had the sag Zgs of 50 mm, the value "a" of 25 mm, the value "b" of 25 mm, the bend of 30 mm, the length of 22.5 m, and the width of 450 mm. Various physical properties were measured. Results of the measurement are shown in Table 1 to Table 3.

Example 4

A graphite film was made in the same way as Example 1 except that an inner core 1 whose circumference in the middle was 314.83 mm, circumference at an edge 1 was 314.00 mm, and circumference at an edge 2 was 314.00 mm (the circumference in the middle had a maximum value, and the circumference was gradually increased toward the circumference at the edge 1 and toward the circumference at the edge 2) and an inner core 2 whose circumference in the middle was 314.00 mm, circumference at an edge 1 was 314.83 mm, and circumference at an edge 2 was 314.83 mm (circumference in the middle had a minimum value, and the circumference was gradually increased toward the circumference at the edge 1 and toward the circumference at the edge 2) were used. Thus, there was obtained a graphite film having two different sag forms, i.e., having (i) a part wound around the inner core 1, whose form had the sag Zgs of 50 mm, the value "a" of 0 mm, the value "b" of 50 mm, the bend of less than 2 mm, the length of 22.5 m, and the width of 450 mm and (ii) a part wound around the inner core 2, whose form had the sag Zgs of 50 mm, the value "a" of 50 mm, the value "b" of 0 mm, the bend of less than 2 mm, the length of 22.5 m, and the width of 450 mm. Various physical properties were measured. Results of the measurement are shown in Table 1 to Table 3.

Example 5

A graphite film was made in the same way as Example 1 except that an inner core 1 whose circumference in the middle was 314.83 mm, circumference at an edge 1 was 314.00 mm, and circumference at an edge 2 was 314.00 mm (the circumference in the middle had a maximum value, and the circumference was gradually reduced toward the circumference at the edge 1 and toward the circumference at the edge 2) and an inner core 2 whose circumference in the middle was 314.42 mm, circumference at an edge 1 was 314.83 mm, and circumference at an edge 2 was 314.00 mm (the circumference at the edge 1 had a maximum value, and the circumference was gradually reduced toward the circumference in the middle and toward the circumference at the edge 2) were used. Thus, there was obtained a graphite film having two different sag forms, i.e., having (i) a part wound around the inner core 1, whose form had the sag Zgs of 50 mm, the value "a" of 0 mm, the value "b" of 50 mm, the bend of less than 2 mm, the length of 22.5 m, and the width of 450 mm and (ii) a part wound around the inner core 2, whose form had the sag Zgs of 50 mm, the value "a" of 25 mm, the value "b" of 25 mm, the bend of 30 mm, the length of 22.5 m, and the width of 450 mm. Various physical properties were measured. Results of the measurement are shown in Table 1 to Table 3.

Example 6

A graphite film was made in the same way as Example 1 except that an inner core 1 whose circumference in the middle is 314.00 mm, circumference at an edge 1 is 314.83 mm, and circumference at an edge 2 is 314.83 mm (the circumference in the middle had a minimum value, and the circumference was gradually increased toward the circumference at the edge 1 and toward the circumference at the edge 2) and an inner core 2 whose circumference in the middle was 314.42 mm, circumference at an edge 1 was 314.83 mm, and circumference at an edge 2 was 314.00 mm (the circumference at the edge 1 had a maximum value, and the circumference was gradually reduced toward the circumference in the middle and the circumference at the edge 2) were used. Thus, there was obtained a graphite film having two different sag forms, i.e., having (i) a part wound around the inner core 1, whose form had the sag Zgs of 50 mm, the value "a" of 50 mm, the value "b" of 0 mm, the bend of less than 2 mm, the length of 22.5 m, and the width of 450 mm and (ii) a part wound around the inner core 2, whose form had the sag Zgs of 50 mm, the value "a" of 25 mm, the value "b" of 25 mm, the bend of 30 mm, the length of 22.5 m, and the width of 450 mm. Various physical properties were measured. Results of the measurement are shown in Table 1 to Table 3.

Comparative Example 1

The carbonization process and the graphitization process were carried out in the same way as Example 1. There was obtained a graphite film having the sag Zgs of 120 mm, the value "a" of 120 mm, the value "b" of 0 mm, the bend of less than 2 mm, the length of 45 m, and the width of 450 mm. Various physical properties were measured. Results of the measurement are shown in Table 1 to Table 3.

Comparative Example 2

This example was carried out in the same way as Example 1 except that a maximum temperature of the sag form reforming process was set to 1800° C. Thus, there was obtained a graphite film having parts wound around the inner cores 1 and 2, each form of which had the sag Zgs of 120 mm, the value "a" of 120 mm, the value "b" of 0 mm, the bend of less than 2 mm, the length of 22.5 m, and the width of 450 mm. Various physical properties were measured. Results of the measurement are shown in Table 1 to Table 3.

Reference Example 1

A graphite film was made in the same way as Example 1 except that an inner core 1 whose circumference in the middle was 314.00 mm, circumference at an edge 1 was 314.00 mm, circumference at an edge 2 was 314.00 mm (the same outer circumference from the circumference at the edge 1 to the circumference at the edge 2) and an inner core 2 whose circumference in the middle was 314.00 mm, circumference at an edge 1 was 314.00 mm, and circumference at an edge 2 was 314.00 mm (the same outer circumference from the circumference at the edge 1 to the circumference at the edge 2) were used. Thus, there was obtained a graphite film having parts wound around the inner cores 1 and 2, each form of which had the sag Zgs of 3.5 mm, the value "a" of 3.5 mm, the value "b" of 0 mm, the bend of less than 2 mm, the length of 22.5 m, and the width of 450 mm. Various physical properties were measured. Results of the measurement are shown in Table 1 to Table 3.

Reference Example 2

A graphite film was made in the same way as Example 1 except that an inner core 1 whose circumference in the middle was 314.83 mm, circumference at an edge 1 was 314.00 mm, and circumference at an edge 2 was 314.00 mm (the circumference in the middle had a maximum value and the circumference was gradually reduced toward the circumference at the edge 1 and toward the circumference at the edge 2) and an inner core 2 whose circumference in the middle was 314.83 mm, circumference at an edge 1 was 314.00 mm, and circumference at an edge 2 was 314.00 mm (the circumference in the middle had a maximum value and the circumference was gradually reduced toward the circumference at the edge 1 and toward the circumference at the edge 2) were used. Thus, there was obtained a graphite film having parts wound around the inner cores 1 and 2, each form of which had the sag Zgs of 50 mm, the value "a" of 0 mm, the value "b" of 50 mm, the bend of less than 2 mm, the length of 22.5 m, and the width of 450 mm. Various physical properties were measured. Results of the measurement are shown in Table 1 to Table 3.

Reference Example 3

A graphite film was made in the same way as Example 1 except that an inner core 1 whose circumference in the middle was 314.00 mm, circumference at an edge 1 was 314.83 mm, circumference at an edge 2 was 314.83 mm (the circumference in the middle had a minimum value and the circumference was gradually increased toward the circumference at the edge 1 and toward the circumference at the edge 2) and an inner core 2 whose circumference in the middle was 314.00 mm, circumference at an edge 1 was 314.83 mm, and circumference at an edge 2 was 314.83 mm (the circumference in the middle had a minimum value and the circumference was gradually increased toward the circumference at the edge 1 and toward the circumference at the edge 2) were used. Thus, there was obtained a graphite film having parts wound around the inner cores 1 and 2, each form of which had the sag Zgs of 50 mm, the value "a" of 50 mm, the value "b" of 0 mm, the bend of less than 2 mm, the length of 22.5 m, and the width of 450 mm. Various physical properties were measured. Results of the measurement are shown in Table 1 to Table 3.

Reference Example 4

A graphite film was made in the same way as Example 1 except that an inner core 1 whose circumference in the middle was 314.42 mm, circumference at an edge 1 is 314.83 mm, and circumference at an edge 2 is 314.00 mm (the circumference at the edge 1 had a maximum value and the circumference was gradually reduced toward the circumference in the middle and toward the circumference at the edge 2) and an inner core 2 whose circumference in the middle was 314.42 mm, circumference at an edge 1 was 314.83 mm, and circumference at an edge 2 was 314.00 mm (the circumference at the edge 1 had a maximum value and the circumference was gradually reduced toward the circumference in the middle and toward the circumference at the edge 2) were used. Thus, there was obtained a graphite film having parts wound around the inner cores 1 and 2, each form of which had the sag Zgs of 50 mm, the value "a" of 25 mm, the value "b" of 25 mm, the bend of 30 mm, the length of 22.5 m, the width of 450 mm. Various physical properties were measured. Results of the measurement are shown in Table 1 to Table 3.

Example 7

The graphite film (graphite film having continuous both-edge sag) obtained in Reference Example 3 was adhered as a material graphite film (material graphite film having the sag Zgs of 50 mm, the value "a" of 50 mm, the value "b" of 0 mm, the bend of less than 2 mm, the length of 45 m, the width of 450 mm) to an inner core 1 whose circumference in the middle was 314.00 mm, circumference at an edge 1 was 314.00 mm, circumference at an edge 2 was 314.00 mm (the same outer circumference from the circumference at the edge 1 to the circumference at the edge 2) with use of a double-sided tape to fix the graphite film. The material graphite film was wound around the inner core 1 while standing up so that edges of the material graphite film were neatly aligned as shown in FIG. 12. Thereafter, a torque of 4N·m was applied to a drive shaft so that the material graphite film was wound tightly around the inner core, while an outermost circumference of the material graphite film was being fixed unmovably. In this way, a rewinding process was carried out. Furthermore, the graphite film obtained in Reference Example 3 was adhered as a material graphite film to the inner core 2 which was made from the same material as the inner core 1 and had a circumference in the middle of 314.83 mm, a circumference at an edge 1 of 314.00 mm, a circumference at an edge 2 of 314.00 mm (the circumference in the middle was a maximum value and was gradually reduced toward the circumference at the edge 1 and toward the circumference at the edge 2) with use of a double-sided tape to fix the graphite film, and was then wound tightly in the same method until the length thereof became 20.0 m. Then, a graphite film was prepared in the same way as Example 1 except that (i) the material graphite film was untied until the length of the graphite film wound around the inner core 1 became 20.0 m and (ii) a region which was not wound around the inner cores 1 and 2 was 5 m as shown in FIG. 28. Thus, there was obtained a graphite film having three different types of sag, i.e., having (i) a part wound around the inner core 1, whose form had the sag Zgs of 3.5 mm, the value "a" of 3.5 mm, the value "b" of 0 mm, the bend of less than 2 mm, the length of 20.0 m, and the width of 450 mm, (ii) a part wound around the inner core 2, whose form had the sag Zgs of 50 mm, the value "a" of 0 mm, the value "b" of 50 mm, the bend of less than 2 mm, the length of 20.0 m, and the width of 450 mm, and (iii) a part which was not wound around any inner cores, whose form had the sag Zgs of 50 mm, the value "a" of 50 mm, the value "b" of 0 mm, the bend of less than 2 mm, the length of 5.0 m, and the width of 450 mm (flat in a part wound around the inner core 1→both-edge sag in a part which was not wound around the inner core→middle sag in a part wound around the inner core 2). Various physical properties were measured. Results of the measurement are shown in Table 1 to Table 3.

Example 8

The graphite film (graphite film having continuous both-edge sag) obtained in Reference Example 3 was adhered as a material graphite film (material graphite film having the sag Zgs of 50 mm, the value "a" of 50 mm, the value "b" of 0 mm, the bend of less than 2 mm, the length of 45 m, and the width of 450 mm) to the inner core 1 having a circumference in the middle of 314.00 mm, a circumference at an edge 1 of 314.00 mm, a circumference at an edge 2 of 314.00 mm (the same outer circumference from the circumference at the edge 1 to the circumference at the edge 2) with use of a double-sided tape to fix the graphite film. Then, 22.5 m of the graphite film was wound while standing up so that edges of the graphite film were neatly aligned as shown in FIG. 12. Thereafter, a torque of 4N·m was applied to a drive shaft so that the material graphite film was wound tightly around the inner core, while an outermost circumference of the material graphite film was being fixed unmovably. In this way, a rewinding process was carried out.

Then, a graphite film was prepared in the same way as Example 1 except that a region which was not wound around the inner core 1 was wound cylindrically without using an inner core as shown in FIG. 29. Thus, there was obtained a graphite film having two different types of sag, i.e., having (i) a part wound around the inner core 1, whose form had the sag Zgs of 3.5 mm, the value "a" of 3.5 mm, the value "b" of 0 mm, the bend of less than 2 mm, the length of 22.5 m, and the width of 450 mm and (ii) a part which was not wound around the inner core, whose form had the sag Zgs of 50 mm, the value "a" of 50 mm, the value "b" of 0 mm, the bend of less than 2 mm, the length of 22.5 m, and the width of 450 mm (flat in a part which was wound around the inner core 1 both-edge sag in a part which was not wound around the inner core). Various physical properties were measured. Results of the measurement are shown in Table 1 to Table 3.

TABLE 1

| | Properties of Material Graphite Film | | | | | | |
|---|---|---|---|---|---|---|---|
| | Sag Zgs mm | Value "a" mm | Value "b" mm | Bend mm | Thermal diffusivity cm$^2$/s | Length m | Form evaluation |
| Example 1 | 120 | 120 | 0 | <2 | 8.300 | 45 | No control |
| Example 2 | 120 | 120 | 0 | <2 | 8.300 | 45 | No control |
| Example 3 | 120 | 120 | 0 | <2 | 8.300 | 45 | No control |
| Example 4 | 120 | 120 | 0 | <2 | 8.300 | 45 | No control |
| Example 5 | 120 | 120 | 0 | <2 | 8.300 | 45 | No control |
| Example 6 | 120 | 120 | 0 | <2 | 8.300 | 45 | No control |
| Example 7 | 50 | 50 | 0 | <2 | 8.500 | 45 | Both-edge sag |
| Example 8 | 50 | 50 | 0 | <2 | 8.500 | 45 | Both-edge sag |
| Comparative Example 1 | 120 | 120 | 0 | <2 | 8.300 | 45 | No control |
| Comparative Example 2 | 120 | 120 | 0 | <2 | 8.300 | 45 | No control |
| Reference Example 1 | 120 | 120 | 0 | <2 | 8.300 | 45 | No control |
| Reference Example 2 | 120 | 120 | 0 | <2 | 8.300 | 45 | No control |
| Reference Example 3 | 120 | 120 | 0 | <2 | 8.300 | 45 | No control |
| Reference Example 4 | 120 | 120 | 0 | <2 | 8.300 | 45 | No control |

TABLE 2

| | Conditions of rewinding process | | | | | | | | |
|---|---|---|---|---|---|---|---|---|---|
| | | | Wound | | Inner core 1 | | | | |
| | Torque N·m | Winding Strength N·m/m | longitudinally or transversely | Type | Material | Linear expansion ×10$^{-6}$/K | O.C. in middle mm | O.C. of edge 1 mm | O.C. of edge 2 mm | Difference between O.C.s % |
| Ex. 1 | 4 | 220 | Longitudinally | Cy | MSG | 4.00 | 314.00 | 314.00 | 314.00 | 0.00 |
| Ex. 2 | 4 | 220 | Longitudinally | Cy | MSG | 4.00 | 314.00 | 314.00 | 314.00 | 0.00 |
| Ex. 3 | 4 | 220 | Longitudinally | Cy | MSG | 4.00 | 314.00 | 314.00 | 314.00 | 0.00 |

TABLE 2-continued

| | | | | | | | | | | | |
|---|---|---|---|---|---|---|---|---|---|---|---|
| Ex. 4 | 4 | 220 | Longitudinally | Cy | MSG | 4.00 | 314.83 | 314.00 | 314.00 | 0.27 | |
| Ex. 5 | 4 | 220 | Longitudinally | Cy | MSG | 4.00 | 314.83 | 314.00 | 314.00 | 0.27 | |
| Ex. 6 | 4 | 220 | Longitudinally | Cy | MSG | 4.00 | 314.00 | 314.83 | 314.83 | 0.27 | |
| Ex. 7 | 4 | 220 | Longitudinally | Cy | MSG | 4.00 | 314.00 | 314.00 | 314.00 | 0.00 | |
| Ex. 8 | 4 | 220 | Longitudinally | Cy | MSG | 4.00 | 314.00 | 314.00 | 314.00 | 0.00 | |
| Co. Ex. 1 | | | | | | — | | | | | |
| Co. Ex. 2 | 4 | 220 | Longitudinally | Cy | MSG | 4.00 | 314.00 | 314.00 | 314.00 | 0.00 | |
| Re. Ex. 1 | 4 | 220 | Longitudinally | Cy | MSG | 4.00 | 314.00 | 314.00 | 314.00 | 0.00 | |
| Re. Ex. 2 | 4 | 220 | Longitudinally | Cy | MSG | 4.00 | 314.83 | 314.00 | 314.00 | 0.27 | |
| Re. Ex. 3 | 4 | 220 | Longitudinally | Cy | MSG | 4.00 | 314.00 | 314.83 | 314.83 | 0.27 | |
| Re. Ex. 4 | 4 | 220 | Longitudinally | Cy | MSG | 4.00 | 314.42 | 314.83 | 314.00 | 0.27 | |

| | | | Conditions of rewinding process | | | | | | |
|---|---|---|---|---|---|---|---|---|---|
| | | | Inner core 2 | | | | | | |
| | Type | Material | Linear expansion ×10⁻⁶/K | O.C. in middle mm | O.C. of edge 1 mm | O.C. of edge 2 mm | Difference between O.C.s % | Start temp °C | Max temp °C | Placed vertically or transversely |
| Ex. 1 | Cy | MSG | 4.00 | 314.83 | 314.00 | 314.00 | 0.27 | 23 | 2900 | Tr |
| Ex. 2 | Cy | MSG | 4.00 | 314.00 | 314.83 | 314.83 | 0.27 | 23 | 2900 | Tr |
| Ex. 3 | Cy | MSG | 4.00 | 314.42 | 314.83 | 314.00 | 0.27 | 23 | 2900 | Tr |
| Ex. 4 | Cy | MSG | 4.00 | 314.00 | 314.83 | 314.83 | 0.27 | 23 | 2900 | Tr |
| Ex. 5 | Cy | MSG | 4.00 | 314.42 | 314.83 | 314.00 | 0.27 | 23 | 2900 | Tr |
| Ex. 6 | Cy | MSG | 4.00 | 314.42 | 314.83 | 314.00 | 0.27 | 23 | 2900 | Tr |
| Ex. 7 | Cy | MSG | 4.00 | 314.83 | 314.00 | 314.00 | 0.27 | 23 | 2900 | Tr |
| Ex. 8 | | | Wound cylindrically without inner core | | | | | 23 | 2900 | Tr |
| Co. Ex. 1 | — | | | | | | — | | | |
| Co. Ex. 2 | Cy | MSG | 4.00 | 314.83 | 314.00 | 314.00 | 0.27 | 23 | 1800 | Tr |
| Re. Ex. 1 | Cy | MSG | 4.00 | 314.00 | 314.00 | 314.00 | 0.00 | 23 | 2900 | Tr |
| Re. Ex. 2 | Cy | MSG | 4.00 | 314.83 | 314.00 | 314.00 | 0.27 | 23 | 2900 | Tr |
| Re. Ex. 3 | Cy | MSG | 4.00 | 314.00 | 314.83 | 314.83 | 0.27 | 23 | 2900 | Tr |
| Re. Ex. 4 | Cy | MSG | 4.00 | 314.42 | 314.83 | 314.00 | 0.27 | 23 | 2900 | Tr |

Abbreviations
* Ex. stands for "Example", Co. Ex. stands for "Comparative Example", and Re. Ex. stands for "Reference Example"
* Cy stands for "cylindrical."
* O.C. stands for "outer circumference"
* Temp. stands for "temperature"
* Tr stands for "transversely"

TABLE 3

Properties of Material Graphite Film

| | Inner core 1 side | | | | | | | Inner core 2 side | | | | | | | | |
|---|---|---|---|---|---|---|---|---|---|---|---|---|---|---|---|---|
| | Sag Zgs mm | Value "a" mm | Value "b" mm | Bend mm | Length m | Form evaluation | Various evaluations | Sag Zgs mm | Value "a" mm | Value "b" mm | Bend mm | Length m | Form evaluation | Various evaluations | MIT Times | Thermal diffusivity cm²/s |
| Ex. 1 | 3.5 | 3.5 | 0 | <2 | 22.5 | Flat | Copper foil A | 50 | 0 | 50 | <2 | 22.5 | Middle sag | Rolling A | >10000 | 8.5 |
| Ex. 2 | 3.5 | 3.5 | 0 | <2 | 22.5 | Flat | Copper foil A | 50 | 50 | 0 | <2 | 22.5 | Both-edge sag | Rewinding A | >10000 | 8.5 |
| Ex. 3 | 3.5 | 3.5 | 0 | <2 | 22.5 | Flat | Copper foil A | 50 | 25 | 25 | 30 | 22.5 | One-edge sag | Curved surface A | >10000 | 8.5 |

TABLE 3-continued

Properties of Material Graphite Film

| | Inner core 1 side | | | | | | | Inner core 2 side | | | | | | | | |
|---|---|---|---|---|---|---|---|---|---|---|---|---|---|---|---|---|
| | Sag Zgs mm | Value "a" mm | Value "b" mm | Bend mm | Length m | Form evaluation | Various evaluations | Sag Zgs mm | Value "a" mm | Value "b" mm | Bend mm | Length m | Form evaluation | Various evaluations | MIT Times | Thermal diffusivity cm²/s |
| Ex. 4 | 50 | 0 | 50 | <2 | 22.5 | Middle sag | Rolling A | 50 | 50 | 0 | <2 | 22.5 | Both-edge sag | Rewinding A | >10000 | 8.5 |
| Ex. 5 | 50 | 0 | 50 | <2 | 22.5 | Middle sag | Rolling A | 50 | 25 | 25 | 30 | 22.5 | One-edge sag | Curved surface A | >10000 | 8.5 |
| Ex. 6 | 50 | 50 | 0 | <2 | 22.5 | Both-edge sag | Rewinding A | 50 | 25 | 25 | 30 | 22.5 | One-edge sag | Curved surface A | >10000 | 8.5 |
| Ex. 7 | 3.5 | 3.5 | 0 | <2 | 20.0 | Flat | Copper foil A | 50 | 0 | 50 | <2 | 20.0 | Middle sag | Rolling A | >10000 | 8.5 |
| | Range in which inner core is not used | | | | | | | 50 | 50 | 0 | <2 | 5.0 | Both-edge sag | Rewinding A | | |
| Ex. 8 | 3.5 | 3.5 | 0 | <2 | 22.5 | Flat | Copper foil A | — | | | | | | | >10000 | 8.5 |
| | Range in which inner core is not used | | | | | | | 50 | 50 | 0 | <2 | 5.0 | Both-edge sag | Rewinding A | | |
| Co. Ex. 1 | 120 | 120 | 0 | <2 | 22.5 | No control | All items E | 120 | 120 | 0 | <2 | 22.5 | No control | All items E | >10000 | 8.5 |
| Co. Ex. 2 | 120 | 120 | 0 | <2 | 22.5 | No control | All items E | 120 | 120 | 0 | <2 | 22.5 | No control | All items E | >10000 | 8.3 |
| Re. Ex. 1 | 3.5 | 3.5 | 0 | <2 | 22.5 | Flat | Copper foil A | 3.5 | 3.5 | 0 | <2 | 22.5 | Flat | Copper foil A | >10000 | 8.5 |
| Re. Ex. 2 | 50 | 0 | 50 | <2 | 22.5 | Middle sag | Rolling A | 50 | 0 | 50 | <2 | 22.5 | Middle sag | Rolling A | >10000 | 8.5 |
| Re. Ex. 3 | 50 | 50 | 0 | <2 | 22.5 | Both-edge sag | Rewinding A | 50 | 50 | 0 | <2 | 22.5 | Both-edge sag | Rewinding A | >10000 | 8.5 |
| Re. Ex. 4 | 50 | 25 | 25 | 30 | 22.5 | One-edge sag | Curved surface A | 50 | 25 | 25 | 30 | 22.5 | One-edge sag | Curved surface A | >10000 | 8.5 |

*Abbreviations
* Ex. stands for "Example", Co. Ex. stands for "Comparative Example", and Re. Ex. stands for "Reference Example"

<Effect of Sag Form Re-Forming Process>

As shown in Table 1 to Table 3, since the sag could not be controlled in Comparative Example 1, the graphite film having the Zgs of 120 mm was obtained. Meanwhile, in Reference Examples 1 to 4 in which the sag control process was carried out, it was possible to produce the graphite film having flat sag, the graphite film having sag in the middle, the graphite film having sag at its both edges, and the graphite film having sag at its one edge. This is because, due to a difference in thermal expansion between the inner core and the material graphite film wound around the inner core, the material graphite film was expanded outward by the inner core in the heat treatment process, and therefore the film was re-formed. Further, in Examples 1 to 8, the graphite films having two or more sag forms in a single sheet could be obtained.

Comparative Example 1 received the evaluation E, i.e., was extremely bad in all evaluations. Meanwhile, the parts in Examples 1 to 3, 7, 8 whose forms were evaluated as flat and the graphite film in Reference Example 1 were evaluated as "A" in the laminating property evaluation with a copper foil tape, i.e., were excessively excellent. Further, parts of the graphite films in Examples 1, 4, 5, 7 which were evaluated that the parts had middle sag and the graphite film of Reference Example 2 were evaluated as "A" in the rolling property evaluation, which were extremely excellent. Further, parts of the graphite films in Examples 2, 4, 6, 7, 8 which were evaluated that the parts had both-edge sag and the graphite film of Reference Example 3 were evaluated as "A" in the tear evaluation, which were extremely excellent. Furthermore, parts of the graphite films in Example 3, 5, 6 which were evaluated that the parts had one-edge sag and the graphite film of Reference Example 4 were evaluated as "A" in the bend property evaluation, which were extremely excellent. As described above, it was found that the graphite films in Examples 1 to 8, whose sag had been controlled, were extremely prior in various evaluations to that in Comparative Example 1, whose sag had not been controlled. It was also found that the films of Examples 1 to 8 had extremely high efficiency because each of the films had, in a single sheet, two or more sag forms that brought about effects in various evaluations.

<Maximum Temperature in Sag Form Re-Forming Process>

Comparing Example 1 and Comparative Example 2, sag could be controlled better as a maximum temperature in the sag form re-forming process became higher. This is because, as the maximum temperature in the sag form re-forming process became higher, a difference in expansion amount between the inner core and the material graphite film wound around the inner core became larger, which resulted in re-forming the material graphite film more strongly. This is also because, as the temperature became higher, graphite crystallites were rearranged more actively.

Example 9

Figure 30:
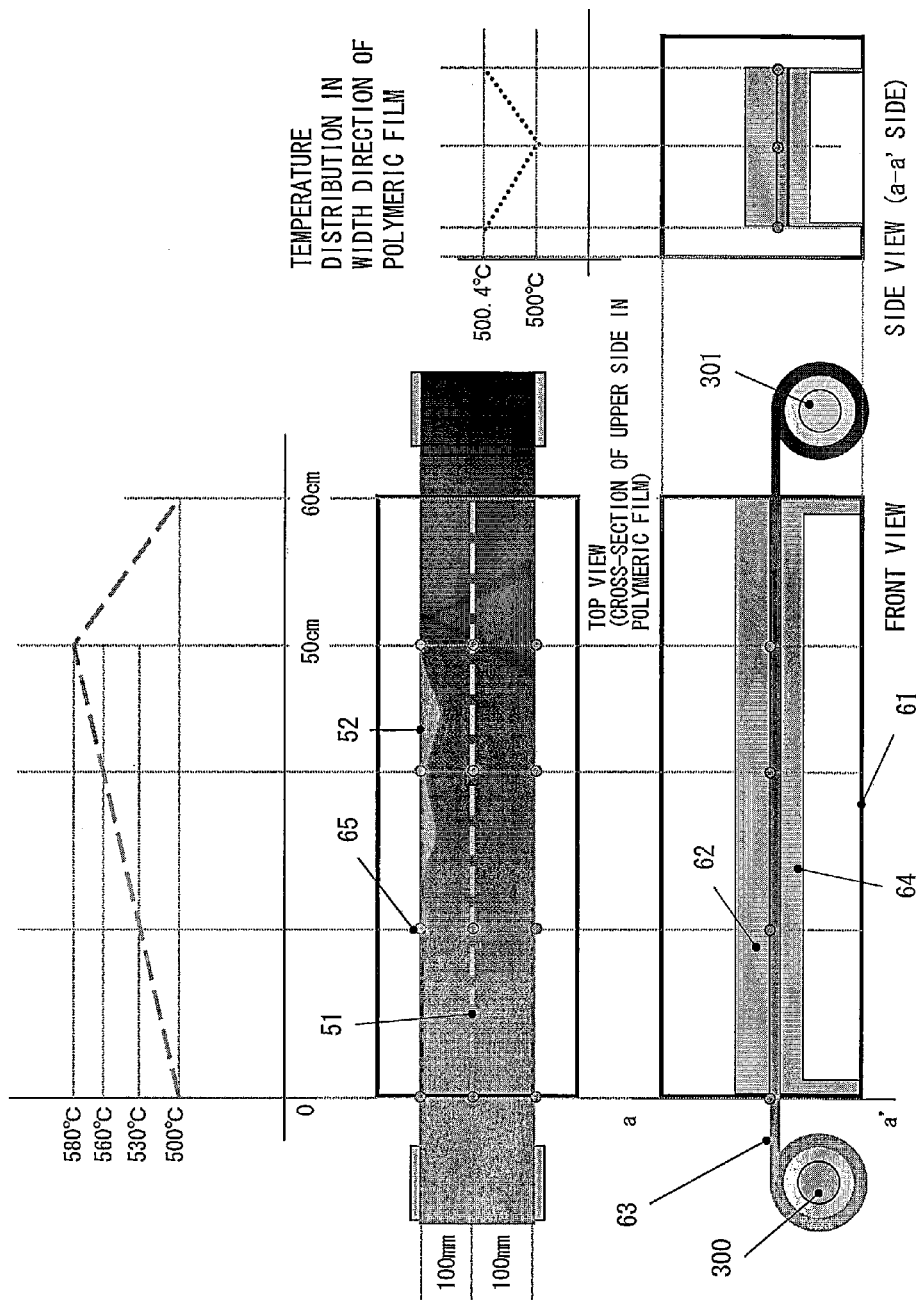
FIG. 30 is a view schematically illustrating a long continuous method in which sags of a long graphite film are continuously controlled.

A polyimide film (double refraction of 0.14, the thickness of 75 μm, the width of 200 mm, the length of 50 m): APICAL NPI produced by Kaneka Corporation, which was employed as a polymeric film, was set on a rewinding device as shown in FIG. 30. The polyimide film was subjected to the sag control process while being supplied continuously to a heat treatment device. The heat treatment device had a length of 60 cm in the MD direction, and had a length of 30 cm in a TD direction. Temperatures in the middle of the polymeric film in the width direction were adjusted so that an inlet of the heat treatment device had a temperature of 500° C., a part located 50 cm away from the inlet was 580° C., which was a maximum temperature, and an outlet thereof located 10 cm away from the part having the maximum temperature had a temperature of 500° C.

A linear temperature gradient was provided to the middle of the polymeric film in the width direction so that the temperatures in the middle thereof had temperature distribution of the polymeric film of FIG. 30 in a longitudinal direction. The line speed was adjusted so that, in a case where an actual temperature of the polymeric film fell within a range of 500° C. to 580° C., a temperature increase rate was 80° C./min (line speed corresponds to 50 cm/min).

For a first half (25 m) of the entire length of 50 m, the linear temperature gradient was provided also in the width direction so that temperatures at both edges of the polymeric film in the width direction were 0.4° C. higher than that in the middle (location 10 cm away from the middle) as shown in the temperature distribution in the width direction of the polymeric film of FIG. 30. Note that the temperature gradient of the polymeric film in the width direction was measured at four points at which temperatures in the middle of the polymeric film in the width direction were 500° C., 530° C., 560° C., and 580° C. It was confirmed that, in all the four points thus measured, the temperatures at the both edges were 0.4° C. higher than that in the middle.

For a second half (25 m) of the entire length of 50 m, the linear temperature gradient was provided also in the width direction so that a temperature in the middle of the polymeric film was 0.7° C. higher than those at the both edges. Note that the temperature gradient in the width direction was measured at four points at which the middle of the polymeric film in the width direction had temperatures of 500° C., 530° C., 560° C., and 580° C. At the all four points thus measured, it was confirmed that the temperature in the middle was 0.7° C. higher than those at the both edges.

The film was transferred while a tensile force of 30 kgf/cm$^2$ was being applied to the film. In the heat treatment device, the film was vertically sandwiched between jigs made of graphite as shown in FIG. 30, and was transferred so as to be slid between the jigs. A pressure applied to the film in a thickness direction thereof was adjusted to 2 g/cm$^2$.

Figure 31:
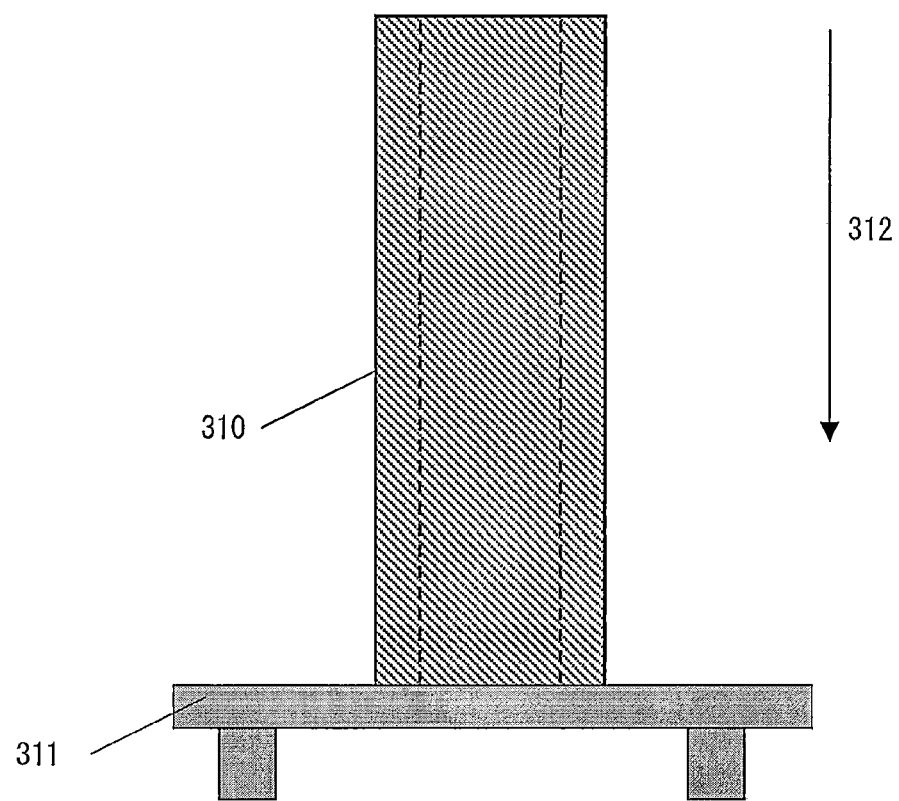
FIG. 31 is a view illustrating how to set a film during the carbonization process and the graphitization process of Examples and Comparative Examples.

Next, the film which has been subjected to the sag control process was cooled down to a room temperature (23° C.), and was wound in a roll-shape so as to have an inner diameter of 100 mm. Then, the film was set in a carbonization furnace so that the width direction of the film was vertical as shown in FIG. 31, and was subjected to a heat treatment at a temperature increase rate of 2° C./min until a temperature in the carbonization furnace was changed from the room temperature to 1400° C. without particularly controlling temperatures at the both edges of the film in the width direction and the temperature in the middle of the film in the width direction. Thus the film was carbonized.

Next, the carbonization film thus carbonized was cooled down to a room temperature (23° C.), and then was set in a graphitization furnace in the same way as in the carbonization process, and was subjected to a heat treatment at a temperature increase rate of 0.5° C./min until a temperature in the graphitization furnace was changed from the room temperature to 2900° C. without particularly controlling temperatures at the both edges of the film in the width direction and a temperature in the middle of the film in the width direction. Thus the film was graphitized. Various physical properties were measured. The results are shown in Table 8.

Example 10

A graphite film was made in the same way as Example 9 except that, as temperature setting in a second half, linear temperature gradient was provided to a polymeric film in width direction so that a temperature in middle of the polymeric film was 2.0° C. higher than those at both edges thereof. Various evaluations were carried out, and the results are shown in Table 8.

Example 11

A graphite film was made in the same way as Example 9 except that, as temperature setting in a first half, linear temperature gradient was provided to a polymeric film in width direction so that temperatures at both edges of the polymeric film were 0.5° C. higher than that in middle thereof, and, as temperature setting in a second half, linear temperature gradient was provided to the polymeric film in the width direction so that a temperature in middle of the polymeric film was 10.0° C. higher than those at both edges thereof. Various evaluations were carried out, and the results are shown in Table 8.

Example 12

A graphite film was made in the same way as Example 9 except that, as temperature setting in a first half, linear temperature gradient was provided to a polymeric film in width direction so that temperatures at both edges of the polymeric film were 0.6° C. higher than that in middle thereof, and, as temperature setting in a second half, linear temperature gradient was provided to the polymeric film in width direction so that a temperature in middle of the polymeric film was 15.0° C. higher than those at both edges thereof. Various evaluations were carried out, and the results are shown in Table 8.

Example 13

A graphite film was made in the same way as Example 9 except that, as temperature setting in a first half, linear temperature gradient was provided to a polymeric film in width direction so that temperatures at both edges of the polymeric film were 0.7° C. higher than that in middle thereof, and, as temperature setting in a second half, linear temperature gradient was provided to the polymeric film in the width direction so that (i) a temperature B in the middle of the polymeric film in the width direction was 0.25° C. higher than a temperature C at one edge thereof and (ii) a temperature A at the other edge of the polymeric film in the width direction was 0.25° C. higher than the temperature B in the middle thereof. Various evaluations were carried out, and the results are shown in Table 8.

Example 14

A graphite film was made in the same way as Example 9 except that, as temperature setting in a first half, linear temperature gradient was provided to a polymeric film in width direction so that temperatures at both edges of the polymeric film were 2.0° C. higher than that in middle thereof, and, as temperature setting in a second half, linear temperature gradient was provided to the polymeric film in the width direction so that (i) a temperature B in the middle of the polymeric film in the width direction was 0.5° C. higher than a temperature C at one edge thereof and (ii) a temperature A at the other edge of the polymeric film in the width direction was 0.5° C. higher than the temperature B in the middle thereof. Various evaluations were carried out, and the results are shown in Table 8.

Example 15

A graphite film was made in the same way as Example 9 except that, as temperature setting in a first half, linear temperature gradient was provided to a polymeric film in width direction so that temperatures at both edges of the polymeric film were 10.0° C. higher than that in middle thereof, and, as temperature setting in a second half, linear temperature gradient was provided to the polymeric film in the width direction so that (i) a temperature B in the middle of the polymeric film in the width direction was 15.0° C. higher than a temperature C at one edge thereof and (ii) a temperature A at the other edge of the polymeric film in the width direction was 15.0° C. higher than the temperature B in the middle thereof. Various evaluations were carried out, and the results are shown in Table 8.

Example 16

A graphite film was made in the same way as Example 9 except that, as temperature setting in a first half, linear temperature gradient was provided to a polymeric film in width direction so that temperatures at both edges of the polymeric film were 15.0° C. higher than that in middle thereof, and, as temperature setting in a second half, linear temperature gradient was provided to the polymeric film in the width direction so that (i) a temperature B in the middle of the polymeric film in the width direction was 20.0° C. higher than a temperature C at one edge thereof and (ii) a temperature A at the other edge of the polymeric film in the width direction was 20.0° C. higher than the temperature B in the middle thereof. Various evaluations were carried out, and the results are shown in Table 8.

TABLE 4

| | Material film | | | |
|---|---|---|---|---|
| | Type | Double refraction | Thickness μm | Width mm | Length m |
| Example 9 | NPI | 0.14 | 75 | 200 | 50 |
| Example 10 | NPI | 0.14 | 75 | 200 | 50 |
| Example 11 | NPI | 0.14 | 75 | 200 | 50 |
| Example 12 | NPI | 0.14 | 75 | 200 | 50 |
| Example 13 | NPI | 0.14 | 75 | 200 | 50 |
| Example 14 | NPI | 0.14 | 75 | 200 | 50 |
| Example 15 | NPI | 0.14 | 75 | 200 | 50 |
| Example 16 | NPI | 0.14 | 75 | 200 | 50 |

TABLE 5

| | | Thermal decomposition initiation temperature | | | Sag-control temperature | | | Temperature gradient from both edges to middle | | Max. temp. in heat treatment | The number of measured points which satisfied requirement | Tensile force kgf/cm² | Load g/cm² | Temperature increase rate °C./min | Length subjected to process m |
|---|---|---|---|---|---|---|---|---|---|---|---|---|---|---|---|
| | Method | Edge 1 °C. | Middle °C. | Edge 2 °C. | Edge 1 °C. | Middle °C. | Edge 2 °C. | Max. value °C./m | Min. value °C./m | | | | | | |
| Ex. 9 | Lon. | 500.4 | 500.0 | 500.4 | 580.4 | 580.0 | 580.4 | 2 | 2 | 580 | 4 | 30 | 2 | 80 | 25 |
| Ex. 10 | Lon. | 500.4 | 500.0 | 500.4 | 580.4 | 580.0 | 580.4 | 2 | 2 | 580 | 4 | 30 | 2 | 80 | 25 |
| Ex. 11 | Lon. | 500.5 | 500.0 | 500.5 | 580.5 | 580.0 | 580.5 | 2.5 | 2.5 | 580 | 4 | 30 | 2 | 80 | 25 |
| Ex. 12 | Lon. | 500.6 | 500.0 | 500.6 | 580.6 | 580.0 | 580.6 | 3 | 3 | 580 | 4 | 30 | 2 | 80 | 25 |
| Ex. 13 | Lon. | 500.7 | 500.0 | 500.7 | 580.7 | 580.0 | 580.7 | 3.5 | 3.5 | 580 | 4 | 30 | 2 | 80 | 25 |
| Ex. 14 | Lon. | 502.0 | 500.0 | 502.0 | 582.0 | 580.0 | 582.0 | 10 | 10 | 580 | 4 | 30 | 2 | 80 | 25 |
| Ex. 15 | Lon. | 510.0 | 500.0 | 510.0 | 590.0 | 580.0 | 590.0 | 50 | 50 | 580 | 4 | 30 | 2 | 80 | 25 |
| Ex. 16 | Lon. | 515.0 | 500.0 | 515.0 | 595.0 | 580.0 | 595.0 | 75 | 75 | 580 | 4 | 30 | 2 | 80 | 25 |

* Abbreviations
* Ex. stands for "Example"
* Lon. stands for "long continuous method"
* Temp. stands for "temperature"

TABLE 6

| | Sag control process Temperature setting 2 (Second half) | | | | | | | | | | | | | |
|---|---|---|---|---|---|---|---|---|---|---|---|---|---|---|
| | | Thermal decomposition initiation temperature | | | Sag-control temperature | | | Temperature gradient from both edges to middle | | Max. temp. in heat treatment | The number of measured points which satisfied requirement | Tensile force kgf/cm² | Load g/cm² | Temperature increase rate °C./min | Length subjected to process m |
| | Method | Edge 1 °C. | Middle °C. | Edge 2 °C. | Edge 1 °C. | Middle °C. | Edge 2 °C. | Max. value °C./m | Min. value °C./m | | | | | | |
| Ex. 9 | Lon. | 500.0 | 500.7 | 500.0 | 580.0 | 580.7 | 580.0 | −3.5 | −3.5 | 580 | 4 | 30 | 2 | 80 | 25 |
| Ex. 10 | Lon. | 500.0 | 502.0 | 500.0 | 580.0 | 582.0 | 580.0 | −10 | −10 | 580 | 4 | 30 | 2 | 80 | 25 |
| Ex. 11 | Lon. | 500.0 | 510.0 | 500.0 | 580.0 | 590.0 | 580.0 | −50 | −50 | 580 | 4 | 30 | 2 | 80 | 25 |
| Ex. 12 | Lon. | 500.0 | 515.0 | 500.0 | 580.0 | 595.0 | 580.0 | −75 | −75 | 580 | 4 | 30 | 2 | 80 | 25 |

| | Sag control process Temperature setting 2 | | | | | | | | | | | | | |
|---|---|---|---|---|---|---|---|---|---|---|---|---|---|---|
| | | Thermal decomposition initiation temperature | | | Sag-control temperature | | | Temperature gradient from both edges to middle | | Max. temp. in heat treatment | The number of measured points which satisfied requirement | Tensile force kgf/cm² | Load g/cm² | Temperature increase rate °C./min | Length subjected to process m |
| | Method | Edge 1 °C. | Middle °C. | Edge 2 °C. | Edge 1 °C. | Middle °C. | Edge 2 °C. | Max. value °C./m | Min. value °C./m | | | | | | |
| Ex. 13 | Lon. | 500.25 | 500 | 499.75 | 580.25 | 580 | 579.75 | −2.5 | −2.5 | 580 | 4 | 30 | 2 | 80 | 25 |
| Ex. 14 | Lon. | 500.5 | 500 | 499.5 | 580.5 | 580 | 579.5 | −5 | −5 | 580 | 4 | 30 | 2 | 80 | 25 |
| Ex. 15 | Lon. | 515 | 500 | 485 | 595 | 580 | 565 | −150 | −150 | 580 | 4 | 30 | 2 | 80 | 25 |
| Ex. 16 | Lon. | 520 | 500 | 480 | 600 | 580 | 560 | −200 | −200 | 580 | 4 | 30 | 2 | 80 | 25 |

* Abbreviations
* Ex. stands for "Example"
* Lon. stands for "long continuous method"
* Temp. stands for "temperature"

TABLE 7

| | Properties of film subjected to sag control process | | | | Carbonization process | | | | Graphitization process | | |
|---|---|---|---|---|---|---|---|---|---|---|---|
| | Crack (Paper winding test) | Weight keeping rate % | Weight decrease rate % | Entire transmittance % | Setting method | Temperature Max. temp. °C. | difference in width direction of film °C. | Temperature increase rate °C./min | Setting method | Max. temp. °C. | Temperature increase rate °C./min |
| Ex. 9 | A | 97.2 | 2.8 | 0.20 | Wound cylindrically | 1400 | 0 | 2 | Wound cylindrically | 2900 | 0.5 |
| Ex. 10 | A | 97.2 | 2.8 | 0.20 | Wound cylindrically | 1400 | 0 | 2 | Wound cylindrically | 2900 | 0.5 |
| Ex. 11 | A | 97.2 | 2.8 | 0.20 | Wound cylindrically | 1400 | 0 | 2 | Wound cylindrically | 2900 | 0.5 |
| Ex. 12 | A | 97.2 | 2.8 | 0.20 | Wound cylindrically | 1400 | 0 | 2 | Wound cylindrically | 2900 | 0.5 |
| Ex. 13 | A | 97.2 | 2.8 | 0.20 | Wound cylindrically | 1400 | 0 | 2 | Wound cylindrically | 2900 | 0.5 |
| Ex. 14 | A | 97.2 | 2.8 | 0.20 | Wound cylindrically | 1400 | 0 | 2 | Wound cylindrically | 2900 | 0.5 |
| Ex. 15 | A | 97.2 | 2.8 | 0.20 | Wound cylindrically | 1400 | 0 | 2 | Wound cylindrically | 2900 | 0.5 |
| Ex. 16 | A | 97.2 | 2.8 | 0.20 | Wound cylindrically | 1400 | 0 | 2 | Wound cylindrically | 2900 | 0.5 |

* Abbreviations
* Ex. stands for "Example"
* Temp. stands for "temperature"

TABLE 8

Properties of graphite film

| | Temperature setting 1 side (First half) | | | | | | | Temperature setting 2 side (Second half) | | | | | | | | |
|---|---|---|---|---|---|---|---|---|---|---|---|---|---|---|---|---|
| | Sag Zgs mm | Value "a" mm | Value "b" mm | Bend mm | Length m | Form evaluation | Various evaluations | Sag Zgs mm | Value "a" mm | Value "b" mm | Bend mm | Length m | Form evaluation | Various evaluations | MIT Times | Thermal diffusivity cm²/s |
| Ex. 9 | 3.5 | 3.5 | 0 | <2 | 22.5 | Flat | Copper foil A | 5 | 0 | 5 | <2 | 22.5 | Middle sag | Rolling C | >10000 | 8.5 |
| Ex. 10 | 3.5 | 3.5 | 0 | <2 | 22.5 | Flat | Copper foil A | 20 | 0 | 20 | <2 | 22.5 | Middle sag | Rolling B | >10000 | 8.5 |
| Ex. 11 | 4 | 4 | 0 | <2 | 22.5 | Flat | Copper foil B | 70 | 0 | 70 | <2 | 22.5 | Middle sag | Rolling B | >10000 | 8.5 |
| Ex. 12 | 4.9 | 4.9 | 0 | <2 | 22.5 | Flat | Copper foil C | 80 | 0 | 80 | <2 | 22.5 | Middle sag | Rolling C | >10000 | 8.5 |
| Ex. 13 | 5 | 5 | 0 | <2 | 22.5 | Both-edge-sag | Rewinding C | 5 | 2.5 | 2.5 | 11 | 22.5 | One-edge sag | Curved surface D | >10000 | 8.5 |
| Ex. 14 | 20 | 20 | 0 | <2 | 22.5 | Both-edge-sag | Rewinding B | 20 | 10 | 10 | 15 | 22.5 | One-edge sag | Curved surface C | >10000 | 8.5 |
| Ex. 15 | 70 | 70 | 0 | <2 | 22.5 | Both-edge-sag | Rewinding A | 70 | 35 | 35 | 70 | 22.5 | One-edge sag | Curved surface A | >10000 | 8.5 |
| Ex. 16 | 80 | 80 | 0 | <2 | 22.5 | Both-edge-sag | Rewinding B | 80 | 40 | 40 | 80 | 22.5 | One-edge sag | Curved surface A | >10000 | 8.5 |

REFERENCE SIGNS LIST

21 Roll 1
22 Roll 2
23 Graphite film
24 Suspended line
25 Sag
31 Width direction of film
32 Longitudinal direction of film
51 Middle
52 Edge
53 Temperature measurement point at edge 1
54 Temperature measurement point in middle
55 Temperature measurement point at edge 2
56 Any width direction
61 Heat treatment device
62 Graphitic weight
63 Polymeric film
64 Graphitic hearth
65 Temperature measurement point
71 Weight
72 Material graphite film
73 Base
81 Room temperature
82 Under heat treatment
83 Material graphite film
84 Inner core
91 Expansible inner core
92 Material graphite film
93 After inner core is expanded
101 Inner core used to produce flat graphite film
102 Inner core used to produce graphite film having sag in middle
103 Inner core used to produce graphite film having sag at its both edges
104 Inner core used to produce graphite film having sag at its one edge
105 Edge 1-outer circumference
106 Middle-outer circumference
107 Edge 2-outer circumference
111 Inner core
112 Material graphite film
121 Base
122 Drive shaft
123 Inner core
124 Double-sided tape
125 Material graphite film
126 Cross section of rewound material graphite film
127 Radius of outermost circumference of roll of material graphite film
128 Center of drive shaft
129 Radius of inner core
1210 Thickness of roll of material graphite film
131 Inner core 1
132 Inner core 2
141 Sag at outmost edge
142 Sag at point 30 mm away from outmost edge
151 Sag in middle
161 Table
162 Graphite film
163 Position of Rule
171 Inner side of roll
172 Outer side of roll
181 Sheet having sticky layer or adhesive layer
182 Wind-off roll for sheet having sticky layer or adhesive layer
183 First roll
184 Second roll
185 Separator
186 Wind-up roll for separator
187 Bar serving as trigger with which separator starts peeling
188 Copper foil tape with separator
189 Width of graphite film
1810 Width of sheet having sticky layer or adhesive layer
1811 Graphite film
1812 Wind-off paper core
191 Graphite film
192 First roll
193 Angle formed by (i) point at which graphite film starts to contact with first roll, (ii) central point of first roll, and (iii) point of contact between first roll and second roll)

194 Point at which graphite film starts to contact with first roll
195 Central point of first roll
196 Point of contact between first roll and second roll
201 Graphite laminate film
202 Enlarged view
203 Lamination wrinkle
211 Angle b formed by (i) point at which material graphite film starts to contact with upper rolling-mill roll, (ii) central point of upper rolling-mill roll, and (iii) point of contact between upper rolling-mill roll and lower rolling-mill roll)
212 Point at which graphite film starts to contact with rolling-mill roll and
213 Central point of upper rolling-mill roll
214 Point of contact between upper rolling-mill roll and lower rolling-mill roll
215 Upper rolling-mill roll
216 Lower rolling-mill roll
217 Graphite film
221 Rolled Graphite film
222 MD direction
223 Wrinkle
231 Graphite film
232 Wind-off paper core
233 Wind-up paper core
234 Distance between paper cores
241 Tear
251 Cylindrical inner core made of graphite
252 Outer cylinder
253 Polyimide film wound around cylindrical inner core
254 Opening for ventilation
261 Support
262 Carbonized film
271 M-shaped graphite film
272 W-shaped graphite film
281 Part of graphite film which part is not wound around inner core
291 Cylindrically wound material graphite film
300 Wind-off device
301 Wind-up device
310 Roll of carbonized film
311 Hearth
312 Direction of gravity

The invention claimed is:

1. A graphite film having a length of not less than 4 m in a longitudinal direction of the graphite film and having two or more different sag forms,
at least one of the two or more different sag forms being middle sag or one-edge sag, wherein
each of the sag forms is determined under a condition of JIS C2151.

2. The graphite film as set forth in claim 1, wherein regions of the two or more different sag forms are not less than 2.0 m in length in the longitudinal direction.

3. The graphite film as set forth in claim 1, wherein the two different sag forms are any one of combinations of (i) flat sag and middle sag, (ii) the flat sag and one-edge sag, (iii) the middle sag and the both-edge sag, (iv) the middle sag and the one-edge sag, and (v) the both-edge sag and the one-edge sag.

4. The graphite film as set forth in claim 1, wherein adjacent two of the two or more different sag forms are different from each other.

5. The graphite film as set forth in claim 3, wherein the flat sag is a sag form in which a degree of sag is not more than 4.9 mm by the film windability evaluation described in JIS C2151.

6. The graphite film as set forth in claim 1, wherein the middle sag is a sag form in which a sag value "b" of sag in a middle of the graphite film is not less than 5 mm and not more than 80 mm.

7. The graphite film as set forth in claim 3, wherein the both-edge sag is a sag form in which a sag value "a" of sag at both edges of the graphite film is not less than 5 mm and not more than 80 mm.

8. The graphite film as set forth in claim 1, wherein the one-edge sag is a sag form in which a degree of a bend of the graphite film is not less than 11 mm and not more than 80 mm.

9. A method for producing a graphite film, comprising the step of:
(I) re-forming a material graphite film by heat-treating the material graphite film to not less than 2000° C. while applying pressure to the material graphite film,
the graphite film having two or more different sag forms and having a length of not less than 4 m in a longitudinal direction of the graphite film, each of the sag forms being determined under a condition of JIS C2151,
at least one of the two or more different sag forms being middle sag or one-edge sag,
in the step (I), the material graphite film being heat-treated in a state where the material graphite film is wound around an inner core,
the inner core being an inner core (b) or an inner core (d),
the inner core (b) having a middle-outer circumference which is longer than its first edge-outer circumference and its second edge-outer circumference, a difference between the first edge-outer circumference, the second edge-outer circumference, and the middle-outer circumference being not less than 0.0027% and not more than 0.7000%;
the inner core (d) having a first edge-outer circumference, a middle-outer circumference, and a second edge-outer circumference which become longer in this order, a difference between the first edge-outer circumference, the second edge-outer circumference, and the middle-outer circumference being not less than 0.0027% and not more than 0.7000%,
the first edge-outer circumference of each of the inner core (b) and inner core (d) being an outer circumference at a first edge of the each of the inner core (b) and the inner core (d) which first edge corresponds to one of edges of the material graphite film wound around the each of the inner core (b) and the inner core (d),
the second edge-outer circumference of each of the inner core (b) and the inner core (d) being an outer circumference at a second edge of the each of the inner core (b) and the inner core (d) which second edge corresponds to the other of the edges of the material graphite film wound around the each of the inner core (b) and the inner core (d),
the middle-outer circumference of each of the inner core (b) and the inner core (d) being an outer circumference at a position equidistant from the first edge and the second edge of the each of the inner core (b) and the inner core (d).

10. A method for producing a graphite film as set forth in claim 9, further comprising the step of:
(II) obtaining the material graphite film by at least once cooling down a graphite film, obtained from a polymeric film by heat-treatment at not less than 2000° C., to less than 2000° C.,
after the step (II), the step (I) being carried out.

11. A method for producing a graphite film, comprising the step of:
- (a) re-forming a material graphite film by heat-treating the material graphite film to not less than 2000° C. while applying pressure on the material graphite film,
- during the step (a), the material graphite film being heat-treated in a state where the material graphite film is wound around at least two inner cores,
- the graphite film having two or more different sag forms and having a length of not less than 4 m in a longitudinal direction of the graphite film, each of the sag forms being determined under a condition of JIS C2151,
- at least one of the two or more different sag forms being middle sag or one-edge sag,
- the at least two inner cores being different from each other,
- at least one of the at least two inner cores being an inner core (b) or an inner core (d),
- the inner core (b) having a middle-outer circumference which is longer than its first edge-outer circumference and its second edge-outer circumference, a difference between the first edge-outer circumference, the second edge-outer circumference, and the middle-outer circumference being not less than 0.0027% and not more than 0.7000%,
- the inner core (d) having a first edge-outer circumference, a middle-outer circumference, and a second edge-outer circumference which become longer in this order, a difference between the first edge-outer circumference, the second edge-outer circumference, and the middle-outer circumference being not less than 0.0027% and not more than 0.7000%,
- the first edge-outer circumference of each of the inner core (b) and inner core (d) being an outer circumference at a first edge of the each of the inner core (b) and the inner core (d) which first edge corresponds to one of edges of the material graphite film wound around the each of the inner core (b) and the inner core (d),
- the second edge-outer circumference of each of the inner core (b) and the inner core (d) being an outer circumference at a second edge of the each of the inner core (b) and the inner core (d) which second edge corresponds to the other of the edges of the material graphite film wound around the each of the inner core (b) and the inner core (d),
- the middle-outer circumference of each of the inner core (b) and the inner core (d) being an outer circumference at a position equidistant from the first edge and the second edge of the each of the inner core (b) and the inner core (d).

12. A method for producing a graphite film, comprising carrying out at least two of the steps (A) through (D) with respect to a polymeric film and then heat-treating the polymeric film at not less than 2000° C.,
- the graphite film having two or more different sag forms and having a length of not less than 4 m in a longitudinal direction of the graphite film, at least one of the two or more different sag forms being middle sag or one-edge sag, each of the sag forms being determined under a condition of JIS C2151,
- the at least two of the steps (A) through (D) including at least the step (B) or (D),
- the steps (A) through (D) being:
- (A) controlling sag by heat-treating the polymeric film so that, in a temperature range from a thermal decomposition initiation temperature of the polymeric film to a sag control temperature of the polymeric film, temperatures at both edges in a width direction of the polymeric film are higher than a temperature in a middle in the width direction of the polymeric film and that a temperature gradient from the both edges to the middle in the width direction of the polymeric film is not less than 3.5° C./m and not more than 75.0° C./m;
- (B) controlling sag by heat-treating the polymeric film so that, in the temperature range from the thermal decomposition initiation temperature of the polymeric film to the sag control temperature of the polymeric film, the temperatures at the both edges in the width direction of the polymeric film are lower than the temperature in the middle in the width direction of the polymeric film and that the temperature gradient from the both edges to the middle in the width direction of the polymeric film is not less than −75° C./m and not more than −3.5° C./m;
- (C) controlling sag by heat-treating the polymeric film so that, in the temperature range from the thermal decomposition initiation temperature of the polymeric film to the sag control temperature of the polymeric film, the temperature gradient from the both edges to the middle in the width direction of the polymeric film is not less than −3.4° C./m and not more than 3.4° C./m; and
- (D) controlling sag by heat-treating the polymeric film so that, in the temperature range from the thermal decomposition initiation temperature of the polymeric film to the sag control temperature of the polymeric film, a temperature A≥a temperature B≥a temperature C and the temperature A≠the temperature C and that a temperature gradient from the temperature A to the temperature C is not less than 2.5° C./m and not more than 200° C./m, where the temperature A is a temperature at one of the edges in the width direction of the polymeric film, the temperature B is a temperature in the middle in the width direction of the polymeric film, and the temperature C is a temperature at the other of the edges in the width direction of the polymeric film.

13. The graphite film as set forth in claim 1, wherein
- the graphite film has a first longitudinal portion and a second longitudinal portion,
- the first longitudinal portion has not less than 2.0 m in length in the longitudinal direction and a sag form,
- the second longitudinal portion has not less than 2.0 m in length in the longitudinal direction and a sag form different from the sag form of the first longitudinal portion, and
- combinations of the sag forms of the first and second longitudinal portions are selected from the group consisting of (i) flat sag and middle sag, (ii) the flat sag and one-edge sag, (iii) the middle sag and the both-edge sag, (iv) the middle sag and the one-edge sag, and (v) the both-edge sag and the one-edge sag.

* * * * *